(12) United States Patent
Feng et al.

(10) Patent No.: US 11,848,064 B2
(45) Date of Patent: Dec. 19, 2023

(54) SHIFT REGISTER AND METHOD FOR DRIVING THE SAME, GATE DRIVING CIRCUIT, AND DISPLAY DEVICE

(71) Applicants: Hefei BOE Joint Technology Co., Ltd., Anhui (CN); BOE TECHNOLOGY GROUP CO., LTD., Beijing (CN)

(72) Inventors: Xuehuan Feng, Beijing (CN); Yongqian Li, Beijing (CN)

(73) Assignees: Hefei BOE Joint Technology Co., Ltd., Anhui (CN); BOE TECHNOLOGY GROUP CO., LTD., Beijing (CN)

( * ) Notice: Subject to any disclaimer, the term of this patent is extended or adjusted under 35 U.S.C. 154(b) by 0 days.

(21) Appl. No.: 17/791,748

(22) PCT Filed: Dec. 26, 2020

(86) PCT No.: PCT/CN2020/139717
§ 371 (c)(1),
(2) Date: Jul. 8, 2022

(87) PCT Pub. No.: WO2022/134114
PCT Pub. Date: Jun. 30, 2022

(65) Prior Publication Data
US 2023/0148117 A1    May 11, 2023

(51) Int. Cl.
*G09G 3/3266* (2016.01)
*G11C 19/28* (2006.01)
*G09G 3/20* (2006.01)

(52) U.S. Cl.
CPC .............. *G11C 19/28* (2013.01); *G09G 3/20* (2013.01); *G09G 3/3266* (2013.01); *G09G 2310/0267* (2013.01); *G09G 2310/0286* (2013.01)

(58) Field of Classification Search
CPC ........ G11C 19/28; G09G 3/20; G09G 3/3266; G09G 2310/0286; G09G 2300/0426; G09G 2310/0267; G09G 2330/08
See application file for complete search history.

(56) References Cited

U.S. PATENT DOCUMENTS

2016/0171949 A1    6/2016    Dai
2016/0266699 A1*   9/2016    Zhao ................... G09G 3/3677
(Continued)

FOREIGN PATENT DOCUMENTS

| CN | 109859670 A | 6/2019 |
| CN | 111968571 A | 11/2020 |
| KR | 20180072041 A | 6/2018 |

OTHER PUBLICATIONS

PCT International Search Report (w/ English translation) and Written Opinion for corresponding PCT Application No. PCT/CN2020/139717, dated Sep. 29, 2021, 14 pages.

*Primary Examiner* — Mihir K Rayan
(74) *Attorney, Agent, or Firm* — Dority & Manning, P.A.

(57) ABSTRACT

A shift register includes a first scan unit, a leakage prevention unit, and a leakage prevention input unit. The first scan unit includes a first input circuit configured to transmit an input signal to a first pull-up node. The leakage prevention input unit is configured to: in response to a first voltage signal received at a first voltage signal terminal, transmit the first voltage signal to a leakage prevention input node; and in response to a second voltage signal received at a second voltage signal terminal, transmit the second voltage signal to the leakage prevention input node. The first voltage signal and the second voltage signal are mutually inverted signals. The leakage prevention unit is configured to transmit one of the first voltage signal and the second voltage signal from the leakage prevention input node to a first leakage prevention node.

20 Claims, 15 Drawing Sheets

(56) References Cited

U.S. PATENT DOCUMENTS

| | | |
|---|---|---|
| 2016/0284734 A1 | 9/2016 | Lee et al. |
| 2018/0308409 A1 | 10/2018 | Park et al. |
| 2019/0057637 A1* | 2/2019 | Fan .................. G09G 3/20 |
| 2019/0139494 A1 | 5/2019 | Zeng et al. |
| 2019/0244578 A1* | 8/2019 | Wu .................. G06F 3/0416 |
| 2020/0027382 A1 | 1/2020 | Wang et al. |
| 2020/0051507 A1 | 2/2020 | Feng et al. |
| 2020/0066211 A1 | 2/2020 | Lee et al. |
| 2020/0168162 A1 | 5/2020 | Feng et al. |
| 2020/0356203 A1* | 11/2020 | Wang .................. G09G 3/3266 |
| 2021/0082328 A1 | 3/2021 | Feng et al. |
| 2021/0142713 A1 | 5/2021 | Feng et al. |
| 2021/0201774 A1 | 7/2021 | Feng et al. |
| 2021/0201805 A1 | 7/2021 | Feng et al. |
| 2021/0335203 A1 | 10/2021 | Feng et al. |

* cited by examiner

SHIFT REGISTER AND METHOD FOR DRIVING THE SAME, GATE DRIVING CIRCUIT, AND DISPLAY DEVICE

CROSS-REFERENCE TO RELATED APPLICATION

This application is a national phase entry under 35 USC 371 of International Patent Application No. PCT/CN 2020/139717 filed on Dec. 26, 2020, which is incorporated herein by reference in its entirety.

TECHNICAL FIELD

The present disclosure relates to the field of display technologies, and in particular, to a shift register and a method for driving the same, a gate driving circuit, and a display device.

BACKGROUND

A gate driving circuit (also referred to as a scan driving circuit) is an important component of a display device. The gate driving circuit may include a plurality of stages of shift registers that are cascaded, and each stage of shift register is electrically connected to a gate line in the display device. The gate driving circuit may input scan signals (also referred to as gate signals) to a plurality of gate lines in the display device row by row, so as to drive sub-pixels in each row in the display device to display image(s), so that the display device is able to display image(s).

The gate driving circuit is provided in the display device, which is able to effectively reduce a cost and improve a yield.

SUMMARY

In an aspect, a shift register is provided. The shift register includes a first scan unit, a leakage prevention unit, and a leakage prevention input unit. The first scan unit includes a first input circuit electrically connected to an input signal terminal, a first pull-up node, and a first leakage prevention node. The first input circuit is configured to, in response to an input signal received at the input signal terminal, transmit the input signal to the first pull-up node. The leakage prevention input unit is electrically connected to a first voltage signal terminal, a second voltage signal terminal, and a leakage prevention input node. The leakage prevention input unit is configured to: in response to a first voltage signal received at the first voltage signal terminal, transmit the first voltage signal to the leakage prevention input node; and, in response to a second voltage signal received at the second voltage signal terminal, transmit the second voltage signal to the leakage prevention input node. The first voltage signal and the second voltage signal are mutually inverted signals. The leakage prevention unit is electrically connected to the first pull-up node, the first leakage prevention node, and the leakage prevention input node. The leakage prevention unit is configured to transmit one of the first voltage signal and the second voltage signal from the leakage prevention input node to the first leakage prevention node under a control of a voltage of the first pull-up node.

In some embodiments, the leakage prevention input unit includes a first leakage prevention input circuit and a second leakage prevention input circuit. The first leakage prevention input circuit is electrically connected to the first voltage signal terminal and the leakage prevention input node. The first leakage prevention input circuit is configured to, in response to the first voltage signal received at the first voltage signal terminal, transmit the first voltage signal to the leakage prevention input node. The second leakage prevention input circuit is electrically connected to the second voltage signal terminal and the leakage prevention input node. The second leakage prevention input circuit is configured to, in response to the second voltage signal received at the second voltage signal terminal, transmit the second voltage signal to the leakage prevention input node.

In some embodiments, the first leakage prevention input circuit includes a first transistor. A control electrode of the first transistor is electrically connected to the first voltage signal terminal, a first electrode of the first transistor is electrically connected to the first voltage signal terminal, and a second electrode of the first transistor is electrically connected to the leakage prevention input node. The second leakage prevention input circuit includes a second transistor. A control electrode of the second transistor is electrically connected to the second voltage signal terminal, a first electrode of the second transistor is electrically connected to the second voltage signal terminal, and a second electrode of the second transistor is electrically connected to the leakage prevention input node.

In some embodiments, the leakage prevention unit includes a first leakage prevention circuit. The first leakage prevention circuit is electrically connected to the first pull-up node, the leakage prevention input node, and the first leakage prevention node. The first leakage prevention circuit is configured to transmit one of the first voltage signal and the second voltage signal from the leakage prevention input node to the first leakage prevention node under the control of the voltage of the first pull-up node.

In some embodiments, the first leakage prevention circuit includes a third transistor. A control electrode of the third transistor is electrically connected to the first pull-up node, a first electrode of the third transistor is electrically connected to the leakage prevention input node, and a second electrode of the third transistor is electrically connected to the first leakage prevention node.

In some embodiments, the shift register further includes a second scan unit. The second scan unit includes a second input circuit electrically connected to the input signal terminal, a second pull-up node, and a second leakage prevention node. The second input circuit is configured to, in response to the input signal received at the input signal terminal, transmit the input signal to the second pull-up node. The leakage prevention unit is further electrically connected to the second pull-up node and the second leakage prevention node. The leakage prevention unit is further configured to transmit one of the first voltage signal and the second voltage signal from the leakage prevention input node to the second leakage prevention node under a control of a voltage of the second pull-up node.

In some embodiments, the leakage prevention unit further includes a second leakage prevention circuit. The second leakage prevention circuit is electrically connected to the second pull-up node, the leakage prevention input node, and the second leakage prevention node. The second leakage prevention circuit is configured to transmit one of the first voltage signal and the second voltage signal from the leakage prevention input node to the second leakage prevention node under the control of the voltage of the second pull-up node.

In some embodiments, the second leakage prevention circuit includes a fourth transistor. A control electrode of the fourth transistor is electrically connected to the second pull-up node, a first electrode of the fourth transistor is electrically connected to the leakage prevention input node, and a second electrode of the fourth transistor is electrically connected to the second leakage prevention node.

In some embodiments, the first scan unit further includes a first output circuit electrically connected to the first pull-up node, a first clock signal terminal, a second clock signal terminal, a shift signal terminal, and a first scan signal terminal. The first output circuit is configured to: transmit a first clock signal received at the first clock signal terminal to the shift signal terminal under the control of the voltage of the first pull-up node; and transmit a second clock signal received at the second clock signal terminal to the first scan signal terminal under the control of the voltage of the first pull-up node. In a case where the shift register further includes the second scan unit, the second scan unit further includes a second output circuit electrically connected to the second pull-up node, a third clock signal terminal, and a second scan signal terminal. The second output circuit is configured to transmit a third clock signal received at the third clock signal terminal to the second scan signal terminal under the control of the voltage of the second pull-up node.

In some embodiments, the first input circuit includes a fifth transistor and a sixth transistor. A control electrode of the fifth transistor is electrically connected to the input signal terminal, a first electrode of the fifth transistor is electrically connected to the input signal terminal, and a second electrode of the fifth transistor is electrically connected to a first electrode of the sixth transistor and the first leakage prevention node. A control electrode of the sixth transistor is electrically connected to the input signal terminal, and a second electrode of the sixth transistor is electrically connected to the first pull-up node. The first output circuit includes a seventh transistor, an eighth transistor, and a first capacitor. A control electrode of the seventh transistor is electrically connected to the first pull-up node, a first electrode of the seventh transistor is electrically connected to the first clock signal terminal, and a second electrode of the seventh transistor is electrically connected to the shift signal terminal. A control electrode of the eighth transistor is electrically connected to the first pull-up node, a first electrode of the eighth transistor is electrically connected to the second clock signal terminal, and a second electrode of the eighth transistor is electrically connected to the first scan signal terminal. A first terminal of the first capacitor is electrically connected to the first pull-up node, and a second terminal of the first capacitor is electrically connected to the first scan signal terminal. The second input circuit includes a ninth transistor and a tenth transistor. A control electrode of the ninth transistor is electrically connected to the input signal terminal, a first electrode of the ninth transistor is electrically connected to the input signal terminal, and a second electrode of the ninth transistor is electrically connected to a first electrode of the tenth transistor and the second leakage prevention node. A control electrode of the tenth transistor is electrically connected to the input signal terminal, and a second electrode of the tenth transistor is electrically connected to the second pull-up node. The second output circuit includes an eleventh transistor and a second capacitor. A control electrode of the eleventh transistor is electrically connected to the second pull-up node, a first electrode of the eleventh transistor is electrically connected to the third clock signal terminal, and a second electrode of the eleventh transistor is electrically connected to the second scan signal terminal. A first terminal of the second capacitor is electrically connected to the second pull-up node, and a second terminal of the second capacitor is electrically connected to the second scan signal terminal.

In some embodiments, the first output circuit is further electrically connected to a fifth clock signal terminal and a first sensing signal terminal. The first output circuit is further configured to transmit a fifth clock signal received at the fifth clock signal terminal to the first sensing signal terminal under the control of the voltage of the first pull-up node. The second output circuit is further electrically connected to a sixth clock signal terminal and a second sensing signal terminal. The second output circuit is further configured to transmit a sixth clock signal received at the sixth clock signal terminal to the second sensing signal terminal under the control of the voltage of the second pull-up node.

In some embodiments, the first output circuit further includes a fifty-second transistor and a fourth capacitor. A control electrode of the fifty-second transistor is electrically connected to the first pull-up node, a first electrode of the fifty-second transistor is electrically connected to the fifth clock signal terminal, and a second electrode of the fifty-second transistor is electrically connected to the first sensing signal terminal. A first terminal of the fourth capacitor is electrically connected to the first pull-up node, and a second terminal of the fourth capacitor is electrically connected to the first sensing signal terminal. The second output circuit further includes a fifty-third transistor and a fifth capacitor. A control electrode of the fifty-third transistor is electrically connected to the second pull-up node, a first electrode of the fifty-third transistor is electrically connected to the sixth clock signal terminal, and a second electrode of the fifty-third transistor is electrically connected to the second sensing signal terminal. A first terminal of the fifth capacitor is electrically connected to the second pull-up node, and a second terminal of the fifth capacitor is electrically connected to the second sensing signal terminal.

In some embodiments, the first scan unit further includes a first control circuit electrically connected to the first pull-up node, the first voltage signal terminal, a first pull-down node, and a third voltage signal terminal. The first control circuit is configured to control a voltage of the first pull-down node under one of a control of the voltage of the first pull-up node and the first voltage signal transmitted by the first voltage signal terminal and a control of the voltage of the first pull-up node and a third voltage signal transmitted by the third voltage signal terminal. In a case where the shift register further includes the second scan unit, the second scan unit further includes a second control circuit electrically connected to the second pull-up node, the second voltage signal terminal, a second pull-down node, and the third voltage signal terminal. The second control circuit is configured to control a voltage of the second pull-down node under one of the control of the voltage of the second pull-up node and the second voltage signal transmitted by the second voltage signal terminal and a control of the voltage of the second pull-up node and the third voltage signal transmitted by the third voltage signal terminal.

In some embodiments, the first control circuit includes a twelfth transistor, a thirteenth transistor, a fourteenth transistor, and a fifteenth transistor. A control electrode of the twelfth transistor is electrically connected to the first voltage signal terminal, a first electrode of the twelfth transistor is electrically connected to the first voltage signal terminal, and a second electrode of the twelfth transistor is electrically connected to a control electrode of the thirteenth transistor and a first electrode of the fourteenth transistor. A first electrode of the thirteenth transistor is electrically connected to the first voltage signal terminal, and a second electrode of the thirteenth transistor is electrically connected to the first pull-down node and a first electrode of the fifteenth transistor. A control electrode of the fourteenth transistor is electrically connected to the first pull-up node, and a second electrode of the fourteenth transistor is electrically connected to the third voltage signal terminal. A control electrode of the fifteenth transistor is electrically connected to the first pull-up node, and a second electrode of the fifteenth transistor is electrically connected to the third voltage signal terminal. The second control circuit includes a sixteenth transistor, a seventeenth transistor, an eighteenth transistor, and a nineteenth transistor. A control electrode of the sixteenth transistor is electrically connected to the second voltage signal terminal, a first electrode of the sixteenth transistor is electrically connected to the second voltage signal terminal, and a second electrode of the sixteenth transistor is electrically connected to a control electrode of the seventeenth transistor and a first electrode of the eighteenth transistor. A first electrode of the seventeenth transistor is electrically connected to the second voltage signal terminal, and a second electrode of the seventeenth transistor is electrically connected to the second pull-down node and a first electrode of the nineteenth transistor. A control electrode of the eighteenth transistor is electrically connected to the second pull-up node, and a second electrode of the eighteenth transistor is electrically connected to the third voltage signal terminal. A control electrode of the nineteenth transistor is electrically connected to the second pull-up node, and a second electrode of the nineteenth transistor is electrically connected to the third voltage signal terminal.

In some embodiments, the first scan unit further includes a first reset circuit electrically connected to the first pull-down node, the first pull-up node, the third voltage signal terminal, and the first leakage prevention node. The first reset circuit is configured to, under a control of the voltage of the first pull-down node, transmit the third voltage signal transmitted by the third voltage signal terminal to the first pull-up node to reset the first pull-up node. In a case where the shift register further includes the second scan unit, the first reset circuit is further electrically connected to the second pull-down node. The first reset circuit is further configured to, under a control of the voltage of the second pull-down node, transmit the third voltage signal transmitted by the third voltage signal terminal to the first pull-up node to reset the first pull-up node. The second scan unit further includes a second reset circuit electrically connected to the first pull-down node, the second pull-down node, the second pull-up node, the third voltage signal terminal, and the second leakage prevention node. The second reset circuit is configured to, under the control of the voltage of the first pull-down node or the voltage of the second pull-down node, transmit the third voltage signal transmitted by the third voltage signal terminal to the second pull-up node to reset the second pull-up node.

In some embodiments, the first reset circuit includes a twentieth transistor and a twenty-first transistor. A control electrode of the twentieth transistor is electrically connected to the first pull-down node, a first electrode of the twentieth transistor is electrically connected to the first pull-up node, and a second electrode of the twentieth transistor is electrically connected to a first electrode of the twenty-first transistor and the first leakage prevention node. A control electrode of the twenty-first transistor is electrically connected to the first pull-down node, and a second electrode of the twenty-first transistor is electrically connected to the third voltage signal terminal. In the case where the shift register further includes the second scan unit, the first reset circuit further includes a twenty-second transistor and a twenty-third transistor. A control electrode of the twenty-second transistor is electrically connected to the second pull-down node, a first electrode of the twenty-second transistor is electrically connected to the first pull-up node, and a second electrode of the twenty-second transistor is electrically connected to a first electrode of the twenty-third transistor and the first leakage prevention node. A control electrode of the twenty-third transistor is electrically connected to the second pull-down node, and a second electrode of the twenty-third transistor is electrically connected to the third voltage signal terminal. The second reset circuit includes a twenty-fourth transistor, a twenty-fifth transistor, a twenty-sixth transistor, and a twenty-seventh transistor. A control electrode of the twenty-fourth transistor is electrically connected to the first pull-down node, a first electrode of the twenty-fourth transistor is electrically connected to the second pull-up node, and a second electrode of the twenty-fourth transistor is electrically connected to a first electrode of the twenty-sixth transistor and the second leakage prevention node. A control electrode of the twenty-fifth transistor is electrically connected to the second pull-down node, a first electrode of the twenty-fifth transistor is electrically connected to the second pull-up node, and a second electrode of the twenty-fifth transistor is electrically connected to a first electrode of the twenty-seventh transistor and the second leakage prevention node. A control electrode of the twenty-sixth transistor is electrically connected to the first pull-down node, and a second electrode of the twenty-sixth transistor is electrically connected to the third voltage signal terminal. A control electrode of the twenty-seventh transistor is electrically connected to the second pull-down node, and a second electrode of the twenty-seventh transistor is electrically connected to the third voltage signal terminal.

In some embodiments, the first scan unit further includes a third reset circuit electrically connected to a display reset signal terminal, the first pull-up node, the third voltage signal terminal, and the first leakage prevention node. The third reset circuit is configured to, under a control of a display reset signal transmitted by the display reset signal terminal, transmit the third voltage signal transmitted by the third voltage signal terminal to the first pull-up node to reset the first pull-up node. The second scan unit further includes a fourth reset circuit electrically connected to the display reset signal terminal, the second pull-up node, the third voltage signal terminal, and the second leakage prevention node. The fourth reset circuit is configured to, under the control of the display reset signal transmitted by the display reset signal terminal, transmit the third voltage signal transmitted by the third voltage signal terminal to the second pull-up node to reset the second pull-up node.

In some embodiments, the third reset circuit includes a twenty-eighth transistor and a twenty-ninth transistor. A control electrode of the twenty-eighth transistor is electrically connected to the display reset signal terminal, a first electrode of the twenty-eighth transistor is electrically connected to the first pull-up node, and a second electrode of the twenty-eighth transistor is electrically connected to a first electrode of the twenty-ninth transistor and the first leakage prevention node. A control electrode of the twenty-ninth transistor is electrically connected to the display reset signal terminal, and a second electrode of the twenty-ninth transistor is electrically connected to the third voltage signal terminal. The fourth reset circuit includes a thirtieth transistor and a thirty-first transistor. A control electrode of the thirtieth transistor is electrically connected to the display reset signal terminal, a first electrode of the thirtieth transistor is electrically connected to the second pull-up node, and a second electrode of the thirtieth transistor is electrically connected to a first electrode of the thirty-first transistor and the second leakage prevention node. A control electrode of the thirty-first transistor is electrically connected to the display reset signal terminal, and a second electrode of the thirty-first transistor is electrically connected to the third voltage signal terminal.

In some embodiments, the first scan unit further includes a fifth reset circuit electrically connected to a global reset signal terminal, the first pull-up node, the third voltage signal terminal, and the first leakage prevention node. The fifth reset circuit is configured to, under a control of a global reset signal transmitted by the global reset signal terminal, transmit the third voltage signal transmitted by the third voltage signal terminal to the first pull-up node to reset the first pull-up node. The second scan unit further includes a sixth reset circuit electrically connected to the global reset signal terminal, the second pull-up node, the third voltage signal terminal, and the second leakage prevention node. The sixth reset circuit is configured to, under the control of the global reset signal transmitted by the global reset signal terminal, transmit the third voltage signal transmitted by the third voltage signal terminal to the second pull-up node to reset the second pull-up node.

In some embodiments, the fifth reset circuit includes a thirty-second transistor and a thirty-third transistor. A control electrode of the thirty-second transistor is electrically connected to the global reset signal terminal, a first electrode of the thirty-second transistor is electrically connected to the first pull-up node, and a second electrode of the thirty-second transistor is electrically connected to a first electrode of the thirty-third transistor and the first leakage prevention node. A control electrode of the thirty-third transistor is electrically connected to the global reset signal terminal, and a second electrode of the thirty-third transistor is electrically connected to the third voltage signal terminal. The sixth reset circuit includes a thirty-fourth transistor and a thirty-fifth transistor. A control electrode of the thirty-fourth transistor is electrically connected to the global reset signal terminal, a first electrode of the thirty-fourth transistor is electrically connected to the second pull-up node, and a second electrode of the thirty-fourth transistor is electrically connected to a first electrode of the thirty-fifth transistor and the second leakage prevention node. A control electrode of the thirty-fifth transistor is electrically connected to the global reset signal terminal, and a second electrode of the thirty-fifth transistor is electrically connected to the third voltage signal terminal.

In some embodiments, the first scan unit further includes a seventh reset circuit and an eighth reset circuit. The seventh reset circuit is electrically connected to the first pull-down node, the shift signal terminal, the first scan signal terminal, the third voltage signal terminal, and a fourth voltage signal terminal. The seventh reset circuit is configured to, under a control of the voltage of the first pull-down node, transmit the third voltage signal transmitted by the third voltage signal terminal to the shift signal terminal to reset the shift signal terminal, and transmit a fourth voltage signal transmitted by the fourth voltage signal terminal to the first scan signal terminal to reset the first scan signal terminal. In the case where the shift register further includes the second scan unit, the seventh reset circuit is further electrically connected to the second pull-down node. The seventh reset circuit is further configured to, under a control of the voltage of the second pull-down node, transmit the third voltage signal transmitted by the third voltage signal terminal to the shift signal terminal to reset the shift signal terminal, and transmit the fourth voltage signal transmitted by the fourth voltage signal terminal to the first scan signal terminal to reset the first scan signal terminal. The eighth reset circuit is electrically connected to the input signal terminal, the first pull-down node, and the third voltage signal terminal. The eighth reset circuit is configured to, under a control of the input signal transmitted by the input signal terminal, transmit the third voltage signal transmitted by the third voltage signal terminal to the first pull-down node to reset the first pull-down node. The second scan unit further includes a ninth reset circuit and a tenth reset circuit. The ninth reset circuit is electrically connected to the first pull-down node, the second pull-down node, the second scan signal terminal, and the fourth voltage signal terminal. The ninth reset circuit is configured to, under the control of the voltage of the first pull-down node or the voltage of the second pull-down node, transmit the fourth voltage signal transmitted by the fourth voltage signal terminal to the second scan signal terminal to reset the second scan signal terminal. The tenth reset circuit is electrically connected to the input signal terminal, the second pull-down node, and the third voltage signal terminal. The tenth reset circuit is configured to, under the control of the input signal transmitted by the input signal terminal, transmit the third voltage signal transmitted by the third voltage signal terminal to the second pull-down node to reset the second pull-down node.

In some embodiments, the seventh reset circuit includes a thirty-sixth transistor and a thirty-ninth transistor. A control electrode of the thirty-sixth transistor is electrically connected to the first pull-down node, a first electrode of the thirty-sixth transistor is electrically connected to the shift signal terminal, and a second electrode of the thirty-sixth transistor is electrically connected to the third voltage signal terminal. A control electrode of the thirty-ninth transistor is electrically connected to the first pull-down node, a first electrode of the thirty-ninth transistor is electrically connected to the first scan signal terminal, and a second electrode of the thirty-ninth transistor is electrically connected to the fourth voltage signal terminal. In the case where the shift register further includes the second scan unit, the seventh reset circuit further includes a thirty-eighth transistor and a thirty-seventh transistor. A control electrode of the thirty-eighth transistor is electrically connected to the second pull-down node, a first electrode of the thirty-eighth transistor is electrically connected to the shift signal terminal, and a second electrode of the thirty-eighth transistor is electrically connected to the third voltage signal terminal. A control electrode of the thirty-seventh transistor is electrically connected to the second pull-down node, a first electrode of the thirty-seventh transistor is electrically connected to the first scan signal terminal, and a second electrode of the thirty-seventh transistor is electrically connected to the fourth voltage signal terminal. The eighth reset circuit includes a fortieth transistor. A control electrode of the fortieth transistor is electrically connected to the input signal terminal, a first electrode of the fortieth transistor is electrically connected to the first pull-down node, and a second electrode of the fortieth transistor is electrically connected to the third voltage signal terminal. The ninth reset circuit includes a forty-first transistor and a forty-second transistor. A control electrode of the forty-first transistor is electrically connected to the second pull-down node, a first electrode of the forty-first transistor is electrically connected to the second scan signal terminal, and a second electrode of the forty-first transistor is electrically connected to the fourth voltage signal terminal. A control electrode of the forty-second transistor is electrically connected to the first pull-down node, a first electrode of the forty-second transistor is electrically connected to the second scan signal terminal, and a second electrode of the forty-second transistor is electrically connected to the fourth voltage signal terminal. The tenth reset circuit includes a forty-third transistor. A control electrode of the forty-third transistor is electrically connected to the input signal terminal, a first electrode of the forty-third transistor is electrically connected to the second pull-down node, and a second electrode of the forty-third transistor is electrically connected to the third voltage signal terminal.

In some embodiments, in a case where the first output circuit is further electrically connected to the first sensing signal terminal, and the second output circuit is further electrically connected to the second sensing signal terminal, the seventh reset circuit is further electrically connected to the first sensing signal terminal. The seventh reset circuit is further configured to, under the control of the voltage of the first pull-down node or the voltage of the second pull-down node, transmit the third voltage signal transmitted by the third voltage signal terminal to the first sensing signal terminal to reset the first sensing signal terminal. The ninth reset circuit is further electrically connected to the second sensing signal terminal. The ninth reset circuit is further configured to, under the control of the voltage of the first pull-down node or the voltage of the second pull-down node, transmit the fourth voltage signal transmitted by the fourth voltage signal terminal to the second sensing signal terminal to reset the second sensing signal terminal.

In some embodiments, the seventh reset circuit further includes a fifty-fourth transistor and a fifty-fifth transistor. A control electrode of the fifty-fourth transistor is electrically connected to the first pull-down node, a first electrode of the fifty-fourth transistor is electrically connected to the first sensing signal terminal, and a second electrode of the fifty-fourth transistor is electrically connected to the fourth voltage signal terminal. A control electrode of the fifty-fifth transistor is electrically connected to the second pull-down node, a first electrode of the fifty-fifth transistor is electrically connected to the first sensing signal terminal, and a second electrode of the fifty-fifth transistor is electrically connected to the fourth voltage signal terminal. The ninth reset circuit further includes a fifty-sixth transistor and a fifty-seventh transistor. A control electrode of the fifty-sixth transistor is electrically connected to the second pull-down node, a first electrode of the fifty-sixth transistor is electrically connected to the second sensing signal terminal, and a second electrode of the fifty-sixth transistor is electrically connected to the fourth voltage signal terminal. A control electrode of the fifty-seventh transistor is electrically connected to the first pull-down node, a first electrode of the fifty-seventh transistor is electrically connected to the second sensing signal terminal, and a second electrode of the fifty-seventh transistor is electrically connected to the fourth voltage signal terminal.

In some embodiments, the shift register further includes a blanking input unit. The blanking input unit is electrically connected to a selection control signal terminal, the input signal terminal, a third voltage signal terminal, a fourth clock signal terminal, the first pull-up node, the first leakage prevention node, and the leakage prevention input node. The blanking input unit is configured to, under a control of a selection control signal transmitted by the selection control signal terminal and the input signal transmitted by the input signal terminal, transmit a fourth clock signal transmitted by the fourth clock signal terminal to the first pull-up node. In a case where the shift register further includes the second scan unit, the blanking input unit is further electrically connected to the second pull-up node and the second leakage prevention node. The blanking input unit is further configured to, under the control of the selection control signal transmitted by the selection control signal terminal and the input signal transmitted by the input signal terminal, transmit the fourth clock signal transmitted by the fourth clock signal terminal to the second pull-up node.

In some embodiments, the blanking input unit includes a selection control circuit, a third input circuit, a first transmission circuit, and a third leakage prevention circuit. The selection control circuit is electrically connected to the selection control signal terminal, the input signal terminal, the third voltage signal terminal, a first blanking node, and a third leakage prevention node. The selection control circuit is configured to transmit the input signal received at the input signal terminal to the first blanking node under the control of the selection control signal, and to maintain a voltage of the first blanking node under a control of the input signal received at the input signal terminal and a third voltage signal received at the third voltage signal terminal. The third leakage prevention circuit is electrically connected to the third leakage prevention node, the first blanking node, and the leakage prevention input node. The third leakage prevention circuit is configured to transmit one of the first voltage signal and the second voltage signal from the leakage prevention input node to the third leakage prevention node under a control of a voltage of the first blanking node. The third input circuit is electrically connected to the first blanking node, the fourth clock signal terminal, and a second blanking node. The third input circuit is configured to transmit the fourth dock signal received at the fourth clock signal terminal to the second blanking node under the control of the voltage of the first blanking node. The first transmission circuit is electrically connected to the fourth clock signal terminal, the second blanking node, the first pull-up node, and the first leakage prevention node. The first transmission circuit is configured to transmit the fourth clock signal received at the second blanking node to the first pull-up node under a control of the fourth clock signal transmitted by the fourth clock signal terminal. In the case where the shift register further includes the second scan unit, the blanking input unit further includes the second transmission circuit. The second transmission circuit is electrically connected to the fourth clock signal terminal, the second blanking node, the second pull-up node, and the second leakage prevention node. The second transmission circuit is configured to transmit the fourth clock signal received at the second blanking node to the second pull-up node under the control of the fourth clock signal transmitted by the fourth clock signal terminal.

In some embodiments, the selection control circuit includes a forty-fourth transistor, a forty-fifth transistor, and a third capacitor. A control electrode of the forty-fourth transistor is electrically connected to the selection control signal terminal, a first electrode of the forty-fourth transistor is electrically connected to the input signal terminal, and a second electrode of the forty-fourth transistor is electrically connected to a first electrode of the forty-fifth transistor and the third leakage prevention node. A control electrode of the forty-fifth transistor is electrically connected to the selection control signal terminal, and a second electrode of the forty-fifth transistor is electrically connected to the first blanking node. A first terminal of the third capacitor is electrically connected to the first blanking node, and a second terminal of the third capacitor is electrically connected to the third voltage signal terminal. The third leakage prevention circuit includes a forty-sixth transistor. A control electrode of the forty-sixth transistor is electrically connected to the first blanking node, a first electrode of the forty-sixth transistor is electrically connected to the leakage prevention input node, and a second electrode of the forty-sixth transistor is electrically connected to the third leakage prevention node. The third input circuit includes a forty-seventh transistor. A control electrode of the forty-seventh transistor is electrically connected to the first blanking node, a first electrode of the forty-seventh transistor is electrically connected to the fourth clock signal terminal, and a second electrode of the forty-seventh transistor is electrically connected to the second blanking node. The first transmission circuit includes a forty-eighth transistor and a forty-ninth transistor. A control electrode of the forty-eighth transistor is electrically connected to the fourth clock signal terminal, a first electrode of the forty-eighth transistor is electrically connected to the second blanking node, and a second electrode of the forty-eighth transistor is electrically connected to a first electrode of the forty-ninth transistor and the first leakage prevention node. A control electrode of the forty-ninth transistor is electrically connected to the fourth clock signal terminal, and a second electrode of the forty-ninth transistor is electrically connected to the first pull-up node. The second transmission circuit includes a fiftieth transistor and a fifty-first transistor. A control electrode of the fiftieth transistor is electrically connected to the fourth clock signal terminal, a first electrode of the fiftieth transistor is electrically connected to the second blanking node, and a second electrode of the fiftieth transistor is electrically connected to a first electrode of the fifty-first transistor and the second leakage prevention node. A control electrode of the fifty-first transistor is electrically connected to the fourth clock signal terminal, and a second electrode of the fifty-first transistor is electrically connected to the second pull-up node.

In another aspect, a method for driving the shift register in any one of the above embodiments is provided. The driving method includes: in an input phase, in response to the input signal received at the input signal terminal, the first input circuit being turned on, and transmitting the input signal to the first pull-up node; in response to the first voltage signal received at the first voltage signal terminal, the leakage prevention input unit being turned on, and transmitting the first voltage signal to the leakage prevention input node, or, in response to the second voltage signal received at the second voltage signal terminal, the leakage prevention input unit being turned on, and transmitting the second voltage signal to the leakage prevention input node; the leakage prevention unit being turned on under the control of the voltage of the first pull-up node, and transmitting one of the first voltage signal and the second voltage signal from the leakage prevention input node to the first leakage prevention node.

In yet another aspect, a gate driving circuit is provided. The gate driving circuit includes a plurality of stages of shift registers that are cascaded in any one of the above embodiments.

In yet another aspect, a display device is provided. The display device includes the gate driving circuit in any one of the embodiments.

BRIEF DESCRIPTION OF THE DRAWINGS

In order to describe technical solutions in the present disclosure more clearly, accompanying drawings to be used in some embodiments of the present disclosure will be introduced briefly below. Obviously, the accompanying drawings to be described below are merely accompanying drawings of some embodiments of the present disclosure, and a person of ordinary skill in the art may obtain other drawings according to these drawings. In addition, the accompanying drawings to be described below may be regarded as schematic diagrams, but are not limitations on an actual size of a product, and an actual process of a method involved in the embodiments of the present disclosure.

DETAILED DESCRIPTION

Figure 1:
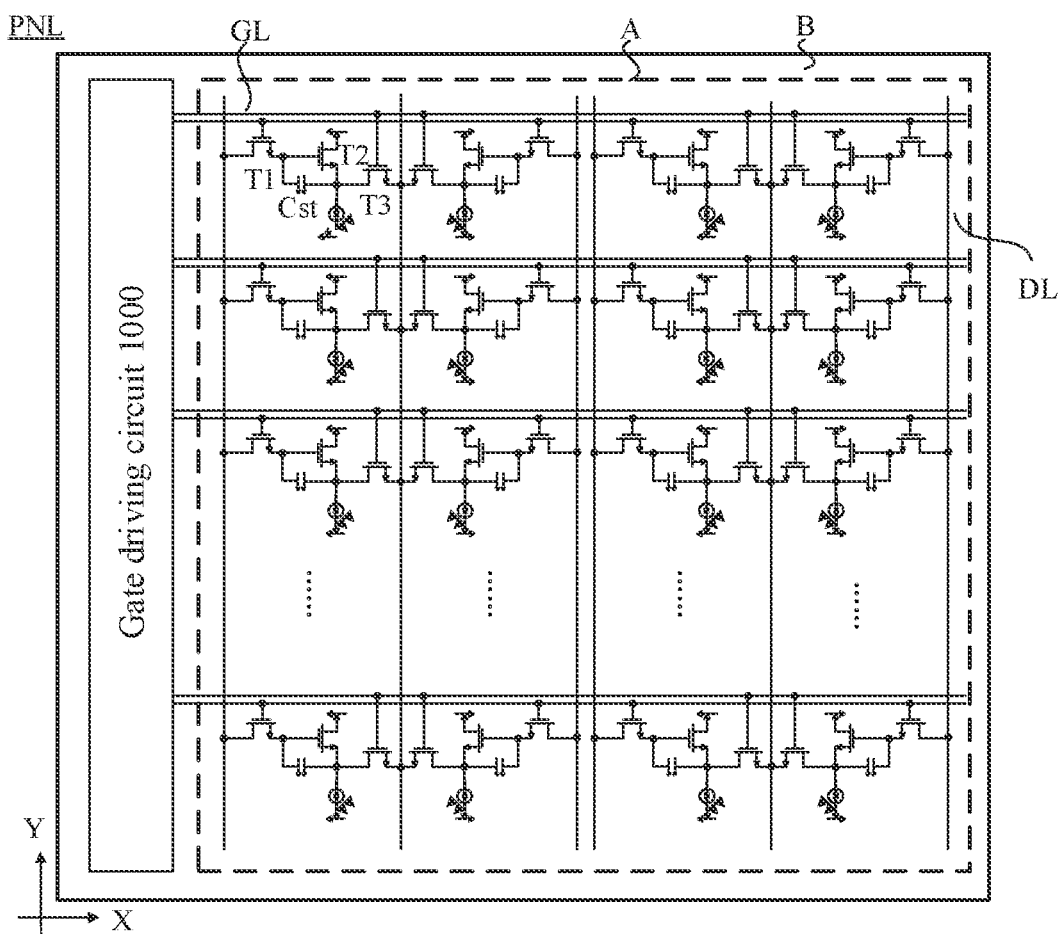
FIG. 1 is a structural diagram of a display panel, in accordance with some embodiments of the present disclosure.

Technical solutions in some embodiments of the present disclosure will be described clearly and completely with reference to the accompanying drawings below. Obviously, the described embodiments are merely some but not all embodiments of the present disclosure. All other embodiments obtained by a person of ordinary skill in the art based on the embodiments of the present disclosure shall be included in the protection scope of the present disclosure.

Unless the context requires otherwise, throughout the description and the claims, the term "comprise" and other forms thereof such as the third-person singular form "comprises" and the present participle form "comprising" are construed as an open and inclusive meaning, i.e., "including, but not limited to." In the description of the specification, the terms such as "one embodiment," "some embodiments," "exemplary embodiments," "an example," "specific example" or "some examples" are intended to indicate that specific features, structures, materials or characteristics related to the embodiment(s) or example(s) are included in at least one embodiment or example of the present disclosure. Schematic representations of the above terms do not necessarily refer to the same embodiment(s) or example(s). In addition, the specific features, structures, materials, or characteristics may be included in any one or more embodiments or examples in any suitable manner.

Below, terms such as "first" and "second" are only used for descriptive purposes, and are not to be construed as indicating or implying relative importance or implicitly indicating the number of indicated technical features. Thus, a feature defined with "first" or "second" may explicitly or implicitly include one or more of the features. In the description of the embodiments of the present disclosure, the term "a plurality of/the plurality of" means two or more unless otherwise specified.

In the description of some embodiments, the term "connected" and extensions thereof may be used. For example, the term "connected" may be used in the description of some embodiments to indicate that two or more components are in direct physical contact or electrical contact with each other. The embodiments disclosed herein are not necessarily limited to the contents herein.

The phrase "A and/or B" includes the following three combinations: only A, only B, and a combination of A and B.

As used herein, the term "if" is optionally construed as "when" or "in a case where" or "in response to determining" or "in response to detecting", depending on the context. Similarly, the phrase "if it is determined" or "if [a stated condition or event] is detected" is optionally construed as "in a case where it is determined" or "in response to determining" or "in a case where [the stated condition or event] is detected" or "in response to detecting [the stated condition or event]", depending on the context.

The use of the phrase "applicable to" or "configured to" herein means an open and inclusive expression, which does not exclude devices that are applicable to or configured to perform additional tasks or steps.

In addition, the use of the phrase "based on" means openness and inclusiveness, since a process, step, calculation or other action that is "based on" one or more of the stated conditions or values may, in practice, be based on additional conditions or values exceeding those stated.

The term such as "about" or "approximately" as used herein includes a stated value and an average value within an acceptable range of deviation of a particular value determined by a person of ordinary skill in the art, considering measurement in question and errors associated with measurement of a particular quantity (i.e., limitations of a measurement system).

Exemplary embodiments are described herein with reference to sectional views and/or plan views as idealized exemplary drawings. In the accompanying drawings, thicknesses of layers and regions are enlarged for clarity. Thus, variations in shape relative to the accompanying drawings due to, for example, manufacturing techniques and/or tolerances may be envisaged. Therefore, the exemplary embodiments should not be construed to be limited to the shapes of regions shown herein, but to include deviations in shape due to, for example, manufacturing. For example, an etched region shown in a rectangular shape generally has a curved feature. Therefore, the regions shown in the accompanying drawings are schematic in nature, and their shapes are not intended to show actual shapes of the regions in a device, and are not intended to limit the scope of the exemplary embodiments.

Transistors used in circuits in the embodiments of the present disclosure may be thin film transistors, field effect transistors (e.g., oxide thin film transistors), or other switching devices with same characteristics. In the embodiments of the present disclosure, a description will be made considering the thin film transistors as an example.

In some embodiments, a control electrode of each transistor used in a shift register is a gate of the transistor, a first electrode of the transistor is one of a source and a drain of the transistor, and a second electrode of the transistor is another one of the source and the drain of the transistor. Since the source and the drain of the transistor may be symmetrical in structure, the source and the drain of the transistor may be same in structure. That is, the first electrode and the second electrode of the transistor in the embodiments of the present disclosure may be same in structure. For example, in a case where the transistor is a P-type transistor, the first electrode of the transistor is the source, and the second electrode of the transistor is the drain. For example, in a case where the transistor is an N-type transistor, the first electrode of the transistor is the drain, and the second electrode of the transistor is the source.

In the circuits in the embodiments of the present disclosure, nodes such as a first pull-up node, a second pull-up node, a first pull-down node and a second pull-down node do not represent actual components, but represent junctions of related electrical connections in circuit diagrams. That is, these nodes are nodes that are equivalent to the junctions of the related electrical connections in the circuit diagrams.

In the embodiments of the present disclosure, the term "pull-up" refers to charging a node or an electrode of a transistor, so that an absolute value of a voltage of the node or the electrode is increased, thereby operating (e.g., turning on) a corresponding transistor. The term "pull-down" refers to discharging a node or an electrode of a transistor, so that an absolute value of a voltage of the node or the electrode is reduced, thereby operating (e.g., turning off) a corresponding transistor.

Below, the circuits in the embodiments of the present disclosure will be described in an example where the transistors are all N-type transistors.

Some embodiments of the present disclosure provide a shift register and a method for driving the same, a gate driving circuit, and a display device. The shift register, the method for driving the shift register, the gate driving circuit, and the display device will be described below.

Figure 2:
FIG. 2 is a structural diagram of a display device, in accordance with some embodiments of the present disclosure.

Some embodiments of the present disclosure provide the display device 2000, as shown in FIG. 2. The display device may be any device that displays images whether moving (e.g., videos) or stationary (e.g., sill images). It is contemplated that the embodiments may be implemented in, or associated with, a variety of electronic devices. The variety of electronic devices are, for example (but not limited to), mobile phones, wireless devices, personal digital assistants (PDAs), hand-held or portable computers, global positioning system (GPS) receivers/navigators, cameras, MP4 video players, camcorders, game consoles, watches, clocks, calculators, TV monitors, flat panel displays, computer monitors, auto displays (e.g., odometer displays), navigators, cockpit controllers and/or displays, camera view displays (e.g., rear-view camera displays in vehicles), electronic photos, electronic billboards or signs, projectors, architectural structures, packagings, and aesthetic structures (e.g., displays for displaying an image of a piece of jewelry).

In some examples, the display device 2000 includes a frame, and a display panel PNL, a circuit board, a display driving integrated circuit (IC) and other electronic accessories that are disposed in the frame.

The display panel may be, for example, an organic light-emitting diode (OLED) display panel, a quantum dot light-emitting diode (QLED) display panel, or a micro light-emitting diode (Micro LED) display panel, which is not limited.

Some embodiments of the present disclosure will be schematically described below in an example where the display panel is the OLED display panel.

In some embodiments, as shown in FIG. 1, the display panel PNL has a display area A and a bezel area B disposed on side(s) of the display area A. The "side(s)" refers to a side, two sides, three sides, or a peripheral side of the display area A. That is, the bezel area B may be located on a side, two sides, or three sides of the display area A. Or, the bezel area B may be arranged around the display area A.

In some examples, as shown in FIG. 1, the display panel PNL may include a plurality of sub-pixels, a plurality of gate lines GL extending in a first direction X, and a plurality of data lines DL extending in a second direction Y, which are disposed in the display area A.

For example, sub-pixels arranged in line in the first direction X may be referred to as sub-pixels in a same row, and sub-pixels P arranged in line in the second direction Y may be referred to as sub-pixels in a same column. The sub-pixels in the same row may be electrically connected to at least one gate line GL, and the sub-pixels in the same column may be electrically connected to a data line DL.

In some examples, as shown in FIG. 1, the gate driving circuit 1000 may be disposed in the bezel area B, and located on a side in an extending direction of the plurality of gate lines GL. The gate driving circuit 1000 may be electrically connected to the plurality of gate lines GL, and output scan signals to the plurality of gate lines GL, so as to drive sub-pixels in a plurality of rows for image display.

In some examples, the gate driving circuit 1000 may be a gate driving IC. Of course, the gate driving circuit 1000 may also be a gate driver on array (GOA) circuit. That is, the gate driving circuit 1000 is directly integrated into an array substrate in the display panel PNL. The gate driving circuit 1000 is provided as the GOA circuit, which may reduce a manufacturing cost of the display panel PNL, and in addition, may further reduce a bezel size of the display panel PNL to realize a narrow bezel design. Following embodiments will be described in an example where the gate driving circuit 1000 is the GOA circuit.

Figure 4:
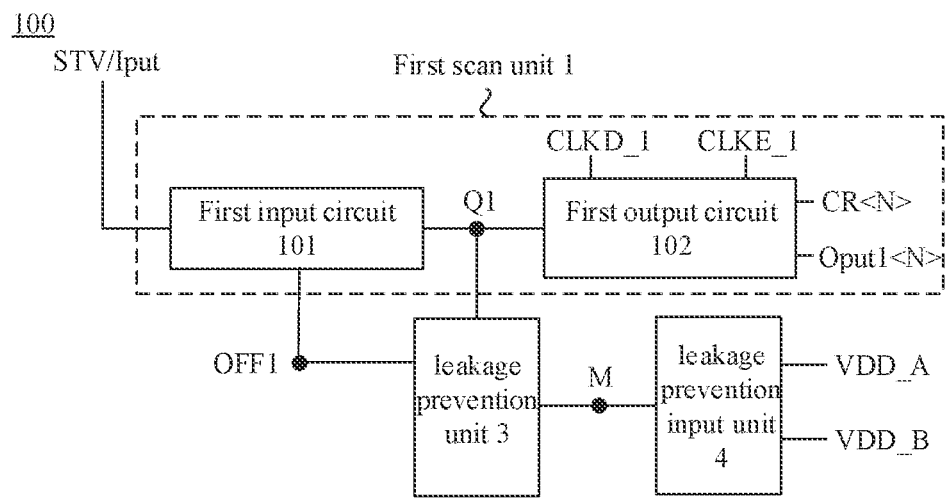
FIG. 4 is a structural diagram of a shift register, in accordance with some embodiments of the present disclosure.

In some embodiments of the present disclosure, the shift register 100, as shown in FIG. 4, includes a first scan unit 1.

In some examples, as shown in FIG. 4, the first scan unit 1 includes a first input circuit 101 and a first output circuit 102 electrically connected to the first input circuit 101. The first output circuit 102 may be, for example, electrically connected to the gate line(s) GL correspondingly, and output a first scan signal to the gate line(s) GL, so as to drive sub-pixels in a corresponding row to display image(s).

A plurality of shift registers 100 may be cascaded to form the gate driving circuit 1000, and the gate driving circuit 1000 is able to correspondingly provide scan signals to the sub-pixels in the plurality of rows in the display panel PNL. That is, the gate driving circuit 1000 may be used in the display device 2000 to provide the scan signals in a process of displaying a frame of image on the display device 2000.

In some examples, as shown in FIG. 4, the first input circuit 101 is electrically connected to an input signal terminal Input (Iput in the figures and in the following), a first pull-up node Q1, and a first leakage prevention node OFF1. The first input circuit 101 is configured to, in response to an input signal received at the input signal terminal Iput, transmit the input signal to the first pull-up node Q1.

For example, in a case where a level of the input signal is a high level, the first input circuit 101 may be turned on due to an action of the input signal, and transmit the input signal to the first pull-up node Q1 to charge the first pull-up node Q1, so that a voltage of the first pull-up node Q1 is increased.

In some examples, as shown in FIG. 4, the first output circuit 102 is electrically connected to the first pull-up node Q1, a first clock signal terminal CLKD_1, a second clock signal terminal CLKE_1, a shift signal terminal CR<N>, and a first scan signal terminal Output1<N> (Oput1<N> in the figures and in the following). The first output circuit 102 is configured to: transmit a first clock signal received at the first clock signal terminal CLKD_1 to the shift signal terminal CR<N> under a control of the voltage of the first pull-up node Q1; and transmit a second clock signal received at the second clock signal terminal CLKE_1 to the first scan signal terminal Oput1<N> under the control of the voltage of the first pull-up node Q1.

For example, in a case where the first input circuit 101 charges the first pull-up node Q1 such that the voltage of the first pull-up node Q1 is increased, the first output circuit 102 may be turned on under the control of the voltage of the first pull-up node Q1, and output the first clock signal received at the first clock signal terminal CLKD_1 as a shift signal from the shift signal terminal CR<N>, and synchronously output the second clock signal received at the second clock signal terminal CLKE_1 as the first scan signal from the first scan signal terminal Oput1<N>.

Here, in a display phase of a frame, signal waveforms of both the shift signal and the first scan signal output from the first output circuit 102 may be same or different.

For example, in the display phase of the frame, the first scan signal output from the first output circuit 102 may drive sub-pixels in a corresponding row in the display panel PNL to display image(s).

It will be noted that after the plurality of shift registers 100 are cascaded to form the gate driving circuit 1000, the shift signal terminal CR<N> in the first scan unit 1 in an N-th stage shift register 100 may be electrically connected to the input signal terminal Iput in the first scan unit 1 in an (N+1)-th stage shift register 100, and thus the shift signal output from the shift signal terminal CR<N> in the N-th stage shift register 100 serves as the input signal of the first scan unit 1 in the (N+1)-th stage shift register 100, where N is an integer greater than or equal to 1 (N≥1).

In addition, the input signal terminal(s) Iput in a part of the shift registers 100 may be electrically connected to a start signal terminal STV, so as to receive a start signal transmitted by the start signal terminal STV as the input signal. The part of the shift registers 100 may be, for example, a first stage shift register 100 in the gate driving circuit 1000, or may be, for example, the first stage shift register 100 and a second stage shift register 100.

Here, the number of shift register(s) 100 electrically connected to the start signal terminal STV is not limited, which may be selectively set according to actual needs.

It will be noted that in a case where the level of the input signal transmitted by the input signal terminal Iput is a low level such that the first input circuit 101 is turned off, and the voltage of the first pull-up node Q1 is maintained at a high level, the voltage of the first pull-up node Q1 is higher than a voltage of the input signal terminal Iput, and a large voltage difference is formed between the first pull-up node Q1 and the input signal terminal Iput.

Figure 3:
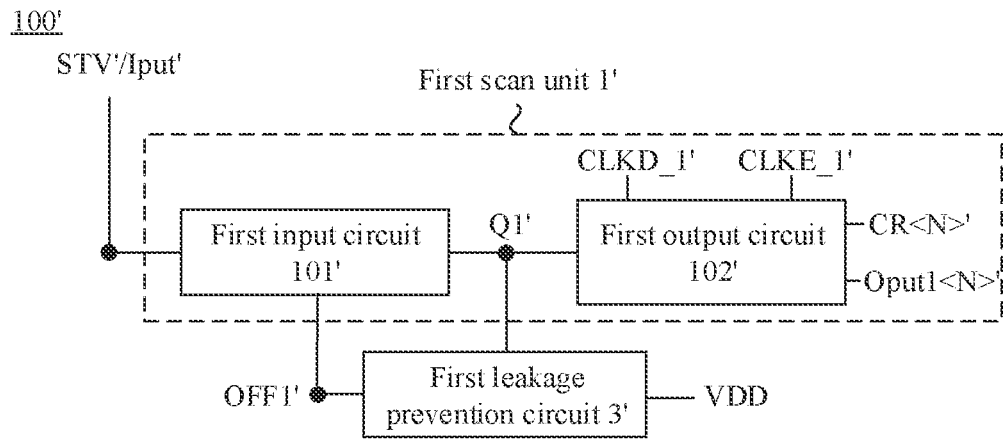
FIG. 3 is a structural diagram of a shift register, in accordance with an implementation.

In an implementation, as shown in FIG. 3, a shift register 100' includes a first scan unit 1'. The first scan unit 1' includes a first input circuit 101' and a first output circuit 102' electrically connected to the first input circuit 101'. The first input circuit 101' and the first output circuit 102' may refer to the first input circuit 101 and the first output circuit 102, respectively, and will not be repeated here. A large voltage difference is formed between a first pull-up node Q1' and an input signal terminal Iput', which easily causes an electric leakage of the first pull-up node Q1' through the first input circuit 101', resulting in a difficulty of maintaining the first pull-up node Q1' at a high and stable voltage in a process of outputting a shift signal and/or a first scan signal from the first output circuit 102', and thus resulting in deviation in the shift signal and/or the first scan signal, thereby affecting display effects of a display panel and a display device. Therefore, the shift register 100' further includes a first leakage prevention circuit 3'.

As shown in FIG. 3, the first leakage prevention circuit 3' is electrically connected to the first pull-up node Q1', a constant high voltage signal terminal VDD, and a first leakage prevention node OFF1'. The first leakage prevention circuit 3' is configured to transmit a constant high voltage signal received at the constant high voltage signal terminal VDD to the first leakage prevention node OFF1' under a control of a voltage of the first pull-up node Q1'.

For example, in a case where the voltage of the first pull-up node Q1' is at a high level, the first leakage prevention circuit 3' may be turned on under the control of the voltage of the first pull-up node Q1', and transmit the constant high voltage signal received at the constant high voltage signal terminal VDD to the first leakage prevention node OFF1', so that a voltage of the first leakage prevention node OFF1' is increased (for example, the voltage of the first leakage prevention node OFF1' is equal to or approximately equal to the voltage of the first pull-up node Q1'). In this way, a voltage difference between the first leakage prevention node OFF1' and the first pull-up node Q1' may be reduced, so as to weaken a degree of the electric leakage of the first pull-up node Q1' through the first input circuit 101', or even avoid the electric leakage of the first pull-up node Q1' through the first input circuit 101'.

After a plurality of shift registers are cascaded to form a gate driving circuit, the gate driving circuit may include a constant high voltage signal line that is electrically connected to the constant high voltage signal terminals VDD in the shift registers and used for transmitting a constant high voltage signal to the constant high voltage signal terminals VDD in the shift registers. Since an electrical signal transmitted from the constant high voltage signal line to the constant high voltage signal terminal VDD is a constant high voltage signal, and the constant high voltage signal line is required to continuously transmit the constant high voltage signal for a long time, in a process of using the gate driving circuit or testing a reliability of the gate driving circuit (in a high temperature and high humidity environment), a voltage difference between the constant high voltage signal line and other conducting wire above the constant high voltage signal line damages an insulating layer between the constant high voltage signal line and the other conducting wire, and a leakage path is formed, thereby resulting in a failure of the constant high voltage signal line due to electrochemical corrosion.

Based on this, as shown in FIG. 4, the shift register 100 in some embodiments of the present disclosure further includes a leakage prevention unit 3 and a leakage prevention input unit 4.

In some examples, as shown in FIG. 4, the leakage prevention input unit 4 is electrically connected to a first voltage signal terminal VDD_A, a second voltage signal terminal VDD_B, and a leakage prevention input node M. The leakage prevention input unit 4 is configured to: in response to a first voltage signal received at the first voltage signal terminal VDD_A, transmit the first voltage signal to the leakage prevention input node M; and, in response to a second voltage signal received at the second voltage signal terminal VDD_B, transmit the second voltage signal to the leakage prevention input node M. The first voltage signal and the second voltage signal are mutually inverted signals.

For example, the term "inverted signals" here means that the first voltage signal and the second voltage signal are unchanged in the display phase of the frame or display phases of a plurality of consecutive frames, and a level of the second voltage signal is a low level in a case where a level of the first voltage signal is a high level, or the level of the second voltage signal is a high level in a case where the level of the first voltage signal is a low level.

Figure 5:
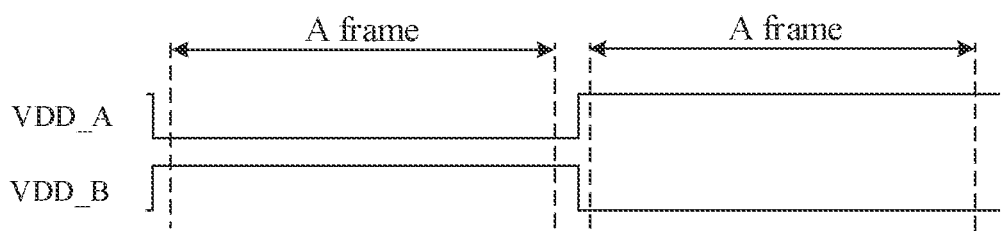
FIG. 5 is a timing diagram of a first voltage signal and a second voltage signal, in accordance with some embodiments of the present disclosure.

For example, as shown in FIG. 5, in the display phase of the frame, the level of the first voltage signal changes from a high level to a low level, and in this case, the level of the second voltage signal changes from a low level to a high level. The level of the first voltage signal changes from a low level to a high level, and in this case, the level of the second voltage signal changes from a high level to a low level.

Figure 6:
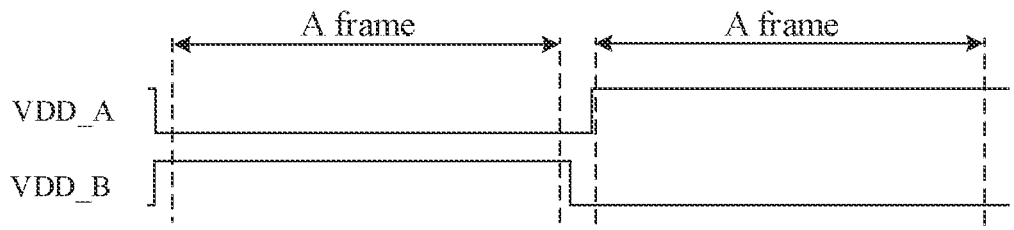
FIG. 6 is another timing diagram of a first voltage signal and a second voltage signal, in accordance with some embodiments of the present disclosure.

For another example, as shown in FIG. 6, in the display phase of the frame, the level of the first voltage signal changes from a high level to a low level, and in this case, the level of the second voltage signal changes from a low level to a high level. Before the level of the first voltage signal changes from a low level to a high level, the level of the second voltage signal changes from a high level to a low level.

Of course, the level of the first voltage signal and the level of the second voltage signal may be arranged in other manner, which is able to satisfy that the level of the first voltage signal and the level of the second voltage signal are different in the display phase of the frame.

In the embodiments of the present disclosure, a schematic description will be made in an example where the level of the first voltage signal and the level of the second voltage signal change synchronously.

A high level and a low level in the embodiments of the present disclosure are relative. For example, a high level voltage is 15 V, and a low level voltage is 5 V, and the low level voltage is not limited to a voltage less than or equal to 0 V.

Based on this, for example, in the case where the level of the first voltage signal is a high level, and the level of the second voltage signal is a low level, the leakage prevention input unit 4 may be turned on due to an action of the first voltage signal, and transmit the first voltage signal to the leakage prevention input node M, so that a voltage of the leakage prevention input node M is increased.

For example, in the case where the level of the first voltage signal is a low level, and the level of the second voltage signal is a high level, the leakage prevention input unit 4 may be turned on due to an action of the second voltage signal, and transmit the second voltage signal to the leakage prevention input node M, so that the voltage of the leakage prevention input node M is increased.

In some examples, as shown in FIG. 4, the leakage prevention unit 3 is electrically connected to the first pull-up node Q1, the first leakage prevention node OFF1, and the leakage prevention input node M. The leakage prevention unit 3 is configured to transmit the first voltage signal or the second voltage signal from the leakage prevention input node M to the first leakage prevention node OFF1 under the control of the voltage of the first pull-up node Q1.

For example, in the case where the first input circuit 101 charges the first pull-up node Q1 such that the voltage of the first pull-up node Q1 is increased, the leakage prevention circuit 3 may be turned on under the control of the voltage of the first pull-up node Q1, and transmit the first voltage signal or the second voltage signal received at the leakage prevention input node M to the first leakage prevention node OFF1, so that a voltage of the first leakage prevention node OFF1 is increased.

In a case where the leakage prevention unit 3 increases the voltage of the first leakage prevention node OFF1, the voltage of the first leakage prevention node OFF1 may be, for example, less than the voltage of the first pull-up node Q1, which may weaken a degree of an electric leakage of the first pull-up node Q1 through the first input circuit 101, so that the first pull-up node Q1 is able to be maintained at a high and stable voltage. Or, the voltage of the first leakage prevention node OFF1 may be, for example, equal to the voltage of the first pull-up node Q1, which may avoid the electric leakage of the first pull-up node Q1 through the first input circuit 101, so that the first pull-up node Q1 is maintained at a high and stable voltage.

Here, in an example where the level of the first voltage signal is a high level and the level of the second voltage signal is a low level, operating processes of the leakage prevention unit 3 and the leakage prevention input unit 4 may be as follows. The leakage prevention input unit 4 is turned on due to the action of the first voltage signal, and transmits the first voltage signal to the leakage prevention input node M, so that the voltage of the leakage prevention input node M is increased. In a case where the leakage prevention unit 3 is turned on under the control of the voltage of the first pull-up node Q1, the leakage prevention unit 3 transmits the first voltage signal received at the leakage prevention input node M to the first leakage prevention node OFF1, so that the voltage of the first leakage prevention node OFF1 is increased.

Figure 18:
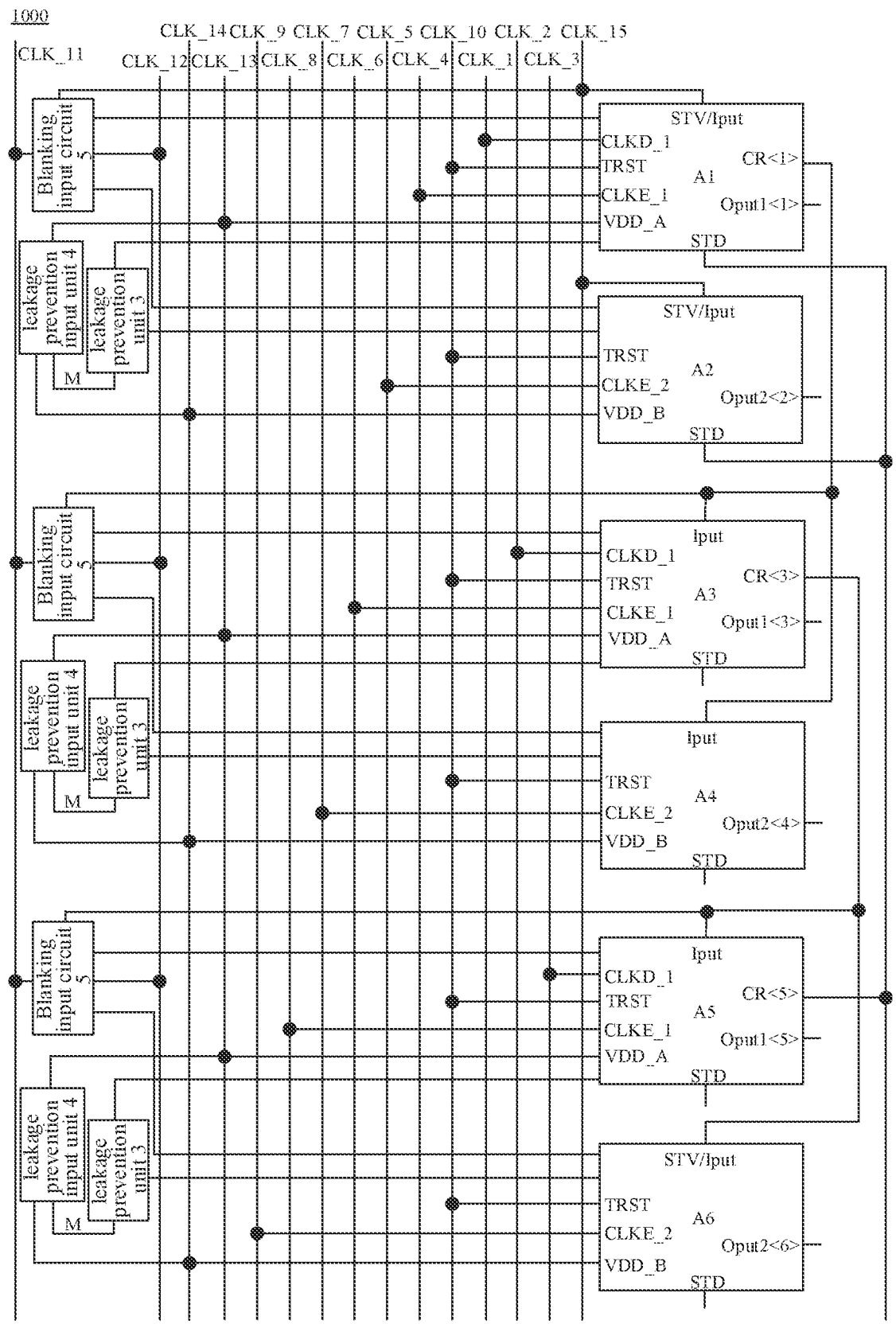
FIG. 18 is a structural diagram of a gate driving circuit, in accordance with some embodiments of the present disclosure.
Figure 20:
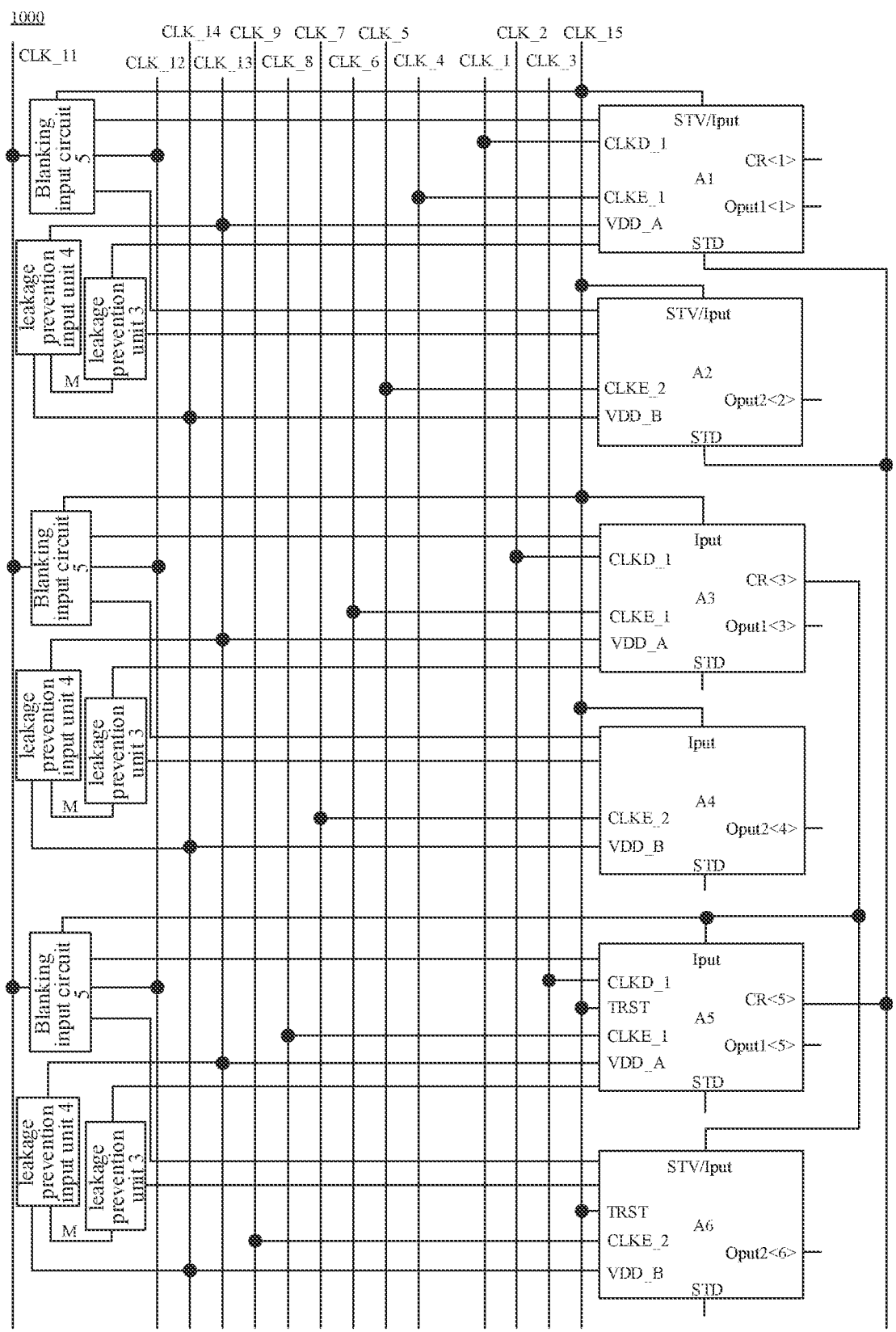
FIG. 20 is a structural diagram of another gate driving circuit, in accordance with some embodiments of the present disclosure.

Since the leakage prevention input unit 4 is electrically connected to the first voltage signal terminal VDD_A and the second voltage signal terminal VDD_B, after the plurality of shift registers 100 are cascaded to form the gate driving circuit 1000, the gate driving circuit 1000 may include a first voltage signal line that is electrically connected to the first voltage signal terminals VDD_A in the shift registers 100 and used for transmitting the first voltage signal to the first voltage signal terminals VDD_A in the shift registers 100 (i.e., a thirteenth clock signal line CLK_13 as shown in FIG. 18 or 20), and a second voltage signal line that is electrically connected to the second voltage signal terminals VDD_B in the shift registers 100 and used for transmitting the second voltage signal to the second voltage signal terminals VDD_B in the shift registers 100 (i.e., a fourteenth clock signal line CLK_14 as shown in FIG. 18 or 20). Since the first voltage signal and the second voltage signal are mutually inverted signals, in a process of using the gate driving circuit 1000 or testing a reliability of the gate driving circuit 1000, high level voltage signals may be alternately input to the leakage prevention input unit 4 by using the first voltage signal line and the second voltage signal line in display phases of different frames, so as to avoid a failure of the first voltage signal line or the second voltage signal line due to the electrochemical corrosion caused by a continuous transmission of a constant high voltage signal for a long time, thereby improving the reliability of the gate driving circuit 1000.

Thus, in some embodiments of the present disclosure, the leakage prevention unit 3 and the leakage prevention input unit 4 are provided in the shift register 100, the leakage prevention unit 3 is electrically connected to the first leakage prevention node OFF1 and the leakage prevention input node M, and the leakage prevention input unit 4 is electrically connected to the first voltage signal terminal VDD_A, the second voltage signal terminal VDD_B, and the leakage prevention input node M, so that the leakage prevention input unit 4 may transmit the first voltage signal or the second voltage signal to the leakage prevention input node M, and the leakage prevention unit 3 transmits the first voltage signal or the second voltage signal to the first leakage prevention node OFF1. In the case where the voltage of the first pull-up node Q1 is increased, a voltage difference between the first leakage prevention node OFF1 and the first pull-up node Q1 may be reduced by using the leakage prevention unit 3 and the leakage prevention input unit 4, so as to weaken the degree of the electric leakage of the first pull-up node Q1 through the first input circuit 101, or even avoid the electric leakage of the first pull-up node Q1 through the first input circuit 101, so that the first pull-up node Q1 is able to be maintained at a high and stable voltage. In this way, a leakage prevention protection of the first pull-up node Q1 may be realized by using the leakage prevention unit 3 and the leakage prevention input unit 4, so that the display device 2000 to which the shift register 100 is applied may have a good display effect.

Moreover, the first voltage signal transmitted by the first voltage signal terminal VDD_A and the second voltage signal transmitted by the second voltage signal terminal VDD_B are provided as the inverted signals, so that in the display phase of the frame, in the case where the level of the first voltage signal is a high level, the first voltage signal may be transmitted to the leakage prevention input node M and the first leakage prevention node OFF1 by using the leakage prevention input unit 4, and in the case where the level of the second voltage signal is a high level, the second voltage signal may be transmitted to the leakage prevention input node M and the first leakage prevention node OFF1 by using the leakage prevention input unit 4. In this way, after the plurality of shift registers 100 are cascaded to form the gate driving circuit 1000, the first voltage signal terminals VDD_A in the shift registers 100 may be electrically connected to the first voltage signal line for transmitting the first voltage signal, and the second voltage signal terminals VDD_B in the shift registers 100 may be electrically connected to the second voltage signal line for transmitting the second voltage signal. Thus, the high level voltage signals may be alternately input to the leakage prevention input unit 4 by using the first voltage signal line and the second voltage signal line in display phases of different frames, so as to avoid the failure of the first voltage signal line or the second voltage signal line due to the electrochemical corrosion caused by the continuous transmission of the constant high voltage signal for a long time, thereby improving the reliability of the gate driving circuit 1000.

In addition, after the first voltage signal line and the second voltage signal line are provided, it is possible to avoid providing a constant high voltage signal line for transmitting a constant high voltage signal, thereby avoiding a poor display caused by a signal crosstalk generated between the constant high voltage signal line and a low voltage signal line (e.g., a signal line used for transmitting a third voltage signal or a fourth voltage signal mentioned later).

Figure 7:
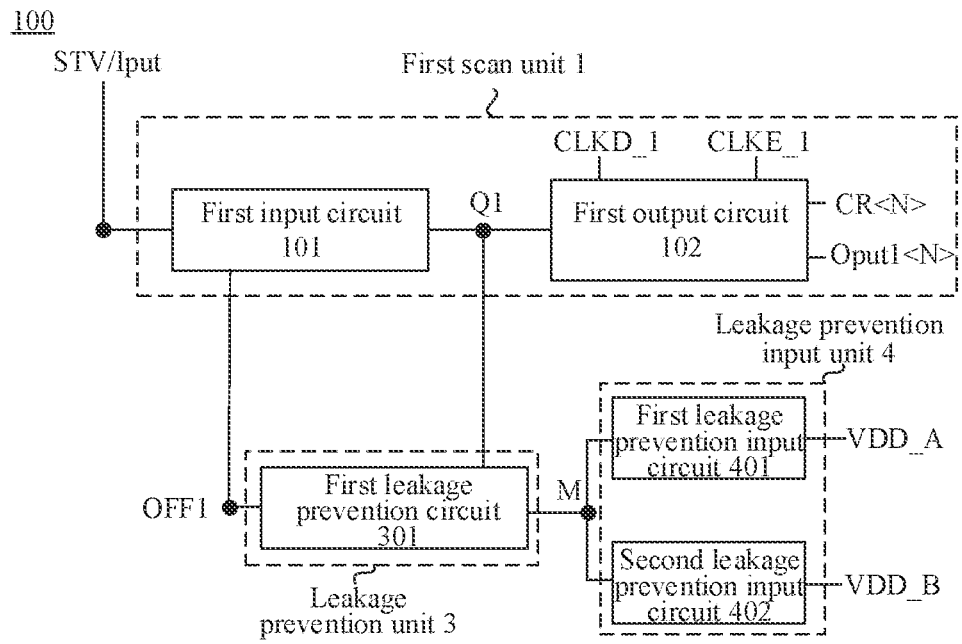
FIG. 7 is a structural diagram of another shift register, in accordance with some embodiments of the present disclosure.

In some embodiments, as shown in FIG. 7, the leakage prevention input unit 4 may include a first leakage prevention input circuit 401 and a second leakage prevention input circuit 402.

In some examples, as shown in FIG. 7 and FIGS. 9 to 17, the first leakage prevention input circuit 401 is electrically connected to the first voltage signal terminal VDD_A and the leakage prevention input node M. The first leakage prevention input circuit 401 is configured to, in response to the first voltage signal received at the first voltage signal terminal VDD_A, transmit the first voltage signal to the leakage prevention input node M.

For example, in the case where the level of the first voltage signal transmitted by the first voltage signal terminal VDD_A is a high level, the first leakage prevention input circuit 401 may be turned on under a control of the first voltage signal, and transmit the first voltage signal to the leakage prevention input node M, so that the voltage of the leakage prevention input node M is increased.

In some examples, as shown in FIG. 7 and FIGS. 9 to 17, the second leakage prevention input circuit 402 is electrically connected to the second voltage signal terminal VDD_B and the leakage prevention input node M. The second leakage prevention input circuit 402 is configured to, in response to the second voltage signal received at the second voltage signal terminal VDD_B, transmit the second voltage signal to the leakage prevention input node M.

For example, in the case where the level of the second voltage signal transmitted by the second voltage signal terminal VDD_B is a high level, the second leakage prevention input circuit 402 may be turned on under a control of the second voltage signal, and transmit the second voltage signal to the leakage prevention input node M, so that the voltage of the leakage prevention input node M is increased.

Thus, in the display phase of the frame, if the level of the first voltage signal is a high level and the level of the second voltage signal is a low level, the second leakage prevention input circuit 402 is turned off under the control of the second voltage signal, and the first leakage prevention input circuit 401 is turned on under the control of the first voltage signal, and receive and transmit the first voltage signal to the leakage prevention input node M.

In contrast, in the display phase of the frame, if the level of the first voltage signal is a low level and the level of the second voltage signal is a high level, the first leakage prevention input circuit 401 is turned off under the control of the first voltage signal, and the second leakage prevention input circuit 402 is turned on under the control of the second voltage signal, and receive and transmit the second voltage signal to the leakage prevention input node M.

Structures of both the first leakage prevention input circuit 401 and the second leakage prevention input circuit 402 included in the leakage prevention input unit 4 will be schematically described below.

In some examples, as shown in FIGS. 11, 13, 15 and 17, the first leakage prevention input circuit 401 may include a first transistor M1.

For example, as shown in FIGS. 11, 13, 15 and 17, a control electrode of the first transistor M1 is electrically connected to the first voltage signal terminal VDD_A, a first electrode of the first transistor M1 is electrically connected to the first voltage signal terminal VDD_A, and a second electrode of the first transistor M1 is electrically connected to the leakage prevention input node M.

For example, in the case where the level of the first voltage signal transmitted by the first voltage signal terminal VDD_A is a high level, the first transistor M1 may be turned on under the control of the first voltage signal, receive the first voltage signal, and transmit the received first voltage signal to the leakage prevention input node M.

In some examples, as shown in FIGS. 11, 13, 15 and 17, the second leakage prevention input circuit 402 may include a second transistor M2.

For example, as shown in FIGS. 11, 13, 15 and 17, a control electrode of the second transistor M2 is electrically connected to the second voltage signal terminal VDD_B, a first electrode of the second transistor M2 is electrically connected to the second voltage signal terminal VDD_B, and a second electrode of the second transistor M2 is electrically connected to the leakage prevention input node M.

For example, in the case where the level of the second voltage signal transmitted by the second voltage signal terminal VDD_B is a high level, the second transistor M2 may be turned on under the control of the second voltage signal, receive the second voltage signal, and transmit the received second voltage signal to the leakage prevention input node M.

Thus, in the display phase of the frame, in the case where the level of the first voltage signal is a high level and the level of the second voltage signal is a low level, the second transistor M2 is turned off under the control of the second voltage signal, and the first transistor M1 is turned on under the control of the first voltage signal, and receive and transmit the first voltage signal to the leakage prevention input node M.

In contrast, in the display phase of the frame, in the case where the level of the first voltage signal is a low level and the level of the second voltage signal is a high level, the first transistor M1 is turned off under the control of the first voltage signal, and the second transistor M2 is turned on under the control of the second voltage signal, and receive and transmit the second voltage signal to the leakage prevention input node M.

In some embodiments, as shown in FIG. 7 and FIGS. 9 to 17, the leakage prevention unit 3 may include a first leakage prevention circuit 301.

In some examples, as shown in FIG. 7 and FIGS. 9 to 17, the first leakage prevention unit 301 is electrically connected to the first pull-up node Q1, the leakage prevention input node M, and the first leakage prevention node OFF1. The first leakage prevention unit 301 is configured to transmit the first voltage signal or the second voltage signal from the leakage prevention input node M to the first leakage prevention node OFF1 under the control of the voltage of the first pull-up node Q1.

For example, in the case where the first input circuit 101 charges the first pull-up node Q1 such that the voltage of the first pull-up node Q1 is increased, the first leakage prevention circuit 301 may be turned on under the control of the voltage of the first pull-up node Q1, and transmit the first voltage signal or the second voltage signal received at the leakage prevention input node M to the first leakage prevention node OFF1.

Here, in the case where the level of the first voltage signal is a high level and the level of the second voltage signal is a low level, the first voltage signal may be transmitted to the leakage prevention input node M through the leakage prevention input unit 4. In a case where the first leakage prevention circuit 301 is turned on, the first leakage prevention unit 301 may receive the first voltage signal at the leakage prevention input node M, and transmit the first voltage signal to the first leakage prevention node OFF1, so that the voltage of the first leakage prevention node OFF1 is increased, so as to reduce the voltage difference between the first leakage prevention node OFF1 and the first pull-up node Q1.

In the case where the level of the first voltage signal is a low level and the level of the second voltage signal is a high level, the second voltage signal may be transmitted to the leakage prevention input node M through the leakage prevention input unit 4. In the case where the first leakage prevention circuit 301 is turned on, the first leakage prevention unit 301 may receive the second voltage signal at the leakage prevention input node M, and transmit the second voltage signal to the first leakage prevention node OFF1, so that the voltage of the first leakage prevention node OFF1 is increased, so as to reduce the voltage difference between the first leakage prevention node OFF1 and the first pull-up node Q1.

A structure of the first leakage prevention circuit 301 included in the leakage prevention unit 3 will be schematically described below.

In some examples, as shown in FIGS. 11, 13, 15 and 17, the first leakage prevention circuit 301 includes a third transistor M3.

For example, as shown in FIGS. 11, 13, 15 and 17, a control electrode of the third transistor M3 is electrically connected to the first pull-up node Q1, a first electrode of the third transistor M3 is electrically connected to the leakage prevention input node M, and a second electrode of the third transistor M3 is electrically connected to the first leakage prevention node OFF1.

For example, in the case where the first input circuit 101 charges the first pull-up node Q1 such that the voltage of the first pull-up node Q1 is increased, the third transistor M3 may be turned on under the control of the voltage of the first pull-up node Q1, receive the first voltage signal or the second voltage signal from the leakage prevention input node M, and transmit the received first voltage signal or the second voltage signal to the first leakage prevention node OFF1.

It will be noted that the number of scan units included in the shift register 100 is not limited in some embodiments of the present disclosure, which may be selectively set according to actual needs.

For example, the shift register 100 may include two, three, four or more scan units. Structure(s) of the remaining scan unit(s) included in the shift register 100 may be, for example, same as or different from the structure of the first scan unit 1. In a case where the structure(s) of the remaining scan unit(s) included in the shift register 100 are different from the structure of the first scan unit 1, difference(s) may include, for example, output circuit(s) in the remaining scan unit(s) included in the shift register 100 are not electrically connected to the shift signal terminal CR<N>.

The structure of the shift register 100 will be schematically described below in an example where the shift register 100 in some embodiments of the present disclosure further includes a second scan unit 2.

Figure 8:
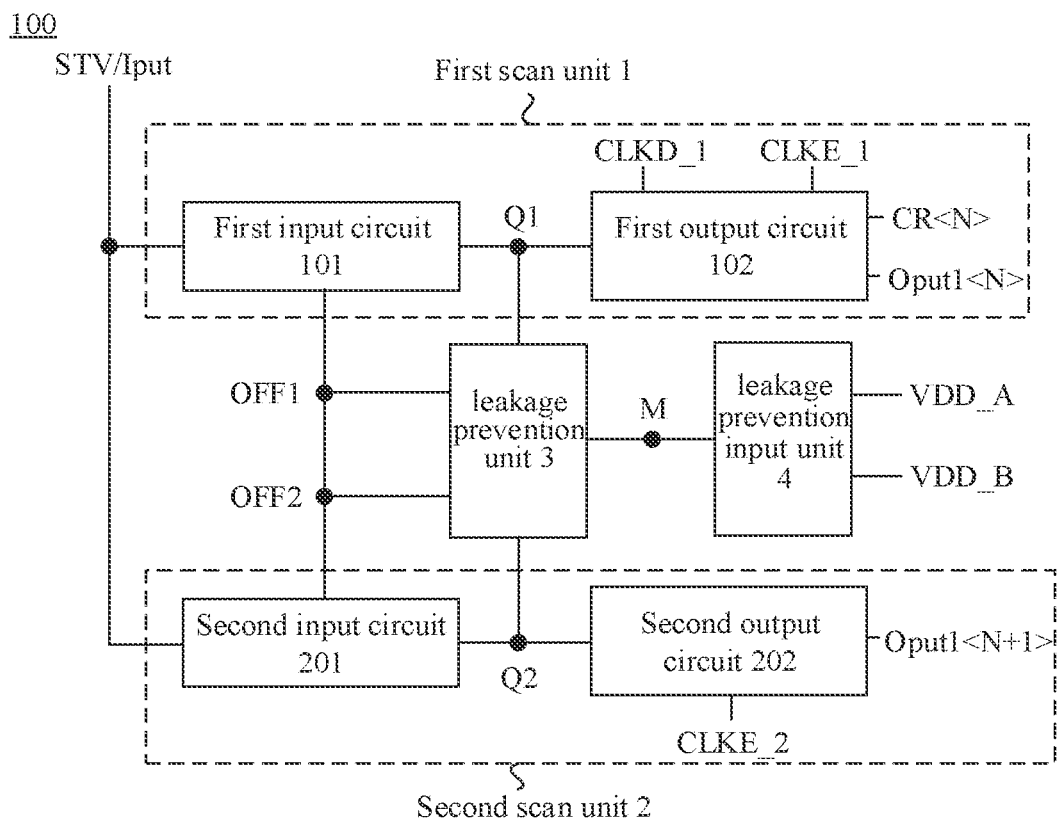
FIG. 8 is a structural diagram of yet another shift register, in accordance with some embodiments of the present disclosure.
Figure 9:
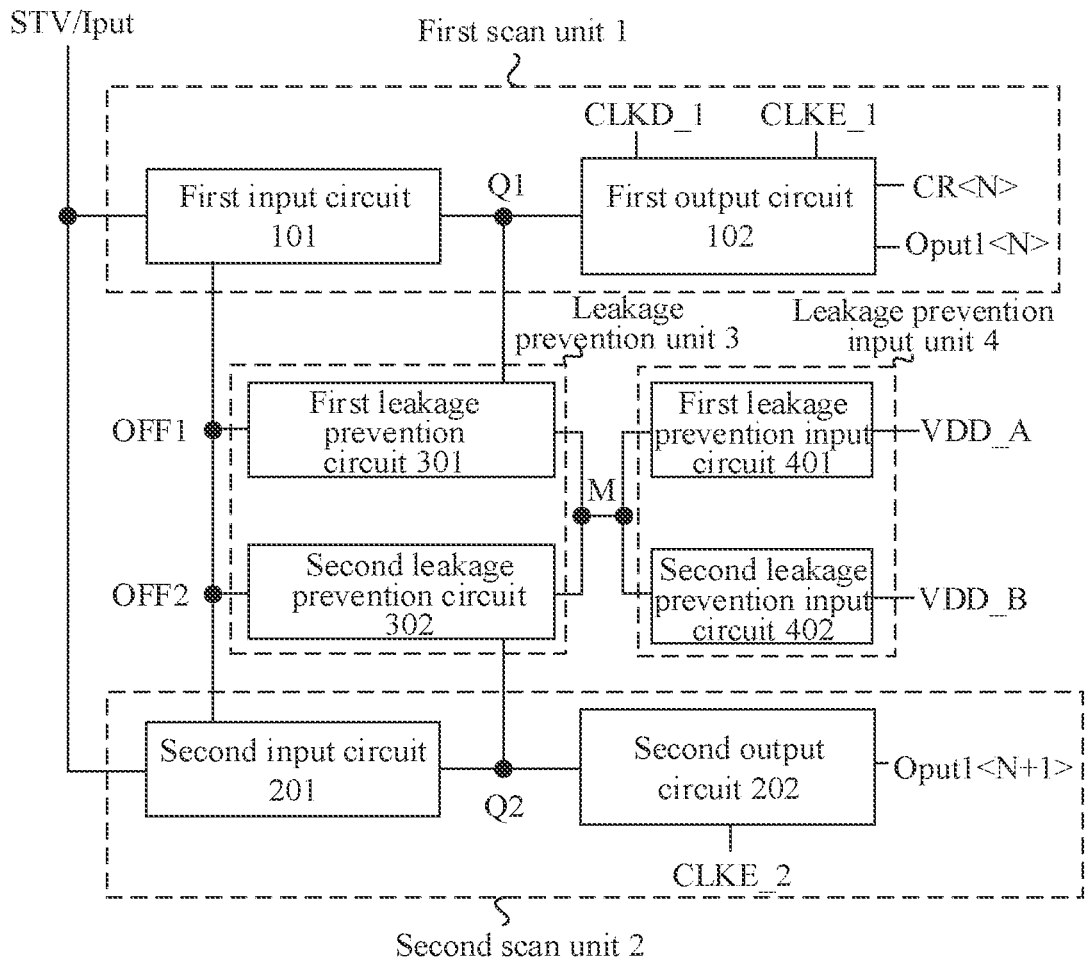
FIG. 9 is a structural diagram of yet another shift register, in accordance with some embodiments of the present disclosure.
Figure 10:
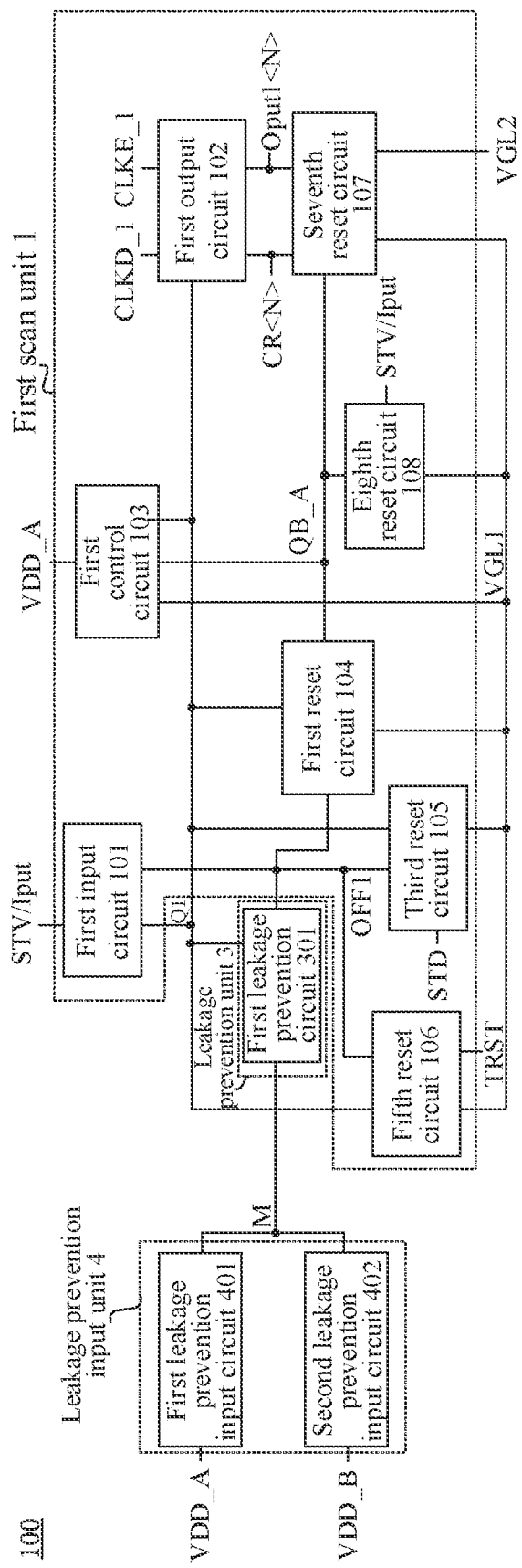
FIG. 10 is a structural diagram of yet another shift register, in accordance with some embodiments of the present disclosure.
Figure 11:
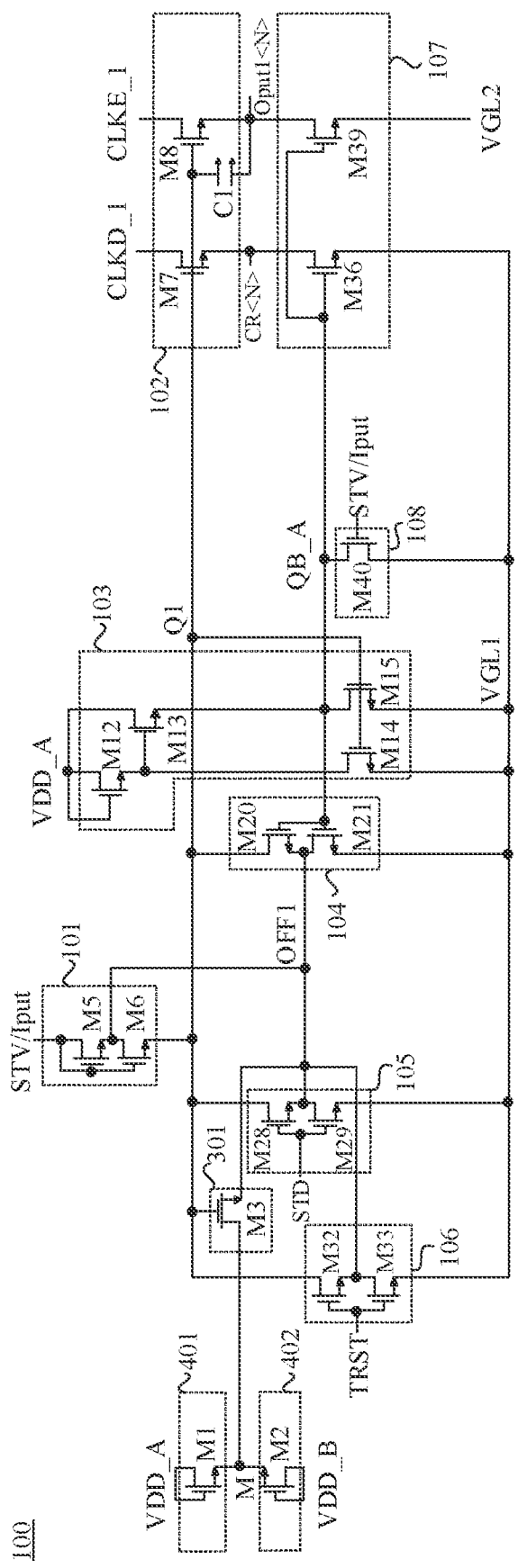
FIG. 11 is a circuit diagram of a shift register, in accordance with some embodiments of the present disclosure.
Figure 12:
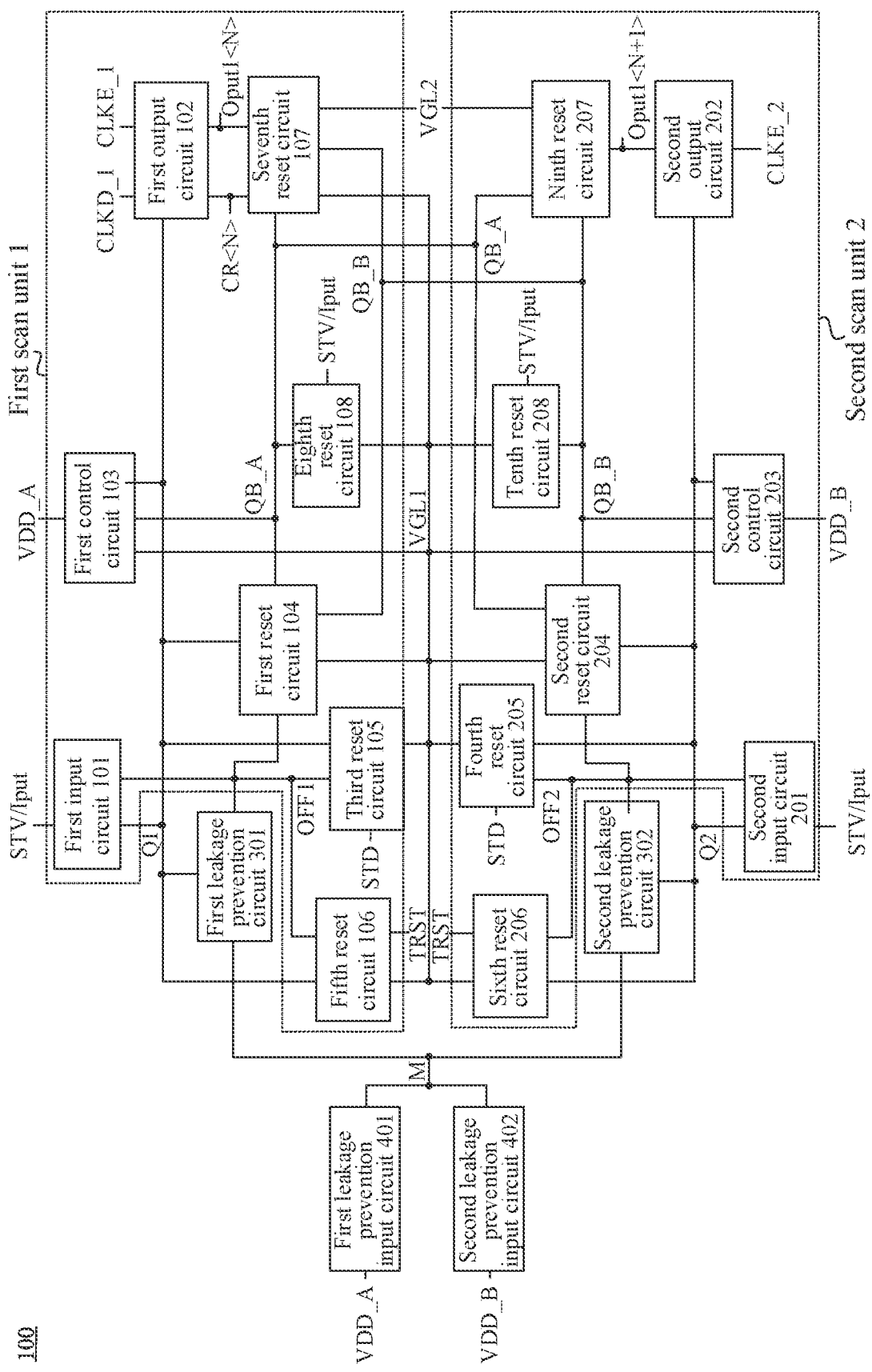
FIG. 12 is a structural diagram of yet another shift register, in accordance with some embodiments of the present disclosure.

In some examples, as shown in FIGS. 8 and 9, the second scan unit 2 includes a second input circuit 201 and a second output circuit 202 electrically connected to the second input circuit 201.

Based on this, for example, the first output circuit 102 in the first scan unit 1 in the shift register 100 may be electrically connected to a plurality of sub-pixels in an odd-numbered row through corresponding gate line(s) GL, and output the first scan signal to the plurality of sub-pixels in the odd-numbered row, so as to drive the sub-pixels in the odd-numbered row to display image(s). The second output circuit 202 in the second scan unit 2 may be electrically connected to a plurality of sub-pixels in an even-numbered row through corresponding gate line(s) GL, and output a second scan signal to the plurality of sub-pixels in the even-numbered row, so as to drive the sub-pixels in the even-numbered row to display image(s).

In some examples, as shown in FIGS. 8 and 9, the second input circuit 201 is electrically connected to an input signal terminal Iput, a second pull-up node Q2, and a second leakage prevention node OFF2. The second input circuit 201 is configured to, in response to an input signal received at the input signal terminal Iput, transmit the input signal to the second pull-up node Q2.

For example, in a case where a level of the input signal is a high level, the second input circuit 201 may be turned on due to an action of the input signal, and transmit the input signal to the second pull-up node Q2 to charge the second pull-up node Q2, so that a voltage of the second pull-up node Q2 is increased.

Here, the input signal terminal Iput electrically connected to the second input circuit 201 and the input signal terminal Iput electrically connected to the first input circuit 101 are the same input signal terminal Iput, and the input signals received by the two input signal terminals Iput are the same input signal. In the case where the level of the input signal transmitted by the input signal terminal Iput is a high level, the first input circuit 101 and the second input circuit 201 may receive the input signal synchronously, so that the first input circuit 101 and the second input circuit 201 are turned on synchronously, so as to charge the first pull-up node Q1 and the second pull-up node Q2 synchronously.

It will be noted that after the plurality of shift registers 100 are cascaded to form the gate driving circuit 1000, the shift signal terminal CR<N> in the first scan unit 1 in the N-th stage shift register 100 may be electrically connected to the input signal terminal Iput in the first scan unit 1 and the second scan unit 2 in the (N+1)-th stage shift register 100, and thus the shift signal output from the shift signal terminal CR<N> in the N-th stage shift register 100 serves as the input signal of the first scan unit 1 and the second scan unit 2 in the (N+1)-th stage shift register 100.

In some examples, as shown in FIGS. 8 and 9, the second output circuit 202 is electrically connected to the second pull-up node Q2, a third clock signal terminal CLKE_2, and a second scan signal terminal Output1<N+1> (Oput1<N+1> in the figures and in the following). The second output circuit 202 is configured to transmit a third clock signal received at the third clock signal terminal CLKE_2 to the second scan signal terminal Oput1<N+1> under a control of the voltage of the second pull-up node Q2.

For example, in a case where the second input circuit 201 charges the second pull-up node Q2 such that the voltage of the second pull-up node Q2 is increased, the second output circuit 202 may be turned on under a control of the voltage of the second pull-up node Q2, and output the third clock signal received at the third clock signal terminal CLKE_2 as the second scan signal from the second scan signal terminal Oput1<N+1>.

For example, in the display phase of the frame, the second scan signal output from the second output circuit 202 may drive sub-pixels in a corresponding row in the display panel PNL to display image(s).

It will be noted that in the case where the level of the input signal transmitted by the input signal terminal Iput is a low level such that the second input circuit 201 is turned off, and the voltage of the second pull-up node Q2 is maintained at a high level, the voltage of the second pull-up node Q2 is higher than the voltage of the input signal terminal Iput, and a large voltage difference is formed between the second pull-up node Q2 and the input signal terminal Iput.

In some examples, as shown in FIGS. 8 and 9, the leakage prevention unit 3 is further electrically connected to the second pull-up node Q2 and the second leakage prevention node OFF2. The leakage prevention unit 3 is further configured to transmit the first voltage signal or the second voltage signal from the leakage prevention input node M to the second leakage prevention node OFF2 under the control of the voltage of the second pull-up node Q2.

For example, in the case where the second input circuit 201 charges the second pull-up node Q2 such that the voltage of the second pull-up node Q2 is increased, the leakage prevention unit 3 may be turned on under the control of the voltage of the second pull-up node Q2, and transmit the first voltage signal or the second voltage signal received at the leakage prevention input node M to the second leakage prevention node OFF2, so that a voltage of the second leakage prevention node OFF2 is increased.

In a case where the leakage prevention unit 3 increases the voltage of the second leakage prevention node OFF2, the voltage of the second leakage prevention node OFF2 may be, for example, less than the voltage of the second pull-up node Q2, which may weaken a degree of the electric leakage of the second pull-up node Q2 through the second input circuit 201, so that the second pull-up node Q2 is able to be maintained at a high and stable voltage. Or, the voltage of the second leakage prevention node OFF2 may be, for example, equal to the voltage of the second pull-up node Q2, which may avoid the electric leakage of the second pull-up node Q2 through the second input circuit 201, so that the second pull-up node Q2 is maintained at a high and stable voltage.

Here, in an example where the level of the first voltage signal is a high level and the level of the second voltage signal is a low level, the operating processes of the leakage prevention unit 3 and the leakage prevention input unit 4 may be as follows. The leakage prevention input unit 4 is turned on due to the action of the first voltage signal, and transmits the first voltage signal to the leakage prevention input node M, so that the voltage of the leakage prevention input node M is increased. In a case where the leakage prevention unit 3 is turned on under the control of the voltage of the second pull-up node Q2, the leakage prevention unit 3 transmits the first voltage signal received at the leakage prevention input node M to the second leakage prevention node OFF2, so that the voltage of the second leakage prevention node OFF2 is increased.

The second leakage prevention node OFF2 in the second scan unit 2 is electrically connected to the leakage prevention unit 3, so that a leakage prevention protection of the second pull-up node Q2 may be realized by using the leakage prevention unit 3 and the leakage prevention input unit 4. In this way, not only the display device 2000 to which the shift register 100 is applied may have a good display effect, but also the use of the constant high voltage signal line for transmitting the constant high voltage signal may be avoided, so as to avoid the failure of the first voltage signal line or the second voltage signal line due to the electrochemical corrosion caused by the continuous transmission of the constant high voltage signal for a long time, thereby improving the reliability of the gate driving circuit 1000.

In some embodiments, as shown in FIG. 9, the leakage prevention unit 3 further includes a second leakage prevention circuit 302.

In some examples, as shown in FIG. 9 and FIGS. 12 to 17, the second leakage prevention unit 302 is electrically connected to the second pull-up node Q2, the leakage prevention input node M, and the second leakage prevention node OFF2. The second leakage prevention unit 302 is configured to transmit the first voltage signal or the second voltage signal from the leakage prevention input node M to the second leakage prevention node OFF2 under the control of the voltage of the second pull-up node Q2.

For example, in the case where the second input circuit 201 charges the second pull-up node Q2 such that the voltage of the second pull-up node Q2 is increased, the second leakage prevention unit 302 may be turned on under the control of the voltage of the second pull-up node Q2, and transmit the first voltage signal or the second voltage signal received at the leakage prevention input node M to the second leakage prevention node OFF2.

Here, in the case where the level of the first voltage signal is a high level and the level of the second voltage signal is a low level, the first voltage signal may be transmitted to the leakage prevention input node M through the leakage prevention input unit 4. In a case where the second leakage prevention circuit 302 is turned on, the second leakage prevention unit 302 may receive the first voltage signal at the leakage prevention input node M, and transmit the first voltage signal to the second leakage prevention node OFF2, so that the voltage of the second leakage prevention node OFF2 is increased to reduce a voltage difference between the second leakage prevention node OFF2 and the second pull-up node Q2.

In the case where the level of the first voltage signal is a low level and the level of the second voltage signal is a high level, the second voltage signal may be transmitted to the leakage prevention input node M through the leakage prevention input unit 4. In the case where the second leakage prevention circuit 302 is turned on, the second leakage prevention unit 302 may receive the second voltage signal at the leakage prevention input node M, and transmit the second voltage signal to the second leakage prevention node OFF2, so that the voltage of the second leakage prevention node OFF2 is increased to reduce the voltage difference between the second leakage prevention node OFF2 and the second pull-up node Q2.

A structure of the second leakage prevention circuit 302 included in the leakage prevention unit 3 will be schematically described below.

Figure 13:
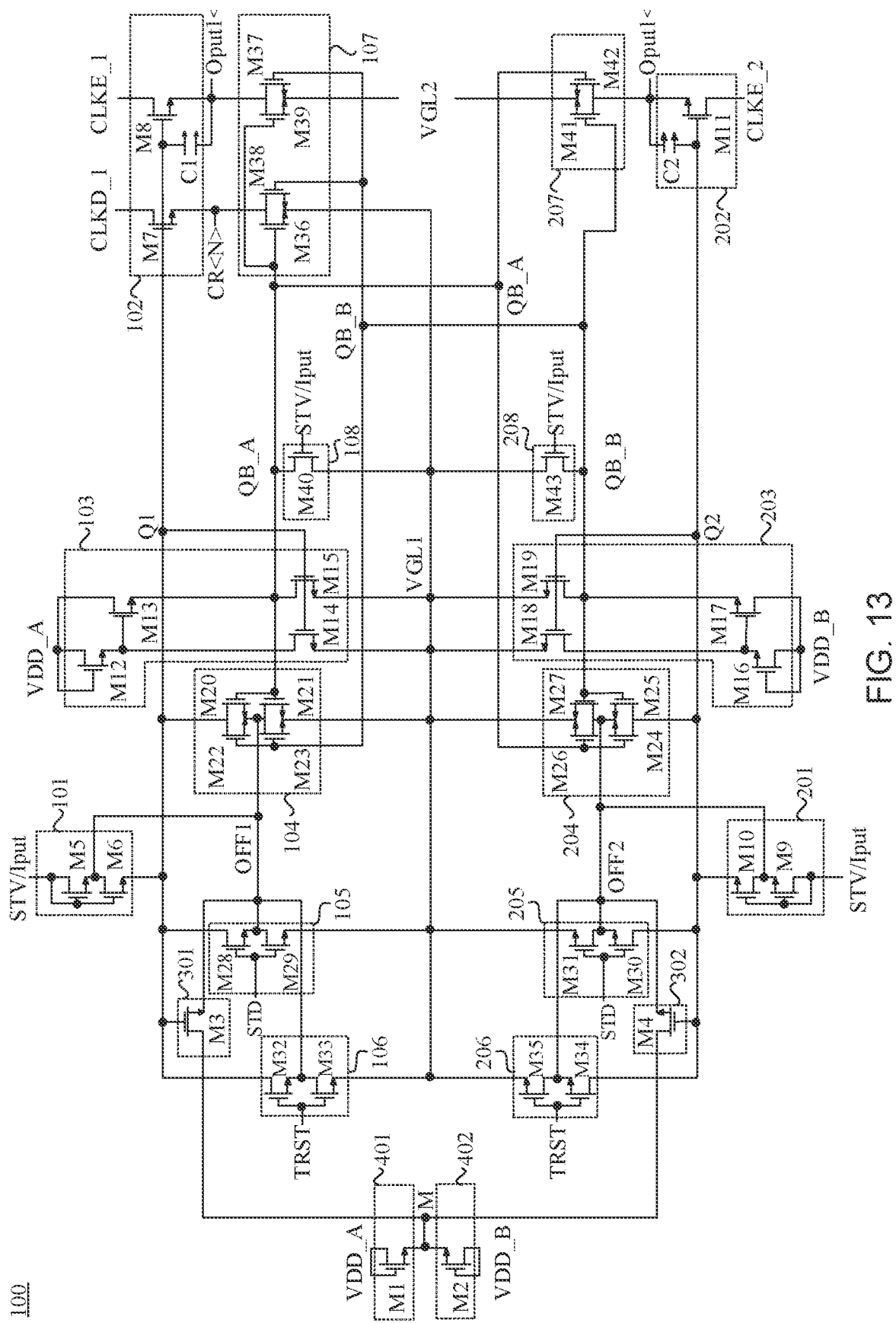
FIG. 13 is a circuit diagram of another shift register, in accordance with some embodiments of the present disclosure.
Figure 14:
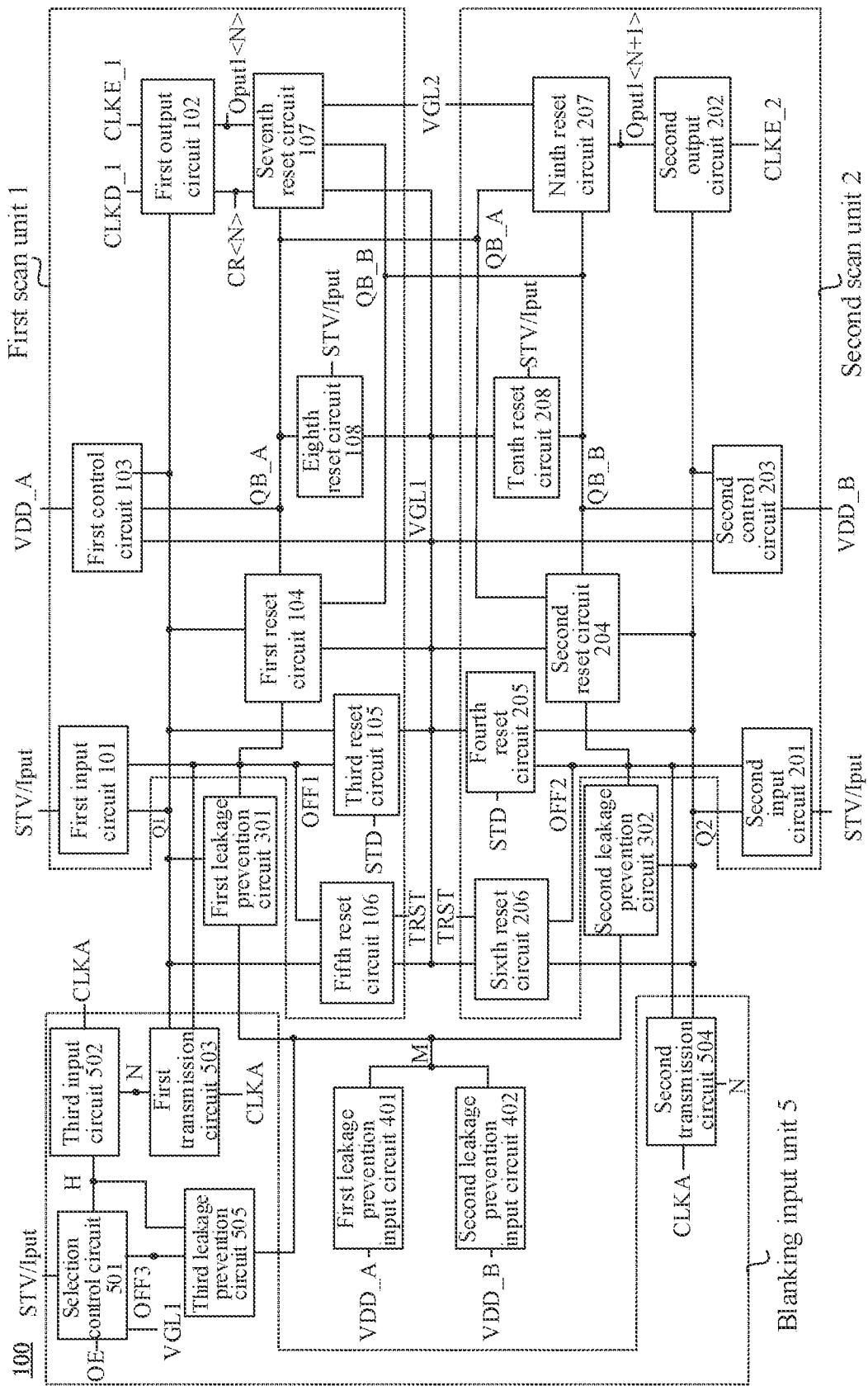
FIG. 14 is a structural diagram of yet another shift register, in accordance with some embodiments of the present disclosure.
Figure 15:
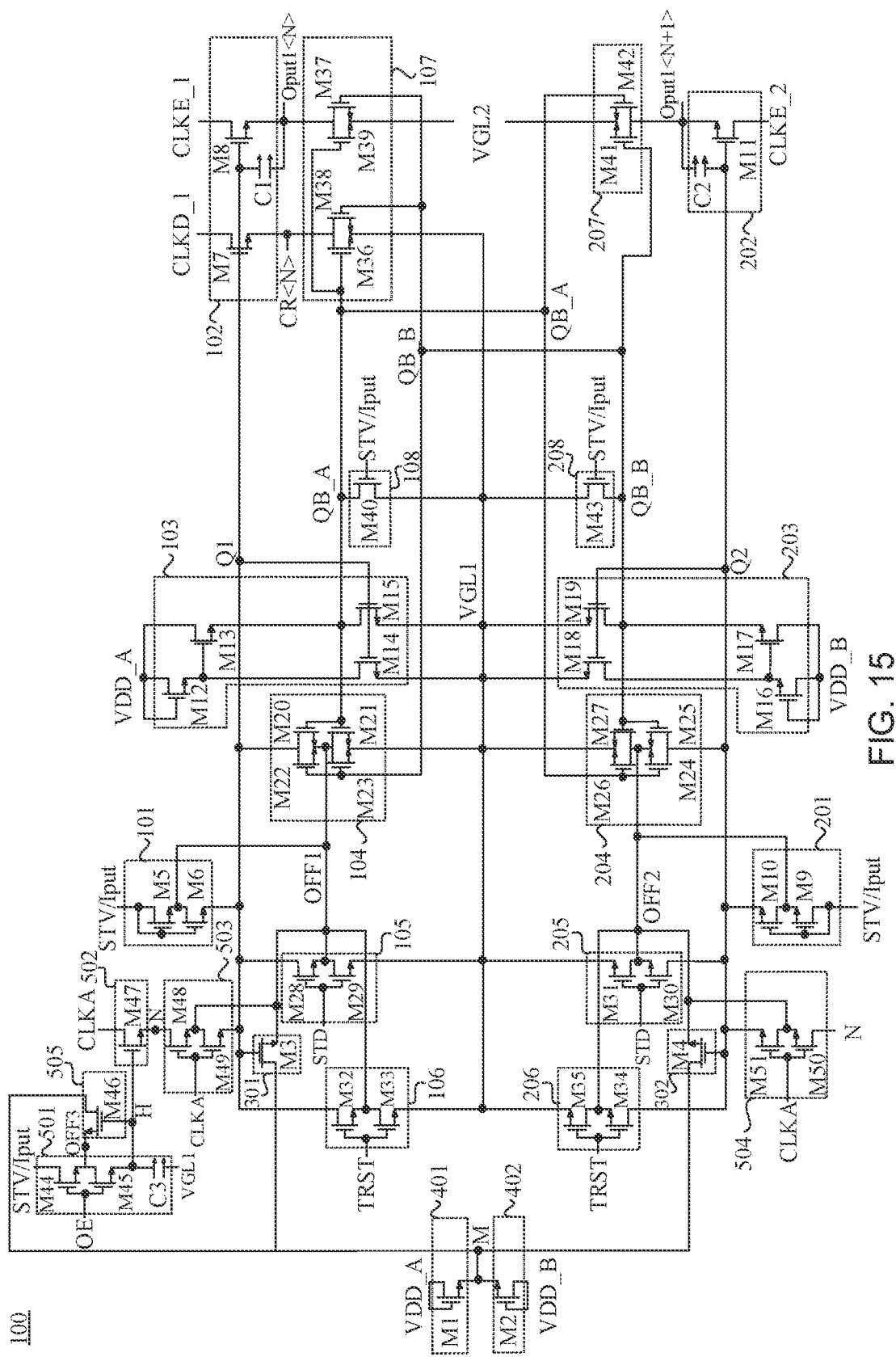
FIG. 15 is a circuit diagram of yet another shift register, in accordance with some embodiments of the present disclosure.
Figure 17:
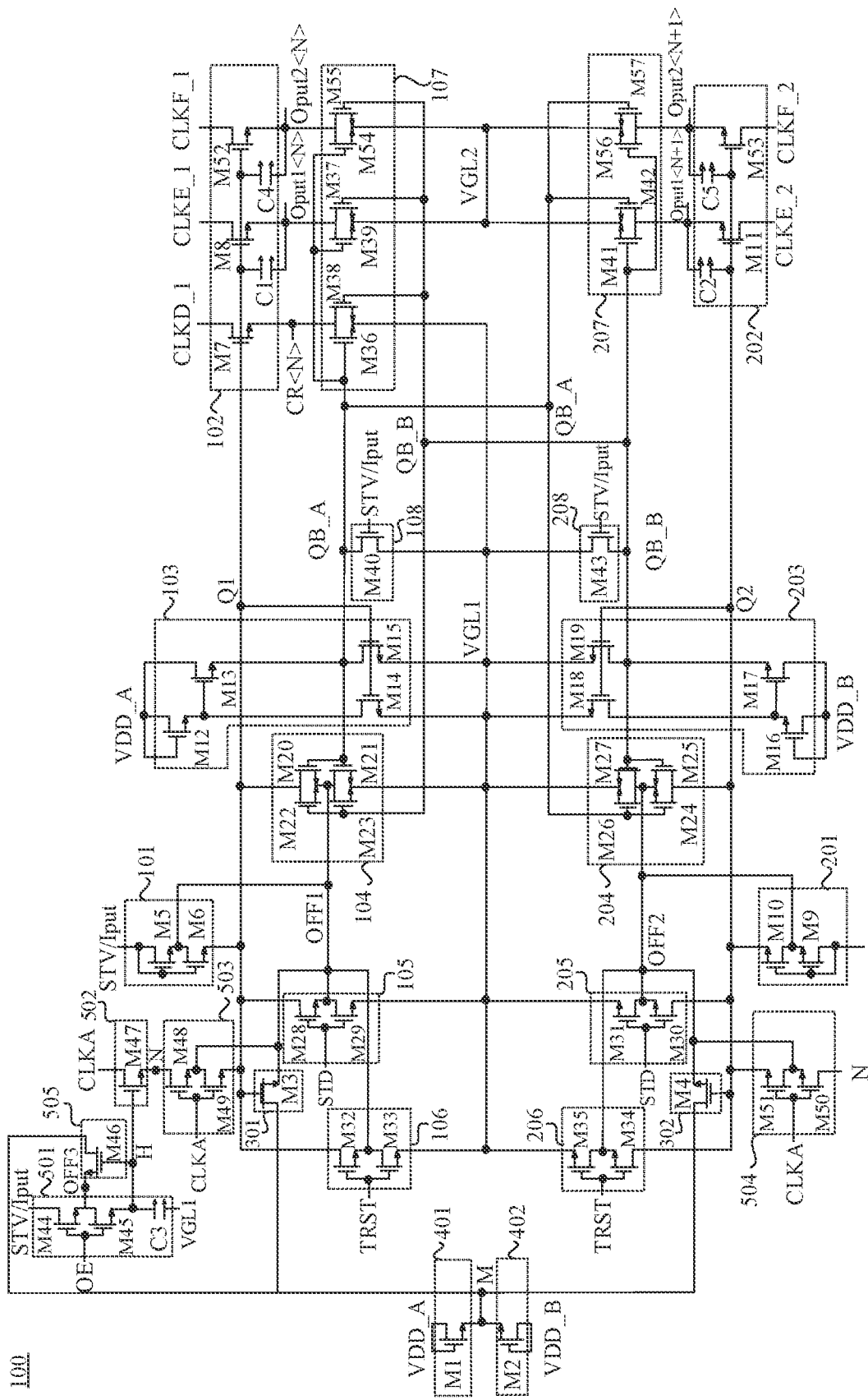
FIG. 17 is a circuit diagram of yet another shift register, in accordance with some embodiments of the present disclosure.

In some examples, as shown in FIGS. 13, 15 and 17, the second leakage prevention circuit 302 includes a fourth transistor M4.

For example, as shown in FIGS. 13, 15 and 17, a control electrode of the fourth transistor M4 is electrically connected to the second pull-up node Q2, a first electrode of the fourth transistor M4 is electrically connected to the leakage prevention input node M, and a second electrode of the fourth transistor M4 is electrically connected to the second leakage prevention node OFF2.

For example, in the case where the second input circuit 201 charges the second pull-up node Q2 such that the voltage of the second pull-up node Q2 is increased, the fourth transistor M4 may be turned on under the control of the voltage of the second pull-up node Q2, receive the first voltage signal or the second voltage signal from the leakage prevention input node M, and transmit the received first voltage signal or the second voltage signal to the second leakage prevention node OFF2.

Structures of the first input circuit 101 and the first output circuit 102 that are included in the first scan unit 1, and the second input circuit 201 and the second output circuit 202 that are included in the second scan unit 2 will be schematically described below.

In some examples, as shown in FIGS. 11, 13, 15 and 17, the first input circuit 101 may include a fifth transistor M5 and a sixth transistor M6.

For example, as shown in FIGS. 11, 13, 15 and 17, a control electrode of the fifth transistor M5 is electrically connected to the input signal terminal Iput, a first electrode of the fifth transistor M5 is electrically connected to the input signal terminal Iput, and a second electrode of the fifth transistor M5 is electrically connected to a first electrode of the sixth transistor M6 and the first leakage prevention node OFF1. The fifth transistor M5 is configured to be turned on under the control of the input signal transmitted by the input signal terminal Iput, and to transmit the input signal to the first electrode of the sixth transistor M6 and the first leakage prevention node OFF1.

For example, as shown in FIGS. 11, 13, 15 and 17, a control electrode of the sixth transistor M6 is electrically connected to the input signal terminal Iput, and a second electrode of the sixth transistor M6 is electrically connected to the first pull-up node Q1. The sixth transistor M6 is configured to be turned on under the control of the input signal transmitted by the input signal terminal Iput, and to transmit the input signal to the first pull-up node Q1.

For example, in the case where the level of the input signal transmitted by the input signal terminal Iput is a high level, the fifth transistor M5 and the sixth transistor M6 may be turned on synchronously due to the action of the input signal. The fifth transistor M5 may receive the input signal transmitted by the input signal terminal Iput, and transmit the received input signal to the first electrode of the sixth transistor M6 and the first leakage prevention node OFF1. The sixth transistor M6 may transmit the received input signal to the first pull-up node Q1 to charge the first pull-up node Q1, so that the voltage of the first pull-up node Q1 is increased.

Here, after the input signal the charges the first pull-up node Q1, the level of the input signal may change from a high level to a low level (the low level may be, for example, a level of the third voltage signal), and the fifth transistor M5 and the sixth transistor M6 may be turned off due to the action of the input signal (the level thereof is a low level), so that each of a voltage of the control electrode of the sixth transistor M6 and the voltage of the first leakage prevention node OFF1 is a low voltage (the low voltage is a voltage of the third voltage signal, which is lower than the voltage of the first pull-up node Q1). Since the voltage of the first pull-up node Q1 is increased, the first leakage prevention circuit 301 may be turned on under the control of the voltage of the first pull-up node Q1, and transmit the first voltage signal or the second voltage signal to the first leakage prevention node OFF1, so that the voltage of the first leakage prevention node OFF1 is increased. Thus, the voltage difference between the first leakage prevention node OFF1 and the first pull-up node Q1 is reduced, so that a voltage difference between the control electrode and the first electrode of the sixth transistor M6 is less than zero, ensuring that the sixth transistor M6 is completely or relatively completely turned off. In this way, the electric leakage of the first pull-up node Q1 through the first input circuit 101 may be avoided, so that the first pull-up node Q1 is able to be maintained at a high and stable voltage.

In some examples, as shown in FIGS. 11, 13, 15 and 17, the first output circuit 102 may include a seventh transistor M7, an eighth transistor M8, and a first capacitor C1.

For example, as shown in FIGS. 11, 13, 15 and 17, a control electrode of the seventh transistor M7 is electrically connected to the first pull-up node Q1, a first electrode of the seventh transistor M7 is electrically connected to the first clock signal terminal CLKD_1, and a second electrode of the seventh transistor M7 is electrically connected to the shift signal terminal CR<N>. The seventh transistor M7 is configured to be turned on under the control of the voltage of the first pull-up node Q1, and to transmit the first clock signal received at the first clock signal terminal CLKD_1 to the shift signal terminal CR<N>, so that the shift signal is output from the shift signal terminal CR<N>.

For example, in the case where the first input circuit 101 is turned on such that the voltage of the first pull-up node Q1 is increased, the seventh transistor M7 may be turned on under a control of the high voltage of the first pull-up node Q1, transmit the first clock signal to the shift signal terminal CR<N>, and output the first clock signal as the shift signal from the shift signal terminal CR<N>.

Since the first leakage prevention node OFF1 and the first leakage prevention circuit 301 electrically connected to the first leakage prevention node OFF1 are provided, the first pull-up node Q1 is able to be maintained at a high and stable voltage, so that the seventh transistor M7 may be turned on stably, and thus a deviation in the shift signal output by the seventh transistor M7 may be avoided.

For example, as shown in FIGS. 11, 13, 15 and 17, a control electrode of the eighth transistor M8 is electrically connected to the first pull-up node Q1, a first electrode of the eighth transistor M8 is electrically connected to the second clock signal terminal CLKE_1, and a second electrode of the eighth transistor M8 is electrically connected to the first scan signal terminal Oput1<N>. The eighth transistor M8 is configured to be turned on under the control of the voltage of the first pull-up node Q1, and to transmit the second clock signal received at the second clock signal terminal CLKE_1 to the first scan signal terminal Oput1<N>, so that the first scan signal is output from the first scan signal terminal Oput1<N>.

For example, in the case where the first input circuit 101 is turned on such that the voltage of the first pull-up node Q1 is increased, the eighth transistor M8 may be turned on under the control of the high voltage of the first pull-up node Q1, and transmit the second clock signal to the first scan signal terminal Oput1<N>, and output the second clock signal as the first scan signal from the first scan signal terminal Oput1<N>.

For example, as shown in FIGS. 11, 13, 15 and 17, a first terminal of the first capacitor C1 is electrically connected to the first pull-up node Q1, and a second terminal of the first capacitor C1 is electrically connected to the first scan signal terminal Oput1<N>.

For example, in the case where the first input circuit 101 is turned on, a high level signal may be transmitted to the first pull-up node Q1, so that the voltage of the first pull-up node Q1 is increased, and the first capacitor C1 may be charged synchronously. In the case where the first input circuit 101 is turned off, the first capacitor C1 may be discharged, so that the voltage of the first pull-up node Q1 is maintained at a high level, and thus the eighth transistor M8 is maintained in an on state.

Since the first leakage prevention node OFF1 and the first leakage prevention circuit 301 electrically connected to the first leakage prevention node OFF1 are provided, the first pull-up node Q1 is able to be maintained at a high and stable voltage, so that the eighth transistor M8 may be turned on stably, and thus a deviation in the first scan signal output by the eighth transistor M8 may be avoided.

In some examples, as shown in FIGS. 13, 15 and 17, the second input sub-circuit 201 may include a ninth transistor M9 and a tenth transistor M10.

For example, as shown in FIGS. 13, 15 and 17, a control electrode of the ninth transistor M9 is electrically connected to the input signal terminal Iput, a first electrode of the ninth transistor M9 is electrically connected to the input signal terminal Iput, and a second electrode of the ninth transistor M9 is electrically connected to a first electrode of the tenth transistor M10 and the second leakage prevention node OFF2. The ninth transistor M9 is configured to be turned on under the control of the input signal transmitted by the input signal terminal Iput, and to transmit the input signal to the first electrode of the tenth transistor M10 and the second leakage prevention node OFF2.

For example, as shown in FIGS. 13, 15 and 17, a control electrode of the tenth transistor M10 is electrically connected to the input signal terminal Iput, and a second electrode of the tenth transistor M10 is electrically connected to the second pull-up node Q2. The tenth transistor M10 is configured to be turned on under the control of the input signal transmitted by the input signal terminal Iput, and to transmit the input signal to the second pull-up node Q2.

Here, in the case where the level of the input signal transmitted by the input signal terminal Iput is a high level, the ninth transistor M9 and the tenth transistor M10 may be turned on synchronously due to the action of the input signal. The ninth transistor M9 may receive the input signal transmitted by the input signal terminal Iput, and transmit the received input signal to the first electrode of the tenth transistor M10 and the second leakage prevention node OFF2. The tenth transistor M10 may transmit the received input signal to the second pull-up node Q2 to charge the second pull-up node Q2, so that the voltage of the second pull-up node Q2 is increased.

Here, after the input signal charges the second pull-up node Q2, the level of the input signal may change from a high level to a low level (the low level may be, for example, the level of the third voltage signal), and the ninth transistor M9 and the tenth transistor M10 may be turned off due to the action of the input signal (the level thereof is a low level), so that each of a voltage of the control electrode of the tenth transistor M10 and the voltage of the second leakage prevention node OFF2 is a low voltage (the low voltage is the voltage of the third voltage signal, which is lower than the voltage of the second pull-up node Q2). Since the voltage of the second pull-up node Q2 is increased, the second leakage prevention circuit 302 may be turned on under the control of the voltage of the second pull-up node Q2, and transmit the first voltage signal or the second voltage signal to the second leakage prevention node OFF2, so that the voltage of the second leakage prevention node OFF2 is increased. Thus, the voltage difference between the second leakage prevention node OFF2 and the second pull-up node Q2 is reduced, so that a voltage difference between the control electrode and the first electrode of the tenth transistor M10 is less than zero, ensuring that the tenth transistor M10 is completely or relatively completely turned off. In this way, the electric leakage of the second pull-up node Q2 through the second input circuit 201 may be avoided, so that the second pull-up node Q2 is able to be maintained at a high and stable voltage.

In some examples, as shown in FIGS. 13, 15 and 17, the second output circuit 202 may include an eleventh transistor M11 and a second capacitor C2.

For example, as shown in FIGS. 13, 15 and 17, a control electrode of the eleventh transistor M11 is electrically connected to the second pull-up node Q2, a first electrode of the eleventh transistor M11 is electrically connected to the third clock signal terminal CLKE_2, and a second electrode of the eleventh transistor M11 is electrically connected to the second scan signal terminal Oput1<N+1>. The eleventh transistor M11 is configured to be turned on under the control of the voltage of the second pull-up node Q2, and to transmit the third clock signal received at the third clock signal terminal CLKE_2 to the second scan signal terminal Oput1<N+1>, so that the second scan signal is output from the second scan signal terminal Oput1<N+1>.

For example, in the case where the second input circuit 201 is turned on such that the voltage of the second pull-up node Q2 is increased, the eleventh transistor M11 may be turned on under a control of the high voltage of the second pull-up node Q2, transmit the third clock signal to the second scan signal terminal Oput1<N+1>, and output the third clock signal as the second scan signal from the second scan signal terminal Oput1<N+1>.

For example, as shown in FIGS. 13, 15 and 17, a first terminal of the second capacitor C2 is electrically connected to the second pull-up node Q2, and a second terminal of the second capacitor C2 is electrically connected to the second scan signal terminal Oput1<N+1>.

For example, in the case where the second input circuit 201 is turned on, a high level signal may be transmitted to the second pull-up node Q2, so that the voltage of the second pull-up node Q2 is increased, and the second capacitor C2 may be charged synchronously. In the case where the second input circuit 201 is turned off, the second capacitor C2 may be discharged, so that the voltage of the second pull-up node Q2 is maintained at a high level, and thus the eleventh transistor M11 is maintained in the on state.

Since the second leakage prevention node OFF2 and the second leakage prevention circuit 302 electrically connected to the second leakage prevention node OFF2 are provided, the second pull-up node Q2 is able to be maintained at a high and stable voltage, so that the eleventh transistor M11 may be turned on stably, and thus a deviation in the second scan signal output by the eleventh transistor M11 may be avoided.

Figure 16:
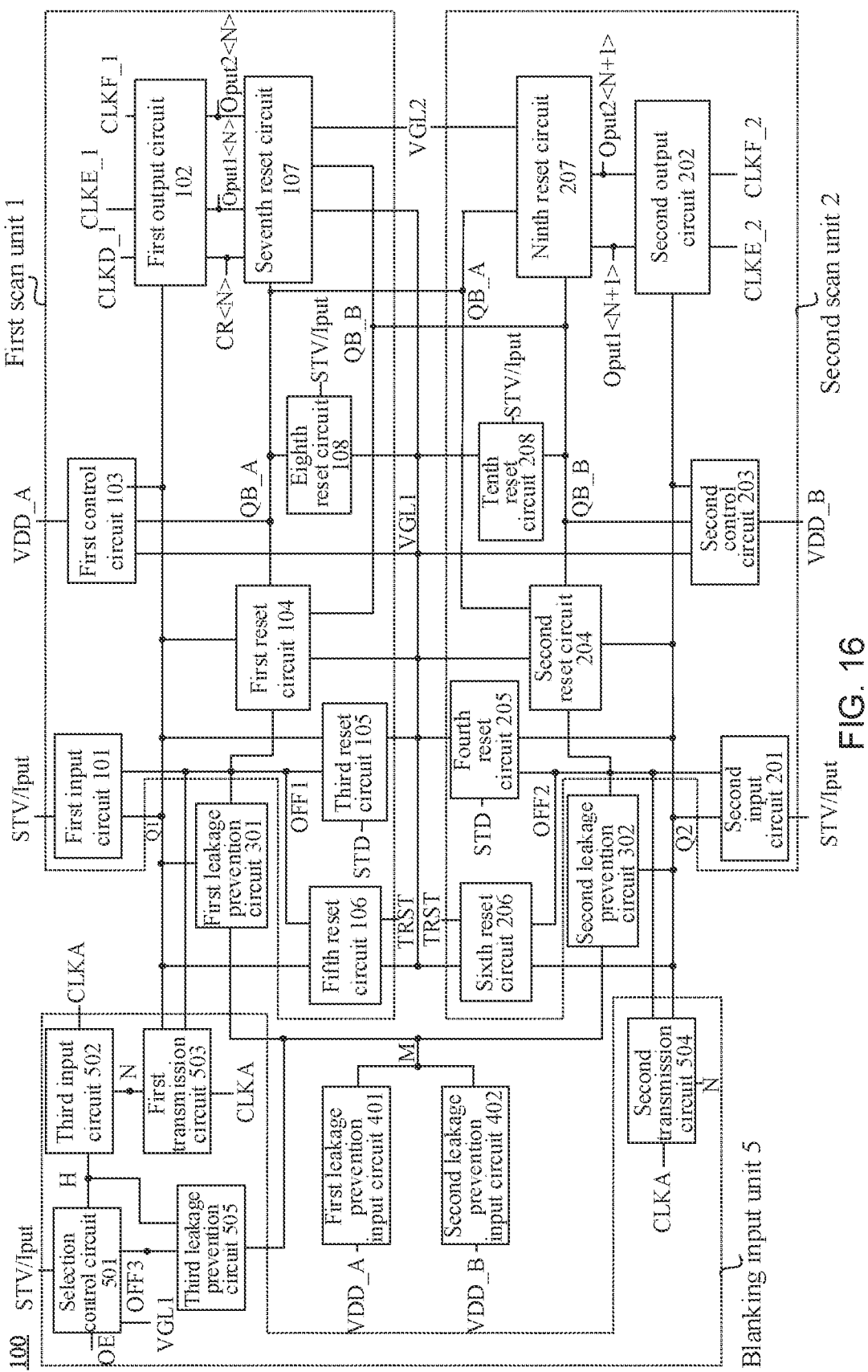
FIG. 16 is a structural diagram of yet another shift register, in accordance with some embodiments of the present disclosure.

In some embodiments, as shown in FIGS. 16 and 17, the first output circuit 102 is further electrically connected to a fifth clock signal terminal CLKF_1 and a first sensing signal terminal Output2<N> (Oput2<N> in the figures and in the following). The first output circuit 102 is further configured to transmit a fifth clock signal received at the fifth clock signal terminal CLKF_1 to the first sensing signal terminal Oput2<N> under the control of the voltage of the first pull-up node Q1.

For example, in a case where the voltage of the first pull-up node Q1 is at a high level, the first output circuit 102 may be turned on under the control of the voltage of the first pull-up node Q1, and output the fifth clock signal received at the fifth clock signal terminal CLKF_1 as a first sensing signal from the first sensing signal terminal Oput2<N>.

In some embodiments, as shown in FIGS. 16 and 17, the second output circuit 202 is further electrically connected to a sixth clock signal terminal CLKF_2 and a second sensing signal terminal Output2<N+1> (Oput2<N+1> in the figures and in the following). The second output circuit 202 is further configured to transmit a sixth clock signal received at the sixth clock signal terminal CLKF_2 to the second sensing signal terminal Oput2<N+1> under the control of the voltage of the second pull-up node Q2.

For example, in a case where the voltage of the second pull-up node Q2 is at a high level, the second output circuit 202 may be turned on under the control of the voltage of the second pull-up node Q2, and output the sixth clock signal received at the sixth clock signal terminal CLKF_2 as a second sensing signal from the second sensing signal terminal Oput2<N+1>.

It will be noted that the display phase of the frame includes a display period and a blanking period that are sequentially performed.

For example, in the display period in the display phase of the frame, the first input circuit 101 increases the voltage of the first pull-up node Q1, and the second input circuit 201 increases the voltage of the second pull-up node Q2. The first scan signal and the first sensing signal that are output from the first output circuit 102 may cooperate with each other to drive sub-pixels in a corresponding row in the display panel PNL to display image(s). The second scan signal and the second sensing signal that are output from the second output circuit 202 may cooperate with each other to drive sub-pixels in a corresponding row in the display panel PNL to display image(s).

For example, in the blanking period in the display phase of the frame, a blanking input unit 5 increases both the voltage of the first pull-up node Q1 and the voltage of the second pull-up node Q2. The first scan signal and the first sensing signal that are output from the first output circuit 102 may cooperate with each other to drive to sub-pixels in a corresponding row in the display panel PNL to be externally compensated. The second scan signal and the second sensing signal that are output from the second output circuit 202 may cooperate with each other to sub-pixels in a corresponding row in the display panel PNL to be externally compensated.

In a case where the first output circuit 102 is not electrically connected to the first sensing signal terminal Oput2<N>, and the second output circuit 202 is not connected to the second sensing signal terminal Oput2<N+1>, both the first scan signal and the second scan signal may drive sub-pixels in a corresponding row in the display panel PNL to display image(s) in the display period in the display phase of the frame, and drive sub-pixels in a corresponding row in the display panel PNL to be externally compensated in the blanking period in the display phase of the frame.

A description of the blanking input unit 5 may refer to a relevant description below, and will not be repeated here.

Based on this, in some examples, as shown in FIG. 17, the first output circuit 102 further includes a fifty-second transistor M52 and a fourth capacitor C4.

For example, as shown in FIG. 17, a control electrode of the fifty-second transistor M52 is electrically connected to the first pull-up node Q1, a first electrode of the fifty-second transistor M52 is electrically connected to the fifth clock signal terminal CLKF_1, and a second electrode of the fifty-second transistor M52 is electrically connected to the first sensing signal terminal Oput2<N>. The fifty-second transistor M52 is configured to be turned on under the control of the voltage of the first pull-up node Q1, and to transmit the fifth clock signal received at the fifth clock signal terminal CLKF_1 to the first sensing signal terminal Oput2<N>, so that the first sensing signal is output from the first sensing signal terminal Oput2<N>.

For example, in the display period in the display phase of the frame, in the case where the first input circuit 101 is turned on such that the voltage of the first pull-up node Q1 is increased, the fifty-second transistor M52 may be turned on under the control of the high voltage of the first pull-up node Q1, transmit the fifth clock signal to the first sensing signal terminal Oput2<N>, and output the fifth clock signal as the first sensing signal from the first sensing signal terminal Oput2<N>. In the blanking period in the display phase of the frame, in a case where the blanking input unit 5 increases the voltage of the first pull-up node Q1, the fifty-second transistor M52 may be turned on under the control of the high voltage of the first pull-up node Q1, transmit the fifth clock signal to the first sensing signal terminal Oput2<N>, and output the fifth clock signal as the first sensing signal from the first sensing signal terminal Oput2<N>.

For example, as shown in FIG. 17, a first terminal of the fourth capacitor C4 is electrically connected to the first pull-up node Q1, and a second terminal of the fourth capacitor C4 is electrically connected to the first sensing signal terminal Oput2<N>.

For example, in the display period in the display phase of the frame, in the case where the first input circuit 101 is turned on, a high level signal may be transmitted to the first pull-up node Q1, so that the voltage of the first pull-up node Q1 is increased, and the fourth capacitor C4 may be charged synchronously. In the case where the first input circuit 101 is turned off, the fourth capacitor C4 may be discharged, so that the voltage of the first pull-up node Q1 is maintained at a high level, and thus the fifty-second transistor M52 is maintained in the on state. For example, in the blanking period in the display phase of the frame, in the case where the blanking input unit 5 increases the voltage of the first pull-up node Q1, the fourth capacitor C4 may be charged synchronously. In this way, in a case where the blanking input unit 5 is turned off, the fourth capacitor C4 may be discharged, so that the voltage of the first pull-up node Q1 is maintained at a high level, and thus the fifty-second transistor M52 is maintained in the on state.

Since the first leakage prevention node OFF1 and the first leakage prevention circuit 301 electrically connected to the first leakage prevention node OFF1 are provided, the first pull-up node Q1 is able to be maintained at a high and stable voltage, so that the fifty-second transistor M52 may be turned on stably, and thus a deviation in the first sensing signal output by the fifty-second transistor M52 may be avoided.

In some examples, as shown in FIGS. 17, the second output circuit 202 further includes a fifty-third transistor M53 and a fifth capacitor C5.

For example, as shown in FIG. 17, a control electrode of the fifty-third transistor M53 is electrically connected to the second pull-up node Q2, a first electrode of the fifty-third transistor M53 is electrically connected to the sixth clock signal terminal CLKF_2, and a second electrode of the fifty-third transistor M53 is electrically connected to the second sensing signal terminal Oput2<N+1>. The fifty-third transistor M53 is configured to be turned on under the control of the voltage of the second pull-up node Q2, and to transmit the sixth clock signal received at the sixth clock signal terminal CLKF_2 to the second sensing signal terminal Oput2<N+1>, so that the second sensing signal is output from the second sensing signal terminal Oput2<N+1>.

For example, in the display period in the display phase of the frame, in the case where the second input circuit 201 is turned on such that the voltage of the second pull-up node Q2 is increased, the fifty-third transistor M53 may be turned on under the control of the high voltage of the second pull-up node Q2, transmit the sixth clock signal to the second sensing signal terminal Oput2<N+1>, and output the sixth clock signal as the second sensing signal from the second sensing signal terminal Oput2<N+1>. In the blanking period in the display phase of the frame, in a case where the blanking input circuit 5 increases the voltage of the second pull-up node Q2, the fifty-third transistor M53 may be turned on under the control of the high voltage of the second pull-up node Q2, transmit the sixth clock signal to the second sensing signal terminal Oput2<N+1>, and output the sixth clock signal as the second sensing signal from the second sensing signal terminal Oput2<N+1>.

For example, as shown in FIG. 17, a first terminal of the fifth capacitor C5 is electrically connected to the second pull-up node Q2, and a second terminal of the fifth capacitor C5 is electrically connected to the second sensing signal terminal Oput2<N+1>.

For example, in the display period in the display phase of the frame, in the case where the second input circuit 201 is turned on, a high level signal may be transmitted to the second pull-up node Q2, so that the voltage of the second pull-up node Q2 is increased, and the fifth capacitor C5 may be charged synchronously. In the case where the second input circuit 201 is turned off, the fifth capacitor C5 may be discharged, so that the voltage of the second pull-up node Q2 is maintained at a high level, and thus the fifty-third transistor M53 is maintained in the on state. In the blanking period in the display phase of the frame, in the case where the blanking input unit 5 increases the voltage of the second pull-up node Q2, the fifth capacitor C5 may be charged synchronously. In this way, in the case where the blanking input unit 5 is turned off, the fifth capacitor C5 may be discharged, so that the voltage of the second pull-up node Q2 is maintained at a high level, and thus the fifty-third transistor M53 is maintained in the on state.

Since the second leakage prevention node OFF2 and the second leakage prevention circuit 302 electrically connected to the second leakage prevention node OFF2 are provided, the second pull-up node Q2 is able to be maintained at a high and stable voltage, so that the fifty-third transistor M53 may be turned on stably, and thus a deviation in the second sensing signal output by the fifty-third transistor M53 may be avoided.

In some embodiments, as shown in FIGS. 10 to 17, the first scan unit 1 may further include a first control circuit 103. As shown in FIGS. 12 to 17, in a case where the shift register 100 further includes the second scan unit 2, the second scan unit 2 may further include a second control circuit 203.

In some examples, as shown in FIGS. 10 to 17, the first control circuit 103 is electrically connected to the first pull-up node Q1, the first voltage signal terminal VDD_A, a first pull-down node QB_A, and a third voltage signal terminal VGL1. The first control circuit 103 is configured to control a voltage of the first pull-down node QB_A under a control of the voltage of the first pull-up node Q1 and the first voltage signal transmitted by the first voltage signal terminal VDD_A or a control of the voltage of the first pull-up node Q1 and a third voltage signal transmitted by the third voltage signal terminal VGL1.

Here, the third voltage signal terminal VGL1 may be configured to transmit a direct current low level signal (e.g., lower than or equal to a low level section of a clock signal). For example, the third voltage signal terminal VGL1 is grounded.

For example, in the case where the first input circuit 101 is turned on such that the voltage of the first pull-up node Q1 is increased, the first control circuit 103 may transmit the third voltage signal transmitted by the third voltage signal terminal VGL1 to the first pull-down node QB_A, so as to pull down the voltage of the first pull-down node QB_A to be at a low level. In the case where the first input circuit 101 is turned off such that the voltage of the first pull-up node Q1 is at a low level, the first control circuit 103 may transmit the first voltage signal transmitted by the first voltage signal terminal VDD_A to the first pull-down node QB_A, so as to pull the voltage of the first pull-down node QB_A up to be at a high level.

In some examples, as shown in FIGS. 12 to 17, the second control circuit 203 is electrically connected to the second pull-up node Q2, the second voltage signal terminal VDD_B, a second pull-down node QB_B, and the third voltage signal terminal VGL1. The second control circuit 203 is configured to control a voltage of the second pull-down node QB_B under a control of the voltage of the second pull-up node Q2 and the second voltage signal transmitted by the second voltage signal terminal VDD_B or a control of the voltage of the second pull-up node Q2 and the third voltage signal transmitted by the third voltage signal terminal VGL1.

For example, in the case where the second input circuit 201 is turned on such that the voltage of the second pull-up node Q2 is increased, the second control circuit 203 may transmit the third voltage signal transmitted by the third voltage signal terminal VGL1 to the second pull-down node QB_B, so as to pull down the voltage of the second pull-down node QB_A to be at a low level. In the case where the second input circuit 201 is turned off such that the voltage of the second pull-up node Q2 is at a low level, the second control circuit 203 may transmit the second voltage signal transmitted by the second voltage signal terminal VDD_B to the second pull-down node QB_B, so as to pull the voltage of the second pull-down node QB_B up to be at a high level.

Structures of the first control circuit 103 included in the first scan unit 1 and the second control circuit 203 included in the second scan unit 2 will be schematically described below.

In some examples, as shown in FIGS. 11, 13, 15 and 17, the first control circuit includes a twelfth transistor M12, a thirteenth transistor M13, a fourteenth transistor M14, and a fifteenth transistor M15.

For example, as shown in FIGS. 11, 13, 15 and 17, a control electrode of the twelfth transistor M12 is electrically connected to the first voltage signal terminal VDD_A, a first electrode of the twelfth transistor M12 is electrically connected to the first voltage signal terminal VDD_A, and a second electrode of the twelfth transistor M12 is electrically connected to a control electrode of the thirteenth transistor M13 and a first electrode of the fourteenth transistor M14.

For example, in the case where the level of the first voltage signal transmitted by the first voltage signal terminal VDD_A is a high level, the twelfth transistor M12 may be turned on due to the action of the first voltage signal, receive the first voltage signal, and transmit the received first voltage signal to the control electrode of the thirteenth transistor M13 and the first electrode of the fourteenth transistor M14. The thirteenth transistor M13 may be turned on due to the action of the first voltage signal.

For example, as shown in FIGS. 11, 13, 15 and 17, a first electrode of the thirteenth transistor M13 is electrically connected to the first voltage signal terminal VDD_A, and a second electrode of the thirteenth transistor M13 is electrically connected to the first pull-down node QB_A and a first electrode of the fifteenth transistor M15.

For example, after the twelfth transistor M12 is turned on, and transmits the first voltage signal to the control electrode of the thirteenth transistor M13, the thirteenth transistor M13 may be turned on due to the action of the first voltage signal, receive the first voltage signal, and transmit the received first voltage signal to the first pull-down node QB_A and the first electrode of the fifteenth transistor M15.

For example, as shown in FIGS. 11, 13, 15 and 17, a control electrode of the fourteenth transistor M14 is electrically connected to the first pull-up node Q1, and a second electrode of the fourteenth transistor M14 is electrically connected to the third voltage signal terminal VGL1. A control electrode of the fifteenth transistor M15 is electrically connected to the first pull-up node Q1, and a second electrode of the fifteenth transistor M15 is electrically connected to the third voltage signal terminal VGL1.

For example, in the case where the voltage of the first pull-up node Q1 is at a high level, the fourteenth transistor M14 and the fifteenth transistor M15 may be turned on under the control of the voltage of the first pull-up node Q1. The fourteenth transistor M14 may transmit the third voltage signal transmitted by the third voltage signal terminal VGL1 to the control electrode of the thirteenth transistor M13, so that the thirteenth transistor M13 is turned off. The fifteenth transistor M15 may transmit the third voltage signal transmitted by the third voltage signal terminal VGL1 to the first pull-down node QB_A to pull down the voltage of the first pull-down node QB_A to be at a low level.

In the case where the voltage of the first pull-up node Q1 is at a low level, the fourteenth transistor M14 and the fifteenth transistor M15 may be turned off under the control of the voltage of the first pull-up node Q1, and the thirteenth transistor M13 may transmit the received first voltage signal to the first pull-down node QB_A to pull the voltage of the first pull-down node QB_A up to be at a high level.

In some examples, as shown in FIGS. 13, 15 and 17, the second control circuit 203 includes a sixteenth transistor M16, a seventeenth transistor M17, an eighteenth transistor M18, and a nineteenth transistor M19.

For example, as shown in FIGS. 13, 15 and 17, a control electrode of the sixteenth transistor M16 is electrically connected to the second voltage signal terminal VDD_B, a first electrode of the sixteenth transistor M16 is electrically connected to the second voltage signal terminal VDD_B, and a second electrode of the sixteenth transistor M16 is electrically connected to a control electrode of the seventeenth transistor M17 and a first electrode of the eighteenth transistor M18.

For example, in the case where the level of the second voltage signal transmitted by the second voltage signal terminal VDD_B is a high level, the sixteenth transistor M16 may be turned on due to the action of the second voltage signal, receive the second voltage signal, and transmit the received second voltage signal to the control electrode of the seventeenth transistor M17 and the first electrode of the eighteenth transistor M18. The seventeenth transistor M17 may be turned on due to the action of the second voltage signal.

For example, as shown in FIGS. 13, 15 and 17, a first electrode of the seventeenth transistor M17 is electrically connected to the second voltage signal terminal VDD_B, and a second electrode of the seventeenth transistor M17 is electrically connected to the second pull-down node QB_B and a first electrode of the nineteenth transistor M19.

For example, after the sixteenth transistor M16 is turned on, and transmits the second voltage signal to the control electrode of the seventeenth transistor M17, the seventeenth transistor M17 may be turned on due to the action of the second voltage signal, receive the second voltage signal, and transmit the received second voltage signal to the second pull-down node QB_B and the first electrode of the nineteenth transistor M19.

For example, as shown in FIGS. 13, 15 and 17, a control electrode of the eighteenth transistor M18 is electrically connected to the second pull-up node Q2, and a second electrode of the eighteenth transistor M18 is electrically connected to the third voltage signal terminal VGL1. A control electrode of the nineteenth transistor M19 is electrically connected to the second pull-up node Q2, and a second electrode of the nineteenth transistor M19 is electrically connected to the third voltage signal terminal VGL1.

For example, in the case where the voltage of the second pull-up node Q2 is at a high level, the eighteenth transistor M18 and the nineteenth transistor M19 may be turned on under the control of the voltage of the second pull-up node Q2. The eighteenth transistor M18 may transmit the third voltage signal transmitted by the third voltage signal terminal VGL1 to the control electrode of the seventeenth transistor M17, so that the seventeenth transistor M17 is turned off. The nineteenth transistor M19 may transmit the third voltage signal transmitted by the third voltage signal terminal VGL1 to the second pull-down node QB_B to pull down the voltage of the second pull-down node QB_B to be at a low level.

In the case where the voltage of the second pull-up node Q2 is at a low level, the eighteenth transistor M18 and the nineteenth transistor M19 may be turned off under the control of the voltage of the second pull-up node Q2, and the seventeenth transistor M17 may transmit the received second voltage signal to the second pull-down node QB_B to pull the voltage of the second pull-down node QB_B up to be at a high level.

It will be noted that the first voltage signal transmitted by the first voltage signal terminal VDD_A and the second voltage signal transmitted by the second voltage signal terminal VDD_B are the inverted signals. Therefore, in the display phase of the frame, if the level of the first voltage signal is a high level and the level of the second voltage signal is a low level, the twelfth transistor M12 is maintained in the on state, and the voltages of the first pull-up node Q1 and the first pull-down node QB_A are a group of inverted voltages due to an action of the transistors included in the first control circuit 103. Moreover, the sixteenth transistor M16 and the seventeenth transistor M17 are each maintained in an off state, and in a case where the voltage of the second pull-up node Q2 is at a high level or a low level, the voltage of the second pull-down node QB_B is at a low level. In the display phase of the frame, if the level of the first voltage signal is a low level and the level of the second voltage signal is a high level, the twelfth transistor M12 and the thirteenth transistor M13 are each maintained in the off state, and in a case where the voltage of the first pull-up node Q1 is at a high level or a low level, the voltage of the first pull-down node QB_A is at a low level. Moreover, the sixteenth transistor M16 is maintained in the on state, and the voltages of the second pull-up node Q2 and the second pull-down node QB_B are a group of inverted voltages due to an action of the transistors included in the second control circuit 203.

In display phases of different frames, the first control circuit 103 and the second control circuit 203 operate alternately.

In some embodiments, as shown in FIGS. 10 to 17, the first scan unit 1 may further include a first reset circuit 104. As shown in FIGS. 12 to 17, the second scan unit 2 may further include a second reset circuit 204.

In some examples, as shown in FIGS. 10 to 17, the first reset circuit 104 is electrically connected to the first pull-down node QB_A, the first pull-up node Q1, the third voltage signal terminal VGL1, and the first leakage prevention node OFF1. The first reset circuit 104 is configured to reset the first pull-up node Q1 under a control of the voltage of the first pull-down node QB_A.

In the case where the shift register 100 further includes the second scan unit 2, the first reset circuit 104 is further electrically connected to the second pull-down node QB_B. The first reset circuit 104 is further configured to reset the first pull-up node Q1 under a control of the voltage of the second pull-down node QB_B.

For example, in a case where the voltage of the first pull-down node QB_A is at a high level, the first reset circuit 104 may be turned on due to an action of the voltage of the first pull-down node QB_A, and transmit the third voltage signal transmitted by the third voltage signal terminal VGL1 to the first pull-up node Q1, so as to pull down the voltage of the first pull-up node Q1 to reset the first pull-up node Q1. In a case where the voltage of the second pull-down node QB_B is at a high level, the first reset circuit 104 may be turned on due to an action of the voltage of the second pull-down node QB_B, and transmit the third voltage signal transmitted by the third voltage signal terminal VGL1 to the first pull-up node Q1, so as to pull down the voltage of the first pull-up node Q1 to reset the first pull-up node Q1.

Here, in a case where the voltage of the first pull-up node Q1 is at a high level, and the first reset circuit 104 is in an inoperative state, the first pull-up node Q1 and the third voltage signal terminal VGL1 have a large voltage difference therebetween, which easily causes an electric leakage of the first pull-up node Q1 through the first reset circuit 104, thereby affecting the stability of the voltage of the first pull-up node Q1.

The first reset circuit 104 is electrically connected to the first leakage prevention node OFF1, so that in the case where the voltage of the first pull-up node Q1 is at a high level, the first voltage signal or the second voltage signal may be transmitted to the first leakage prevention node OFF1 to increase the voltage of the first leakage prevention node OFF1, so as to reduce the voltage difference between the first pull-up node Q1 and the third voltage signal terminal VGL1, thereby avoiding the electric leakage of the first pull-up node Q1 through the first reset circuit 104 to ensure the stability of the voltage of the first pull-up node Q1.

In some examples, as shown in FIGS. 12 to 17, the second reset circuit 204 is electrically connected to the first pull-down node QB_A, the second pull-down node QB_B, the second pull-up node Q2, the third voltage signal terminal VGL1, and the second leakage prevention node OFF2. The second reset circuit 204 is configured to reset the second pull-up node Q2 under the control of the voltage of the first pull-down node QB_A or the voltage of the second pull-down node QB_B.

For example, in the case where the voltage of the first pull-down node QB_A is at a high level, the second reset circuit 204 may be turned on due to the action of the voltage of the first pull-down node QB_A, and transmit the third voltage signal transmitted by the third voltage signal terminal VGL1 to the second pull-up node Q2, so as to pull down the voltage of the second pull-up node Q2 to reset the second pull-up node Q2. In the case where the voltage of the second pull-down node QB_B is at a high level, the second reset circuit 204 may be turned on due to the action of the voltage of the second pull-down node QB_B, and transmit the third voltage signal transmitted by the third voltage signal terminal VGL1 to the second pull-up node Q2, so as to pull down the voltage of the second pull-up node Q2 to reset the second pull-up node Q2.

Here, in a case where the voltage of the second pull-up node Q2 is at a high level, and the second reset circuit 204 is in an inoperative state, the second pull-up node Q2 and the third voltage signal terminal VGL1 have a large voltage difference therebetween, which easily causes an electric leakage of the second pull-up node Q2 through the second reset circuit 204, thereby affecting the stability of the voltage of the second pull-up node Q2.

The second reset circuit 204 is electrically connected to the second leakage prevention node OFF2, so that in the case where the voltage of the second pull-up node Q2 is at a high level, the first voltage signal or the second voltage signal may be transmitted to the second leakage prevention node OFF2 to increase the voltage of the second leakage prevention node OFF2, so as to reduce the voltage difference between the second pull-up node Q2 and the third voltage signal terminal VGL1, thereby avoiding the electric leakage of the second pull-up node Q2 through the second reset circuit 204 to ensure the stability of the voltage of the second pull-up node Q2.

Structures of the first reset circuit 104 included in the first scan unit 1 and the second reset circuit 204 included in the second scan unit 2 will be schematically described below.

In some examples, as shown in FIGS. 11, 13, 15 and 17, the first reset circuit 104 includes a twentieth transistor M20 and a twenty-first transistor M21.

For example, as shown in FIGS. 11, 13, 15 and 17, a control electrode of the twentieth transistor M20 is electrically connected to the first pull-down node QB_A, a first electrode of the twentieth transistor M20 is electrically connected to the first pull-up node Q1, and a second electrode of the twentieth transistor M20 is electrically connected to a first electrode of the twenty-first transistor M21 and the first leakage prevention node OFF1. A control electrode of the twenty-first transistor M21 is electrically connected to the first pull-down node QB_A, and a second electrode of the twenty-first transistor M21 is electrically connected to the third voltage signal terminal VGL1.

For example, in the case where the voltage of the first pull-down node QB_A is at a high level, the twentieth transistor M20 and the twenty-first transistor M21 may be turned on synchronously due to the action of the voltage of the first pull-down node QB_A. The twenty-first transistor M21 may transmit the third voltage signal transmitted by the third voltage signal terminal VGL1 to the first leakage prevention node OFF1, and the twentieth transistor M20 may transmit the third voltage signal from the first leakage prevention node OFF1 to the first pull-up node Q1, so as to reset the first pull-up node Q1.

In some examples, as shown in FIGS. 13, 15 and 17, in the case where the shift register 100 further includes the second scan unit 2, the first reset circuit 104 further includes a twenty-second transistor M22 and a twenty-third transistor M23.

For example, as shown in FIGS. 13, 15 and 17, a control electrode of the twenty-second transistor M22 is electrically connected to the second pull-down node QB_B, a first electrode of the twenty-second transistor M22 is electrically connected to the first pull-up node Q1, and a second electrode of the twenty-second transistor M22 is electrically connected to a first electrode of the twenty-third transistor M23 and the first leakage prevention node OFF1. A control electrode of the twenty-third transistor M23 is electrically connected to the second pull-down node QB_B, and a second electrode of the twenty-third transistor M23 is electrically connected to the third voltage signal terminal VGL1.

For example, in the case where the voltage of the second pull-down node QB_B is at a high level, the twenty-second transistor M22 and the twenty-third transistor M23 may be turned on synchronously due to the action of the voltage of the second pull-down node QB_B. The twenty-third transistor M23 may transmit the third voltage signal transmitted by the third voltage signal terminal VGL1 to the first leakage prevention node OFF1, and the twenty-second transistor M22 may transmit the third voltage signal from the first leakage prevention node OFF1 to the first pull-up node Q1, so as to reset the first pull-up node Q1.

Here, in the case where the voltage of the first pull-up node Q1 is at a high level, and the first reset circuit 104 is in the inoperative state, the first leakage prevention circuit 301 may be turned on under the control of the voltage of the first pull-up node Q1, and transmit the first voltage signal or the second voltage signal to the first leakage prevention node OFF1, so that the voltage of the first leakage prevention node OFF1 is increased, and thus the voltage difference between the first leakage prevention node OFF1 and the first pull-up node Q1 is reduced. Moreover, a voltage difference between the control electrode and the second electrode of the twentieth transistor M20 is less than zero, ensuring that the twentieth transistor M20 is completely or relatively completely turned off, and a voltage difference between the control electrode and the second electrode of the twenty-second transistor M22 is less than zero, ensuring that the twenty-second transistor M22 is completely or relatively completely turned off. In this way, the electric leakage of the first pull-up node Q1 through the first reset circuit 104 may be avoided, so that the first pull-up node Q1 is able to be maintained at a high and stable voltage.

In some examples, as shown in FIGS. 13,15 and 17, the second reset circuit 204 includes a twenty-fourth transistor M24, a twenty-fifth transistor M25, a twenty-sixth transistor M26, and a twenty-seventh transistor M27.

For example, as shown in FIGS. 13, 15 and 17, a control electrode of the twenty-fourth transistor M24 is electrically connected to the first pull-down node QB_A, a first electrode of the twenty-fourth transistor M24 is electrically connected to the second pull-up node Q2, and a second electrode of the twenty-fourth transistor M24 is electrically connected to a first electrode of the twenty-sixth transistor M26 and the second leakage prevention node OFF2. A control electrode of the twenty-sixth transistor M26 is electrically connected to the first pull-down node QB_A, and a second electrode of the twenty-sixth transistor M26 is electrically connected to the third voltage signal terminal VGL1.

For example, in the case where the voltage of the first pull-down node QB_A is at a high level, the twenty-fourth transistor M24 and the twenty-sixth transistor M26 may be turned on synchronously due to the action of the voltage of the first pull-down node QB_A. The twenty-sixth transistor M26 may transmit the third voltage signal transmitted by the third voltage signal terminal VGL1 to the second leakage prevention node OFF2, and the twenty-fourth transistor M24 may transmit the third voltage signal from the second leakage prevention node OFF2 to the second pull-up node Q2, so as to reset the second pull-up node Q2.

For example, as shown in FIGS. 13, 15 and 17, a control electrode of the twenty-fifth transistor M25 is electrically connected to the second pull-down node QB_B, a first electrode of the twenty-fifth transistor M25 is electrically connected to the second pull-up node Q2, and a second electrode of the twenty-fifth transistor M25 is electrically connected to a first electrode of the twenty-seventh transistor M27 and the second leakage prevention node OFF2. A control electrode of the twenty-seventh transistor M27 is electrically connected to the second pull-down node QB_B, and a second electrode of the twenty-seventh transistor M27 is electrically connected to the third voltage signal terminal VGL1.

For example, in the case where the voltage of the second pull-down node QB_B is at a high level, the twenty-fifth transistor M25 and the twenty-seventh transistor M27 may be turned on synchronously due to the action of the voltage of the second pull-down node QB_B. The twenty-seventh transistor M27 may transmit the third voltage signal transmitted by the third voltage signal terminal VGL1 to the second leakage prevention node OFF2, and the twenty-fifth transistor M25 may transmit the third voltage signal from the second leakage prevention node OFF2 to the second pull-up node Q2, so as to reset the second pull-up node Q2.

Here, in the case where the voltage of the second pull-up node Q2 is at a high level, and the second reset circuit 204 is in the inoperative state, the second leakage prevention circuit 302 may turned on under the control of the voltage of the second pull-up node Q2, transmit the first voltage signal or the second voltage signal to the second leakage prevention node OFF2, so that the voltage of the second leakage prevention node OFF2 is increased, and thus the voltage difference between the second leakage prevention node OFF2 and the second pull-up node Q2 is reduced. Moreover, a voltage difference between the control electrode and the second electrode of the twenty-fourth transistor M24 is less than zero, ensuring that the twenty-fourth transistor M24 is completely or relatively completely turned off, and a voltage difference between the control electrode and the second electrode of the twenty-fifth transistor M25 is less than zero, ensuring that the twenty-fifth transistor M25 is completely or relatively completely turned off. In this way, the electric leakage of the second pull-up node Q2 through the second reset circuit 204 may be avoided, so that the second pull-up node Q2 is able to be maintained at a high and stable voltage.

In some embodiments, as shown in FIGS. 10 to 17, the first scan unit 1 may further include a third reset circuit 105. As shown in FIGS. 12 to 17, the second scan unit 2 may further include a fourth reset circuit 205.

In some examples, as shown in FIGS. 10 to 17, the third reset circuit 105 is electrically connected to a display reset signal terminal STD, the first pull-up node Q1, the third voltage signal terminal VGL1, and the first leakage prevention node OFF1. The third reset circuit 105 is configured to reset the first pull-up node Q1 under a control of a display reset signal transmitted by the display reset signal terminal STD.

For example, in a case where a level of the display reset signal is a high level, the third reset circuit 105 may be turned on due to an action of the display reset signal, and transmit the third voltage signal transmitted by the third voltage signal terminal VGL1 to the first pull-up node Q1, so as to pull down the voltage of the first pull-up node Q1 to reset the first pull-up node Q1.

Here, in the case where the voltage of the first pull-up node Q1 is at a high level, and the third reset circuit 105 is in an inoperative state, the first pull-up node Q1 and the third voltage signal terminal VGL1 have a large voltage difference therebetween, which easily causes an electric leakage of the first pull-up node Q1 through the third reset circuit 105, thereby affecting the stability of the voltage of the first pull-up node Q1.

The third reset circuit 105 is electrically connected to the first leakage prevention node OFF1, so that in the case where the voltage of the first pull-up node Q1 is at a high level, the first voltage signal or the second voltage signal may be transmitted to the first leakage prevention node OFF1 to increase the voltage of the first leakage prevention node OFF1, so as to reduce the voltage difference between the first pull-up node Q1 and the third voltage signal terminal VGL1, thereby avoiding the electric leakage of the first pull-up node Q1 through the third reset circuit 105 to ensure the stability of the voltage of the first pull-up node Q1.

In some examples, as shown in FIGS. 12 to 17, the fourth reset circuit 205 is electrically connected to the display reset signal terminal STD, the second pull-up node Q2, the third voltage signal terminal VGL1, and the second leakage prevention node OFF2. The fourth reset circuit 205 is configured to reset the second pull-up node Q2 under the control of the display reset signal transmitted by the display reset signal terminal STD.

For example, in the case where the level of the display reset signal is a high level, the fourth reset circuit 205 may be turned on due to the action of the display reset signal, and transmit the third voltage signal transmitted by the third voltage signal terminal VGL1 to the second pull-up node Q2, so as to pull down the voltage of the second pull-up node Q2 to reset the second pull-up node Q2.

Here, in the case where the voltage of the second pull-up node Q2 is at a high level, and the fourth reset circuit 205 is in an inoperative state, the second pull-up node Q2 and the third voltage signal terminal VGL1 have a large voltage difference therebetween, which easily causes an electric leakage of the second pull-up node Q2 through the fourth reset circuit 205, thereby affecting the stability of the voltage of the second pull-up node Q2.

The fourth reset circuit 205 is electrically connected to the second leakage prevention node OFF2, so that in the case where the voltage of the second pull-up node Q2 is at a high level, the first voltage signal or the second voltage signal may be transmitted to the second leakage prevention node OFF2 to increase the voltage of the second leakage prevention node OFF2, so as to reduce the voltage difference between the second pull-up node Q2 and the third voltage signal terminal VGL1, thereby avoiding the electric leakage of the second pull-up node Q2 through the fourth reset circuit 205 to ensure the stability of the voltage of the second pull-up node Q2.

It will be noted that in the case where the plurality of shift registers 100 are cascaded to form the gate driving circuit 1000, the display reset signal terminal STD in a certain stage shift register 100 may be electrically connected to the shift signal terminal CR<N> in other stage shift register 100, so that the certain stage shift register 100 may receive the shift signal output from the other stage shift register 100 as the display reset signal. For example, the display reset signal terminal STD in the N-th stage shift register 100 may be electrically connected to the shift signal terminal CR<N> in an (N+4)-th stage shift register 100.

Structures of the third reset circuit 105 included in the first scan unit 1 and the fourth reset circuit 205 included in the second scan unit 2 will be schematically described below.

In some examples, as shown in FIGS. 11, 13, 15 and 17, the third reset circuit 105 includes a twenty-eighth transistor M28 and a twenty-ninth transistor M29.

For example, as shown in FIGS. 11, 13, 15 and 17, a control electrode of the twenty-eighth transistor M28 is electrically connected to the display reset signal terminal STD, a first electrode of the twenty-eighth transistor M28 is electrically connected to the first pull-up node Q1, and a second electrode of the twenty-eighth transistor M28 is electrically connected to a first electrode of the twenty-ninth transistor M29 and the first leakage prevention node OFF1. A control electrode of the twenty-ninth transistor M29 is electrically connected to the display reset signal terminal STD, and a second electrode of the twenty-ninth transistor M29 is electrically connected to the third voltage signal terminal VGL1.

For example, in the case where the level of the display reset signal transmitted by the display reset signal terminal STD is a high level, the twenty-eighth transistor M28 and the twenty-ninth transistor M29 may be turned on synchronously due to the action of the display reset signal. The twenty-ninth transistor M29 may transmit the third voltage signal transmitted by the third voltage signal terminal VGL1 to the first leakage prevention node OFF1, and the twenty-eighth transistor M28 may transmit the third voltage signal from the first leakage prevention node OFF1 to the first pull-up node Q1, so as to reset the first pull-up node Q1.

Here, in the case where the voltage of the first pull-up node Q1 is at a high level, and the third reset circuit 105 is in the inoperative state, the first leakage prevention circuit 301 may be turned on under the control of the voltage of the first pull-up node Q1, and transmit the first voltage signal or the second voltage signal to the first leakage prevention node OFF1, so that the voltage of the first leakage prevention node OFF1 is increased, and thus the voltage difference between the first leakage prevention node OFF1 and the first pull-up node Q1 is reduced. Moreover, a voltage difference between the control electrode and the second electrode of the twenty-eighth transistor M28 is less than zero, ensuring that the twenty-eighth transistor M28 is completely or relatively completely turned off. In this way, the electric leakage of the first pull-up node Q1 through the third reset circuit 105 may be avoided, so that the first pull-up node Q1 is able to be maintained at a high and stable voltage.

In some examples, as shown in FIGS. 13, 15 and 17, the fourth reset circuit 205 includes a thirtieth transistor M30 and a thirty-first transistor M31.

For example, as shown in FIGS. 13, 15 and 17, a control electrode of the thirtieth transistor M30 is electrically connected to the display reset signal terminal STD, a first electrode of the thirtieth transistor M30 is electrically connected to the second pull-up node Q2, and a second electrode of the thirtieth transistor M30 is electrically connected to a first electrode of the thirty-first transistor M31 and the second leakage prevention node OFF2. A control electrode of the thirty-first transistor M31 is electrically connected to the display reset signal terminal STD, and a second electrode of the thirty-first transistor M31 is electrically connected to the third voltage signal terminal VGL1.

For example, in the case where the level of the display reset signal transmitted by the display reset signal terminal STD is a high level, the thirtieth transistor M30 and the thirty-first transistor M31 may be turned on synchronously due to the action of the display reset signal. The thirty-first transistor M31 may transmit the third voltage signal transmitted by the third voltage signal terminal VGL1 to the second leakage prevention node OFF2, and the thirtieth transistor M30 may transmit the third voltage signal from the second leakage prevention node OFF2 to the second pull-up node Q2, so as to reset the second pull-up node Q2.

Here, in the case where the voltage of the second pull-up node Q2 is at a high level, and the fourth reset circuit 205 is in the inoperative state, the second leakage prevention circuit 302 may be turned on under the control of the voltage of the second pull-up node Q2, and transmit the first voltage signal or the second voltage signal to the second leakage prevention node OFF2, so that the voltage of the second leakage prevention node OFF2 is increased, and thus the voltage difference between the second leakage prevention node OFF2 and the second pull-up node Q2 is reduced. Moreover, a voltage difference between the control electrode and the first electrode of the thirtieth transistor M30 is less than zero, ensuring that the thirtieth transistor M30 is completely or relatively completely turned off. In this way, the electric leakage of the second pull-up node Q2 through the fourth reset circuit 205 may be avoided, so that the second pull-up node Q2 is able to be maintained at a high and stable voltage.

In some embodiments, as shown in FIGS. 10 to 17, the first scan unit 1 may further include a fifth reset circuit 106. As shown in FIGS. 12 to 17, the second scan unit 2 may further include a sixth reset circuit 206.

In some examples, as shown in FIGS. 10 to 17, the fifth reset circuit 106 is electrically connected to a global reset signal terminal TRST, the first pull-up node Q1, the third voltage signal terminal VGL1, and the first leakage prevention node OFF1. The fifth reset circuit 106 is configured to reset the first pull-up node Q1 under a control of a global reset signal transmitted by the global reset signal terminal TRST.

For example, in a case where a level of the global reset signal is a high level, the fifth reset circuit 106 may be turned on due to an action of the global reset signal, and transmit the third voltage signal transmitted by the third voltage signal terminal VGL1 to the first pull-up node Q1, so as to pull down the voltage of the first pull-up node Q1 to reset the first pull-up node Q1.

Here, in the case where the voltage of the first pull-up node Q1 is at a high level, and the fifth reset circuit 106 is in an inoperative state, the first pull-up node Q1 and the third voltage signal terminal VGL1 have a large voltage difference therebetween, which easily causes an electric leakage of the first pull-up node Q1 through the fifth reset circuit 106, thereby affecting the stability of the voltage of the first pull-up node Q1.

The fifth reset circuit 106 is electrically connected to the first leakage prevention node OFF1, so that in the case where the voltage of the first pull-up node Q1 is at a high level, the first voltage signal or the second voltage signal may be transmitted to the first leakage prevention node OFF1 to increase the voltage of the first leakage prevention node OFF1, so as to reduce the voltage difference between the first pull-up node Q1 and the third voltage signal terminal VGL1, thereby avoiding the electric leakage of the first pull-up node Q1 through the fifth reset circuit 106 to ensure the stability of the voltage of the first pull-up node Q1.

In some examples, as shown in FIGS. 12 to 17, the sixth reset circuit 206 is electrically connected to the global reset signal terminal TRST, the second pull-up node Q2, the third voltage signal terminal VGL1, and the second leakage prevention node OFF2. The sixth reset circuit 206 is configured to reset the second pull-up node Q2 under the control of the global reset signal transmitted by the global reset signal terminal TRST.

For example, in the case where the level of the global reset signal is a high level, the sixth reset circuit 206 may be turned on due to the action of the global reset signal, and transmit the third voltage signal transmitted by the third voltage signal terminal VGL1 to the second pull-up node Q2, so as to pull down the voltage of the second pull-up node Q2 to reset the second pull-up node Q2.

Here, in the case where the voltage of the second pull-up node Q2 is at a high level, and the sixth reset circuit 206 is in an inoperative state, the second pull-up node Q2 and the third voltage signal terminal VGL1 have a large voltage difference therebetween, which easily causes an electric leakage of the second pull-up node Q2 through the sixth reset circuit 206, thereby affecting the stability of the voltage of the second pull-up node Q2.

The sixth reset circuit 206 is electrically connected to the second leakage prevention node OFF2, so that in the case where the voltage of the second pull-up node Q2 is at a high level, the first voltage signal or the second voltage signal may be transmitted to the second leakage prevention node OFF2 to increase the voltage of the second leakage prevention node OFF2, so as to reduce the voltage difference between the second pull-up node Q2 and the third voltage signal terminal VGL1, thereby avoiding the electric leakage of the second pull-up node Q2 through the sixth reset circuit 206 to ensure the stability of the voltage of the second pull-up node Q2.

Structures of the fifth reset circuit 106 included in the first scan unit 1 and the sixth reset circuit 206 included in the second scan unit 2 will be schematically described below.

In some examples, as shown in FIGS. 11, 13, 15 and 17, the fifth reset circuit 106 includes a thirty-second transistor M32 and a thirty-third transistor M33.

For example, as shown in FIGS. 11, 13, 15 and 17, a control electrode of the thirty-second transistor M32 is electrically connected to the global reset signal terminal TRST, a first electrode of the thirty-second transistor M32 is electrically connected to the first pull-up node Q1, and a second electrode of the thirty-second transistor M32 is electrically connected to a first electrode of the thirty-third transistor M33 and the first leakage prevention node OFF1. A control electrode of the thirty-third transistor M33 is electrically connected to the global reset signal terminal TRST, and a second electrode of the thirty-third transistor M33 is electrically connected to the third voltage signal terminal VGL1.

For example, in the case where the level of the global reset signal transmitted by the global reset signal terminal TRST is a high level, the thirty-second transistor M32 and the thirty-third transistor M33 may be turned on synchronously due to the action of the global reset signal. The thirty-third transistor M33 may transmit the third voltage signal transmitted by the third voltage signal terminal VGL1 to the first leakage prevention node OFF1, and the thirty-second transistor M32 may transmit the third voltage signal from the first leakage prevention node OFF1 to the first pull-up node Q1, so as to reset the first pull-up node Q1.

Here, in the case where the voltage of the first pull-up node Q1 is at a high level, and the fifth reset circuit 106 is in the inoperative state, the first leakage prevention circuit 301 may be turned on under the control of the voltage of the first pull-up node Q1, and transmit the first voltage signal or the second voltage signal to the first leakage prevention node OFF1, so that the voltage of the first leakage prevention node OFF1 is increased, and thus the voltage difference between the first leakage prevention node OFF1 and the first pull-up node Q1 is reduced. Moreover, a voltage difference between the control electrode and the second electrode of the thirty-second transistor M32 is less than zero, ensuring that the thirty-second transistor M32 is completely or relatively completely turned off. In this way, the electric leakage of the first pull-up node Q1 through the fifth reset circuit 106 may be avoided, so that the first pull-up node Q1 is able to be maintained at a high and stable voltage.

In some examples, as shown in FIGS. 13, 15 and 17, the sixth reset circuit 206 includes a thirty-fourth transistor M34 and a thirty-fifth transistor M35.

For example, as shown in FIGS. 13, 15 and 17, a control electrode of the thirty-fourth transistor M34 is electrically connected to the global reset signal terminal TRST, a first electrode of the thirty-fourth transistor M34 is electrically connected to the second pull-up node Q2, and a second electrode of the thirty-fourth transistor M34 is electrically connected to a first electrode of the thirty-fifth transistor M35 and the second leakage prevention node OFF2. A control electrode of the thirty-fifth transistor M35 is electrically connected to the global reset signal terminal TRST, and a second electrode of the thirty-fifth transistor M35 is electrically connected to the third voltage signal terminal VGL1.

For example, in the case where the level of the global reset signal transmitted by the display reset signal terminal STD is a high level, the thirty-fourth transistor M34 and the thirty-fifth transistor M35 may be turned on synchronously due to the action of the global reset signal. The thirty-fifth transistor M35 may transmit the third voltage signal transmitted by the third voltage signal terminal VGL1 to the second leakage prevention node OFF2, and the thirty-fourth transistor M34 may transmit the third voltage signal from the second leakage prevention node OFF2 to the second pull-up node Q2, so as to reset the second pull-up node Q2.

Here, in the case where the voltage of the second pull-up node Q2 is at a high level, and the sixth reset circuit 206 is in the inoperative state, the second leakage prevention circuit 302 may be turned on under the control of the voltage of the second pull-up node Q2, and transmit the first voltage signal or the second voltage signal to the second leakage prevention node OFF2, so that the voltage of the second leakage prevention node OFF2 is increased, and thus the voltage difference between the second leakage prevention node OFF2 and the second pull-up node Q2 is reduced. Moreover, a voltage difference between the control electrode and the second electrode of the thirty-fourth transistor M34 is less than zero, ensuring that the thirty-fourth transistor M34 is completely or relatively completely turned off. In this way, the electric leakage of the second pull-up node Q2 through the sixth reset circuit 206 may be avoided, so that the second pull-up node Q2 is able to be maintained at a high and stable voltage.

In some embodiments, as shown in FIGS. 10 to 17, the first scan unit 1 may further include a seventh reset circuit 107 and an eighth reset circuit 108. As shown in FIGS. 12 to 17, the second scan unit 2 may further include a ninth reset circuit 207 and a tenth reset circuit 208.

In some examples, as shown in FIGS. 10 to 17, the seventh reset circuit 107 is electrically connected to the first pull-down node QB_A, the shift signal terminal CR<N>, the first scan signal terminal Oput1<N>, the third voltage signal terminal VGL1, and a fourth voltage signal terminal VGL2. The seventh reset circuit 107 is configured to reset the shift signal terminal CR<N> and the first scan signal terminal Oput1<N> under the control of the voltage of the first pull-down node QB_A.

For example, as shown in FIGS. 12 to 17, in the case where the shift register 100 further includes the second scan unit 2, the seventh reset circuit 107 is further electrically connected to the second pull-down node QB_B. The seventh reset circuit 107 is further configured to reset the shift signal terminal CR<N> and the first scan signal terminal Oput1<N> under the control of the voltage of the second pull-down node QB_B.

For example, in the case where the voltage of the first pull-down node QB_A is at a high level, the seventh reset circuit 107 may be turned on due to the action of the voltage of the first pull-down node QB_A, transmit the third voltage signal transmitted by the third voltage signal terminal VGL1 to the shift signal terminal CR<N> to pull down a voltage of the shift signal terminal CR<N> to reset the shift signal terminal CR<N>, and transmit a fourth voltage signal transmitted by the fourth voltage signal terminal VGL2 to the first scan signal terminal Oput1<N> to pull down a voltage of the first scan signal terminal Oput1<N> to reset the first scan signal terminal Oput1<N>. In the case where the voltage of the second pull-down node QB_B is at a high level, the seventh reset circuit 107 may be turned on due to the action of voltage of the second pull-down node QB_B, transmit the third voltage signal transmitted by the third voltage signal terminal VGL1 to the shift signal terminal CR<N> to pull down the voltage of the shift signal terminal CR<N> to reset the shift signal terminal CR<N>, and transmit the fourth voltage signal transmitted by the fourth voltage signal terminal VGL2 to the first scan signal terminal Oput1<N> to pull down the voltage of the first scan signal terminal Oput1<N> to reset the first scan signal terminal Oput1<N>.

Here, the fourth voltage signal terminal VGL2 is configured to transmit a direct current low level signal (e.g., lower than or equal to a low level section of a clock signal). For example, the fourth voltage signal terminal VGL2 is grounded. Voltage values of the low level signals transmitted by the third voltage signal terminal VGL1 and the fourth voltage signal terminal VGL2 may be equal or unequal.

In some examples, as shown in FIGS. 16 and 17, in a case where the first output circuit 102 is further electrically connected to the first sensing signal terminal Oput2<N>, the seventh reset circuit 107 is further electrically connected to the first sensing signal terminal Oput2<N>. The seventh reset circuit 107 is further configured to reset the first sensing signal terminal Oput2<N> under the control of the voltage of the first pull-down node QB_A or the voltage of the second pull-down node QB_B.

For example, in the case where the voltage of the first pull-down node QB_A is at a high level, the seventh reset circuit 107 may be turned on due to the action of the voltage of the first pull-down node QB_A, and transmit the third voltage signal transmitted by the third voltage signal terminal VGL1 to the first sensing signal terminal Oput2<N>, so as to pull down a voltage of the first sensing signal terminal Oput2<N> to reset the first sensing signal terminal Oput2<N>. In the case where the voltage of the second pull-down node QB_B is at a high level, the seventh reset circuit 107 may be turned on due to the action of the voltage of the second pull-down node QB_B, and transmit the third voltage signal transmitted by the third voltage signal terminal VGL1 to the first sensing signal terminal Oput2<N>, so as to pull down the voltage of the first sensing signal terminal Oput2<N> to reset the first sensing signal terminal Oput2<N>.

In some examples, as shown in FIGS. 10 to 17, the eighth reset circuit 108 is electrically connected to the input signal terminal Iput, the first pull-down node QB_A, and the third voltage signal terminal VGL1. The eighth reset circuit 108 is configured to reset the first pull-down node QB_A under the control of the input signal transmitted by the input signal terminal Iput.

For example, in the case where the level of the input signal is a high level, the eighth reset circuit 108 may be turned on due to the action of the input signal, and transmit the third voltage signal transmitted by the third voltage signal terminal VGL1 to the first pull-down node QB_A, so as to pull down the voltage of the first pull-down node QB_A to reset the first pull-down node QB_A.

In some examples, as shown in FIGS. 12 to 17, the ninth reset circuit 207 is electrically connected to the first pull-down node QB_A, the second pull-down node QB_B, the second scan signal terminal Oput1<N+1>, and the fourth voltage signal terminal VGL2. The ninth reset circuit 207 is configured to reset the second scan signal terminal Oput1<N+1> under the control of the voltage of the first pull-down node QB_A or the voltage of the second pull-down node QB_B.

For example, in the case where the voltage of the first pull-down node QB_A is at a high level, the ninth reset circuit 207 may be turned on due to the action of the voltage of the first pull-down node QB_A, and transmit the fourth voltage signal transmitted by the fourth voltage signal terminal VGL2 to the second scan signal terminal Oput1<N+1>, so as to pull down a voltage of the second scan signal terminal Oput1<N+1> to reset the second scan signal terminal Oput1<N+1>. In the case where the voltage of the second pull-down node QB_B is at a high level, the ninth reset circuit 207 may be turned on due to the action of the voltage of the second pull-down node QB_B, and transmit the fourth voltage signal transmitted by the fourth voltage signal terminal VGL2 to the second scan signal terminal Oput1<N+1>, so as to pull down the voltage of the second scan signal terminal Oput1<N+1> to reset the second scan signal terminal Oput1<N+1>.

In some examples, as shown in FIGS. 16 and 17, in a case where the second output circuit 202 is further electrically connected to the second sensing signal terminal Oput2<N+1>, the ninth reset circuit 207 is further electrically connected to the second sensing signal terminal Oput2<N+1>. The ninth reset circuit 207 is further configured to reset the second sensing signal terminal Oput2<N+1> under the control of the voltage of the first pull-down node QB_A or the voltage of the second pull-down node QB_B.

For example, in the case where the voltage of the first pull-down node QB_A is at a high level, the ninth reset circuit 207 may be turned on due to the action of the voltage of the first pull-down node QB_A, and transmit the fourth voltage signal transmitted by the fourth voltage signal terminal VGL2 to the second sensing signal terminal Oput2<N+1>, so as to pull down a voltage of the second sensing signal terminal Oput2<N+1> to reset the second sensing signal terminal Oput2<N+1>. In the case where the voltage of the second pull-down node QB_B is at a high level, the ninth reset circuit 207 may be turned on due to the action of the voltage of the second pull-down node QB_B, and transmit the fourth voltage signal transmitted by the fourth voltage signal terminal VGL2 to the second sensing signal terminal Oput2<N+1>, so as to pull down the voltage of the second sensing signal terminal Oput2<N+1> to reset the second sensing signal terminal Oput2<N+1>.

In some examples, as shown in FIGS. 12 to 17, the tenth reset circuit 208 is electrically connected to the input signal terminal Iput, the second pull-down node QB_B, and the third voltage signal terminal VGL1. The tenth reset circuit 208 is configured to reset the second pull-down node QB_B under the control of the input signal transmitted by the input signal terminal Iput.

For example, in the case where the level of the input signal is a high level, the tenth reset circuit 208 may be turned on due to the action of the input signal, and transmit the third voltage signal transmitted by the third voltage signal terminal VGL1 to the second pull-down node QB_B, so as to pull down the voltage of the second pull-down node QB_B to reset the second pull-down node QB_B.

Structures of the seventh reset circuit 107 and the eighth reset circuit 108 that are included in the first scan unit 1, and the ninth reset circuit 207 and the tenth reset circuit 208 that are included in the second scan unit 2 will be schematically described below.

In some examples, as shown in FIGS. 11, 13, 15 and 17, the seventh reset circuit 107 includes a thirty-sixth transistor M36 and a thirty-ninth transistor M39.

For example, as shown in FIGS. 11, 13, 15 and 17, a control electrode of the thirty-sixth transistor M36 is electrically connected to the first pull-down node QB_A, a first electrode of the thirty-sixth transistor M36 is electrically connected to the shift signal terminal CR<N>, and a second electrode of the thirty-sixth transistor M36 is electrically connected to the third voltage signal terminal VGL1.

For example, in the case where the voltage of the first pull-down node QB_A is at a high level, the thirty-sixth transistor M36 may be turned on due to the action of the voltage of the first pull-down node QB_A, and transmit the third voltage signal transmitted by the third voltage signal terminal VGL1 to the shift signal terminal CR<N>, so as to pull down the voltage of the shift signal terminal CR<N> to reset the shift signal terminal CR<N>.

For example, as shown in FIGS. 11, 13, 15 and 17, a control electrode of the thirty-ninth transistor M39 is electrically connected to the first pull-down node QB_A, a first electrode of the thirty-ninth transistor M39 is electrically connected to the first scan signal terminal Oput1<N>, and a second electrode of the thirty-ninth transistor M39 is electrically connected to the fourth voltage signal terminal VGL2.

For example, in the case where the voltage of the first pull-down node QB_A is at a high level, the thirty-ninth transistor M39 may be turned on due to the action of the voltage of the first pull-down node QB_A, and transmit the fourth voltage signal transmitted by the fourth voltage signal terminal VGL2 to the first scan signal terminal Oput1<N>, so as to pull down the voltage of the first scan signal terminal Oput1<N> to reset the first scan signal terminal Oput1<N>.

In some examples, as shown in FIGS. 13, 15 and 17, in the case where the shift register 100 further includes the second scan unit 2, the seventh reset circuit 107 further includes a thirty-eighth transistor M38 and a thirty-seventh transistor M37.

For example, as shown in FIGS. 13, 15 and 17, a control electrode of the thirty-eighth transistor M38 is electrically connected to the second pull-down node QB_B, a first electrode of the thirty-eighth transistor M38 is electrically connected to the shift signal terminal CR<N>, and a second electrode of the thirty-eighth transistor M38 is electrically connected to the third voltage signal terminal VGL1.

For example, in the case where the voltage of the second pull-down node QB_B is at a high level, the thirty-eighth transistor M38 may be turned on due to the action of the voltage of the second pull-down node QB_B, and transmit the third voltage signal transmitted by the third voltage signal terminal VGL1 to the shift signal terminal CR<N>, so as to pull down the voltage of the shift signal terminal CR<N> to reset the shift signal terminal CR<N>.

For example, as shown in FIGS. 13, 15 and 17, a control electrode of the thirty-seventh transistor M37 is electrically connected to the second pull-down node QB_B, a first electrode of the thirty-seventh transistor M37 is electrically connected to the first scan signal terminal Oput1<N>, and a second electrode of the thirty-seventh transistor M37 is electrically connected to the fourth voltage signal terminal VGL2.

For example, in the case where the voltage of the second pull-down node QB_B is at a high level, the thirty-seventh transistor M37 may be turned on due to the action of the voltage of the second pull-down node QB_B, and transmit the fourth voltage signal transmitted by the fourth voltage signal terminal VGL2 to the first scan signal terminal Oput1<N>, so as to pull down the voltage of the first scan signal terminal Oput1<N> to reset the first scan signal terminal Oput1<N>.

In some examples, as shown in FIG. 17, in the case where the first output circuit 102 is further electrically connected to the first sensing signal terminal Oput2<N>, the seventh reset circuit 107 further includes a fifty-fourth transistor M54 and a fifty-fifth transistor M55.

For example, as shown in FIG. 17, a control electrode of the fifty-fourth transistor M54 is electrically connected to the first pull-down node QB_A, a first electrode of the fifty-fourth transistor M54 is electrically connected to the first sensing signal terminal Oput2<N>, and a second electrode of the fifty-fourth transistor M54 is electrically connected to the fourth voltage signal terminal VGL2. A control electrode of the fifty-fifth transistor M55 is electrically connected to the second pull-down node QB_B, a first electrode of the fifty-fifth transistor M55 is electrically connected to the first sensing signal terminal Oput2<N>, and a second electrode of the fifty-fifth transistor M55 is electrically connected to the fourth voltage signal terminal VGL2.

For example, in the case where the voltage of the first pull-down node QB_A is at a high level, the fifty-fourth transistor M54 may be turned on due to the action of the voltage of the first pull-down node QB_A, and transmit the fourth voltage signal transmitted by the fourth voltage signal terminal VGL2 to the first sensing signal terminal Oput2<N>. In the case where the voltage of the second pull-down node QB_B is at a high level, the fifty-fifth transistor M55 may be turned on due to the action of the voltage of the second pull-down node QB_B, and transmit the fourth voltage signal transmitted by the fourth voltage signal terminal VGL2 to the first sensing signal terminal Oput2<N>.

In some examples, as shown in FIGS. 11, 13, 15 and 17, the eighth reset circuit 108 includes a fortieth transistor M40.

For example, as shown in FIGS. 11, 13, 15 and 17, a control electrode of the fortieth transistor M40 is electrically connected to the input signal terminal Iput, a first electrode of the fortieth transistor M40 is electrically connected to the first pull-down node QB_A, and a second electrode of the fortieth transistor M40 is electrically connected to the third voltage signal terminal VGL1.

For example, in the case where the level of the input signal is a high level, the fortieth transistor M40 may be turned on due to the action of the input signal, and transmit the third voltage signal transmitted by the third voltage signal terminal VGL1 to the first pull-down node QB_A, so as to pull down the voltage of the first pull-down node QB_A to reset the first pull-down node QB_A.

In some examples, as shown in FIGS. 13, 15 and 17, the ninth reset circuit 207 includes a forty-first transistor M41 and a forty-second transistor M42.

For example, as shown in FIGS. 13, 15 and 17, a control electrode of the forty-first transistor M41 is electrically connected to the second pull-down node QB_B, a first electrode of the forty-first transistor M41 is electrically connected to the second scan signal terminal Oput1<N+1>, and a second electrode of the forty-first transistor M41 is electrically connected to the fourth voltage signal terminal VGL2.

For example, in the case where the voltage of the second pull-down node QB_B is at a high level, the forty-first transistor M41 may be turned on due to the action of the voltage of the second pull-down node QB_B, and transmit the fourth voltage signal transmitted by the fourth voltage signal terminal VGL2 to the second scan signal terminal Oput1<N+1>, so as to pull down the voltage of the second scan signal terminal Oput1<N+1> to reset the second scan signal terminal Oput1<N+1>.

For example, as shown in FIGS. 13, 15 and 17, a control electrode of the forty-second transistor M42 is electrically connected to the first pull-down node QB_A, a first electrode of the forty-second transistor M42 is electrically connected to the second scan signal terminal Oput1<N+1>, and a second electrode of the forty-second transistor M42 is electrically connected to the fourth voltage signal terminal VGL2.

For example, in the case where the voltage of the first pull-down node QB_A is at a high level, the forty-second transistor M42 may be turned on due to the action of the voltage of the first pull-down node QB_A, and transmit the fourth voltage signal transmitted by the fourth voltage signal terminal VGL2 to the second scan signal terminal Oput1<N+1>, so as to pull down the voltage of the second scan signal terminal Oput1<N+1> to reset the second scan signal terminal Oput1<N+1>.

In some examples, as shown in FIG. 17, in the case where the second output circuit 202 is further electrically connected to the second sensing signal terminal Oput2<N+1>, the ninth reset circuit 207 further includes a fifty-sixth transistor M56 and a fifty-seventh transistor M57.

For example, as shown in FIG. 17, a control electrode of the fifty-sixth transistor M56 is electrically connected to the second pull-down node QB_B, a first electrode of the fifty-sixth transistor M56 is electrically connected to the second sensing signal terminal Oput2<N+1>, and a second electrode of the fifty-sixth transistor M56 is electrically connected to the fourth voltage signal terminal VGL2. A control electrode of the fifty-seventh transistor M57 is electrically connected to the first pull-down node QB_A, a first electrode of the fifty-seventh transistor M57 is electrically connected to the second sensing signal terminal Oput2<N+1>, and a second electrode of the fifty-seventh transistor M57 is electrically connected to the fourth voltage signal terminal VGL2.

For example, in the case where the voltage of the second pull-down node QB_B is at a high level, the fifty-sixth transistor M56 may be turned on due to the action of the voltage of the second pull-down node QB_B, and transmit the fourth voltage signal transmitted by the fourth voltage signal terminal VGL2 to the second sensing signal terminal Oput2<N+1>. In the case where the voltage of the first pull-down node QB_A is at a high level, the fifty-seventh transistor M57 may be turned on due to the action of the voltage of the first pull-down node QB_A, and transmit the fourth voltage signal transmitted by the fourth voltage signal terminal VGL2 to the second sensing signal terminal Oput2<N+1>.

In some examples, as shown in FIGS. 13, 15 and 17, the tenth reset circuit 208 includes a forty-third transistor M43.

For example, as shown in FIGS. 13, 15 and 17, a control electrode of the forty-third transistor M43 is electrically connected to the input signal terminal Iput, a first electrode of the forty-third transistor M43 is electrically connected to the second pull-down node QB_B, and a second electrode of the forty-third transistor M43 is electrically connected to the third voltage signal terminal VGL1.

For example, in the case where the level of the input signal is a high level, the forty-third transistor M43 may be turned on due to the action of the input signal, and transmit the third voltage signal transmitted by the third voltage signal terminal VGL1 to the second pull-down node QB_B, so as to pull down the voltage of the second pull-down node QB_B to reset the second pull-down node QB_B.

In some embodiments, there are various manners to compensate the sub-pixel in the display panel PNL, which may be selectively arranged according to actual needs.

For example, a pixel compensation circuit may be provided in the sub-pixel to internally compensate the sub-pixel by using the pixel compensation circuit. For another example, a sensing transistor may be provided in the sub-pixel to externally compensate the sub-pixel by using the sensing transistor.

As an example, an external compensation is used in the embodiments of the present disclosure. For example, as shown in FIG. 1, a structure of a pixel driving circuit in each sub-pixel in the display panel PNL may be, for example, a 3T1C structure ("T" represents a transistor, and "C" represents a capacitor). The pixel driving circuit in the sub-pixel may include a switching transistor T1, a driving transistor T2, a sensing transistor T3, and a storage capacitor Cst.

Herein, in the shift register 100, in the case where the first output circuit 102 in the first scan unit 1 is not electrically connected to the first sensing signal terminal Oput2<N>, the first scan signal terminal Oput1<N> may be electrically connected to a gate line GL, and the first scan signal may be transmitted to a control electrode of a corresponding switching transistor T1 through the gate line GL. Moreover, the first scan signal may be transmitted as a first sensing signal to a control electrode of a corresponding sensing transistor T3 through the gate line GL. In the case where the second output circuit 202 in the second scan unit 2 is not electrically connected to the second sensing signal terminal Oput2<N+1>, the second scan signal terminal Oput1<N+1> may be electrically connected to a gate line GL, and the second scan signal may be transmitted to a control electrode of a corresponding switching transistor T1 through the gate line GL. Moreover, the second scan signal may be transmitted as a second sensing signal to a control electrode of a corresponding sensing transistor T3 through the gate line GL.

In the shift register 100, in the case where the first output circuit 102 in the first scan unit 1 is electrically connected to the first sensing signal terminal Oput2<N>, the first scan signal terminal Oput1<N> may be electrically connected to a gate line GL, and transmit the first scan signal to a control electrode of a corresponding switching transistor T1 through the gate line GL. Moreover, the first sensing signal terminal Oput2<N> may be electrically connected to another gate line GL, and transmit the first sensing signal to a control electrode of a corresponding sensing transistor T3 through the gate line GL. In the case where the second output circuit 202 in the second scan unit 2 is electrically connected to the second sensing signal terminal Oput2<N+1>, the second scan signal terminal Oput1<N+1> may be electrically connected to a gate line GL, and transmit the second scan signal to a control electrode of a corresponding switching transistor T1 through the gate line GL. Moreover, the second sensing signal terminal Oput2<N+1> may be electrically connected to another gate line GL, and transmit the second sensing signal to a control electrode of a corresponding sensing transistor T3 through the gate line GL.

From the foregoing, the display phase of the frame may include the display period and the blanking period that are sequentially performed. In the display period, the shift register 100 may drive corresponding sub-pixels in the display panel PNL to display image(s). In the blanking period, the shift register 100 may drive corresponding sub-pixels in the display panel PNL to be externally compensated.

Based on this, in some embodiments, as shown in FIGS. 14 to 17, the shift register 100 may further include the blanking input unit 5.

In some examples, as shown in FIGS. 14 to 17, the blanking input unit 5 is electrically connected to a selection control signal terminal OE, the input signal terminal Iput, the third voltage signal terminal VGL1, a fourth dock signal terminal CLKA, the first pull-up node Q1, the first leakage prevention node OFF1, and the leakage prevention input node M. The blanking input unit 5 is configured to, under a control of a selection control signal transmitted by the selection control signal terminal OE and the input signal transmitted by the input signal terminal Iput, transmit a fourth clock signal received at the fourth clock signal terminal CLKA to the first pull-up node Q1.

In the case where the shift register 100 further includes the second scan unit 2, the blanking input unit 5 is further electrically connected to the second pull-up node Q2 and the second leakage prevention node OFF2. The blanking input unit 5 is further configured to, under the control of the selection control signal transmitted by the selection control signal terminal OE and the input signal transmitted by the input signal terminal Iput, transmit the fourth clock signal received at the fourth clock signal terminal CLKA to the second pull-up node Q2.

For example, in the blanking period in the display phase of the frame, in a case where a level of the selection control signal transmitted by the selection control signal terminal OE is a high level, the selection control signal and the input signal received at the input signal terminal Iput may cooperate with each other, so that the blanking input unit 5 transmits the fourth clock signal received at the fourth clock signal terminal CLKA to the first pull-up node Q1 and the second pull-up node Q2, so as to charge the first pull-up node Q1 and the second pull-up node Q2.

After the voltage of the first pull-up node Q1 is increased, the first output circuit 102 may be turned on under the control of the voltage of the first pull-up node Q1. If the first output circuit 102 is not electrically connected to the first sensing signal terminal Oput2<N>, the first output circuit 102 may output the second clock signal received at the second clock signal terminal CLKE_1 as both the first scan signal and the first sensing signal from the first scan signal terminal Oput1<N>. If the first output circuit 102 is electrically connected to the first sensing signal terminal Oput2<N>, the first output circuit 102 may output the fifth clock signal received at the fifth clock signal terminal CLKF_1 as the first sensing signal from the first sensing signal terminal Oput2<N>.

After the voltage of the second pull-up node Q2 is increased, the second output circuit 202 may be turned on under the control of the voltage of the second pull-up node Q2. If the second output circuit 202 is not electrically connected to the second sensing signal terminal Oput2<N+1>, the second output circuit 202 may output the third clock signal received at the third clock signal terminal CLKE_2 as both the second scan signal and the second sensing driving signal from the second scan signal terminal Oput1<N+1>. If the second output circuit 202 is electrically connected to the second sensing signal terminal Oput2<N+1>, the second output circuit 202 may output the sixth clock signal received at the sixth clock signal terminal CLKF_2 as the second sensing signal from the second sensing signal terminal Oput2<N+1>.

Here, in a case where the blanking input unit 5 is inoperative, if the voltage of the first pull-up node Q1 is at a high level, an electric leakage of the first pull-up node Q1 through the blanking input unit 5 easily occurs. If the voltage of the second pull-up node Q2 is at a high level, an electric leakage of the second pull-up node Q2 through the blanking input unit 5 easily occurs.

The blanking input unit 5 is electrically connected to the first leakage prevention node OFF1, so that in the case where the voltage of the first pull-up node Q1 is at a high level, the first voltage signal or the second voltage signal may be transmitted to the first leakage prevention node OFF1 by using the first leakage prevention circuit 301, so as to reduce the voltage difference between the first leakage prevention node OFF1 and the first pull-up node Q1, thereby avoiding the electric leakage of the first pull-up node Q1 through the blanking input unit 5.

The blanking input unit 5 is electrically connected to the second leakage prevention node OFF1, so that in the case where the voltage of the second pull-up node Q2 is at a high level, the first voltage signal or the second voltage signal may be transmitted to the second leakage prevention node OFF2 by using the second leakage prevention circuit 302, so as to reduce the voltage difference between the second leakage prevention node OFF2 and the second pull-up node Q2, thereby avoiding the electric leakage of the second pull-up node Q2 through the blanking input unit 5.

In some embodiments, as shown in FIGS. 14 to 17, the blanking input unit 5 may include a selection control circuit 501, a third input circuit 502, a first transmission circuit 503, and a third leakage prevention circuit 505.

In some examples, as shown in FIGS. 14 to 17, the selection control circuit 501 is electrically connected to the selection control signal terminal OE, the input signal terminal Iput, the third voltage signal terminal VGL1, a first banking node H, and a third leakage prevention node OFF3. The selection control circuit 501 is configured to transmit the input signal received at the input signal terminal Iput to the first banking node H under the control of the selection control signal transmitted by the selection control signal terminal OE.

For example, in the case where the level of the selection control signal is a high level, the selection control circuit 501 may be turned on under the control of the selection control signal, and transmit the received input signal to the first banking node H to charge the first banking node H, so that a voltage of the first banking node H is increased.

For example, when the shift register 100 is required to output a sensing signal, a waveform and a timing of the selection control signal may be same as a waveform and a timing of the input signal, respectively, so that the selection control circuit 501 is turned on.

In some examples, as shown in FIGS. 14 to 17, the third input circuit 502 is electrically connected to the first banking node H, the fourth clock signal terminal CLKA, and a second blanking node N. The third input circuit 502 is configured to transmit the fourth clock signal received at the fourth clock signal terminal CLKA to the second blanking node N under a control of the voltage of the first blanking node H.

For example, in a case where the selection control circuit 501 is turned on such that the voltage of the first banking node H is increased, the third input circuit 502 may be turned on under the control of the voltage of the first banking node H, receive the fourth clock signal received at the fourth clock signal terminal CLKA, and transmit the fourth clock signal to the second blanking node N.

In some examples, as shown in FIGS. 14 to 17, the first transmission circuit 503 is electrically connected to the fourth clock signal terminal CLKA, the second blanking node N, the first pull-up node Q1, and the first leakage prevention node OFF1. The first transmission circuit 503 is configured to transmit the fourth clock signal received at the second blanking node N to the first pull-up node Q1 under a control of the fourth clock signal transmitted by the fourth clock signal terminal CLKA.

For example, in a case where a level of the fourth clock signal transmitted by the fourth clock signal terminal CLKA is a high level, the first transmission circuit 503 may be turned on under the control of the fourth clock signal, receive the fourth clock signal at the second blanking node N, and transmit the received fourth clock signal to the first pull-up node Q1, so that the voltage of the first pull-up node Q1 is increased.

Here, in the case where the voltage of the first pull-up node Q1 is increased, the first leakage prevention circuit 301 may transmit the first voltage signal or the second voltage signal to the first leakage prevention node OFF1, so that the voltage of the first leakage prevention node OFF1 is increased, so as to reduce the voltage difference between the first leakage prevention node OFF1 and the first pull-up node Q1, thereby avoiding an electric leakage of the first pull-up node Q1 through the first transmission circuit 503. Thus, the first pull-up node Q1 is able to be maintained at a high and stable voltage, so as to avoid affecting an accuracy of the first sensing signal.

In some examples, as shown in FIGS. 14 to 17, in the case where the shift register 100 further includes the second scan unit 2, the blanking input unit 5 further includes a second transmission circuit 504. The second transmission circuit 504 is electrically connected to the fourth clock signal terminal CLKA, the second blanking node N, the second pull-up node Q2, and the second leakage prevention node OFF2. The second transmission circuit 504 is configured to transmit the fourth clock signal received at the second blanking node N to the second pull-up node Q2 under the control of the fourth clock signal transmitted by the fourth clock signal terminal CLKA.

For example, in the case where the level of the fourth clock signal transmitted by the fourth clock signal terminal CLKA is a high level, the second transmission circuit 504 may be turned on under the control of the fourth clock signal, receive the fourth clock signal at the second blanking node N, and transmit the received fourth clock signal to the second pull-up node Q2, so that the voltage of the second pull-up node Q2 is increased.

Here, in the case where the voltage of the second pull-up node Q2 is increased, the second leakage prevention circuit 302 may transmit the first voltage signal or the second voltage signal to the second leakage prevention node OFF2, so that the voltage of the second leakage prevention node OFF2 is increased, so as to reduce the voltage difference between the second leakage prevention node OFF2 and the second pull-up node Q2, thereby avoiding an electric leakage of the second pull-up node Q2 through the second transmission circuit 504. Thus, the second pull-up node Q2 is able to be maintained at a high and stable voltage, so as to avoid affecting an accuracy of the second sensing signal.

In some examples, as shown in FIGS. 14 to 17, the third leakage prevention circuit 505 is electrically connected to the third leakage prevention node OFF3, the first blanking node H, and the leakage prevention input node M. The third leakage prevention circuit 505 is configured to transmit the first voltage signal or the second voltage signal from the leakage prevention input node M to the third leakage prevention node OFF3 under the control of the voltage of the first blanking node H.

For example, in the case where the selection control circuit 501 is turned on such that the voltage of the first blanking node H is increased, the third leakage prevention circuit 505 may be turned on under the control of the voltage of the first blanking node H, receive the first voltage signal or the second voltage signal from the leakage prevention input node M, and transmit the first voltage signal or the second voltage signal to the third leakage prevention node OFF3, so that a voltage of the third leakage prevention node OFF3 is increased. In this way, a voltage difference between the third leakage prevention node OFF3 and the first blanking node H may be reduced, so as to avoid an electric leakage of the first blanking node H through the selection control circuit 501. Thus, the first blanking node H is able to be maintained at a high and stable voltage, so as to avoid affecting an on state of the third input circuit 502.

Structures of the selection control circuit 501, the third input circuit 502, the first transmission circuit 503, the second transmission circuit 504, and the third leakage prevention circuit 505 that are included in the blanking input unit 5 will be schematically described below.

In some examples, as shown in FIGS. 15 and 17, the selection control circuit 501 includes a forty-fourth transistor M44, a forty-fifth transistor M45, and a third capacitor C3.

For example, as shown in FIGS. 15 and 17, a control electrode of the forty-fourth transistor M44 is electrically connected to the selection control signal terminal OE, a first electrode of the forty-fourth transistor M44 is electrically connected to the input signal terminal Iput, and a second electrode of the forty-fourth transistor M44 is electrically connected to a first electrode of the forty-fifth transistor M45 and the third leakage prevention node OFF3. A control electrode of the forty-fifth transistor M45 is electrically connected to the selection control signal terminal OE, and a second electrode of the forty-fifth transistor M45 is electrically connected to the first blanking node H.

For example, in the case where the level of the selection control signal transmitted by the selection control signal terminal OE is a high level, the forty-fourth transistor M44 and the forty-fifth transistor M45 may be turned on synchronously due to an action of the selection control signal. The forty-fourth transistor M44 may transmit the input signal transmitted by the input signal terminal Iput to the third leakage prevention node OFF3, and the forty-fifth transistor M45 may receive and transmit the input signal to the first blanking node H, so as to charge the first blanking node H.

For example, as shown in FIGS. 15 and 17, a first terminal of the third capacitor C3 is electrically connected to the first blanking node H, and a second terminal of the third capacitor C3 is electrically connected to the third voltage signal terminal VGL1.

For example, in a process of charging the first blanking node H by the selection control circuit 501, the third capacitor C3 is also charged. In this way, in a case where the selection control circuit 501 is turned off, the third capacitor C3 may be discharged, so that the voltage of the first blanking node H is maintained at a high level.

In some examples, as shown in FIGS. 15 and 17, the third leakage prevention circuit 505 includes a forty-sixth transistor M46.

For example, as shown in FIGS. 15 and 17, a control electrode of the forty-sixth transistor M46 is electrically connected to the first blanking node H, a first electrode of the forty-sixth transistor M46 is electrically connected to the leakage prevention input node M, and a second electrode of the forty-sixth transistor M46 is electrically connected to the third leakage prevention node OFF3.

For example, in a case where the voltage of the first blanking node H is at a high level, the forty-sixth transistor M46 may be turned on under the control of the voltage of the first blanking node H, and transmit the first voltage signal or the second voltage signal from the leakage prevention input node M to the third leakage prevention node OFF3, so that the voltage of the third leakage prevention node OFF3 is increased, so as to reduce the voltage difference between the third leakage prevention node OFF3 and the first blanking node H. Moreover, a voltage difference between the control electrode and the first electrode of the forty-fifth transistor M45 is less than zero, ensuring that the forty-fifth transistor M45 is completely or relatively completely turned off. In this way, the electric leakage of the first blanking node H through the selection control circuit 501 may be avoided, so that the first blanking node H is able to be maintained at a high and stable voltage.

In some examples, as shown in FIGS. 15 and 17, the third input circuit 502 includes a forty-seventh transistor M47.

For example, as shown in FIGS. 15 and 17, a control electrode of the forty-seventh transistor M47 is electrically connected to the first blanking node H, a first electrode of the forty-seventh transistor M47 is electrically connected to the fourth clock signal terminal CLKA, and a second electrode of the forty-seventh transistor M47 is electrically connected to the second blanking node N.

For example, in the case where the voltage of the first blanking node H is at a high level, the forty-seventh transistor M47 may be turned on under the control of the voltage of the first blanking node H, and transmit the fourth clock signal received at the fourth clock signal terminal CLKA to the second blanking node N.

In some examples, as shown in FIGS. 15 and 17, the first transmission circuit 503 includes a forty-eighth transistor M48 and a forty-ninth transistor M49.

For example, as shown in FIGS. 15 and 17, a control electrode of the forty-eighth transistor M48 is electrically connected to the fourth clock signal terminal CLKA, a first electrode of the forty-eighth transistor M48 is electrically connected to the second blanking node N, and a second electrode of the forty-eighth transistor M48 is electrically connected to a first electrode of the forty-ninth transistor M49 and the first leakage prevention node OFF1. A control electrode of the forty-ninth transistor M49 is electrically connected to the fourth clock signal terminal CLKA, and a second electrode of the forty-ninth transistor M49 is electrically connected to the first pull-up node Q1.

For example, in the case where the level of the fourth clock signal transmitted by the fourth clock signal terminal CLKA is a high level, the forty-eighth transistor M48 and the forty-ninth transistor M49 may be turned on synchronously due to the action of the fourth clock signal. The forty-eighth transistor M48 may transmit the fourth clock signal from the second blanking node N to the first leakage prevention node OFF1, and the forty-ninth transistor M49 may receive and transmit the fourth clock signal to the first pull-up node Q1, so as to charge the first pull-up node Q1.

Here, in the case where the voltage of the first pull-up node Q1 is at a high level, the first leakage prevention circuit 301 may transmit the first voltage signal or the second voltage signal from the leakage prevention input node M to the first leakage prevention node OFF1, so that the voltage of the first leakage prevention node OFF1 is increased, so as to reduce the voltage difference between the first leakage prevention node OFF1 and the first pull-up node Q1. Moreover, a voltage difference between the control electrode and the first electrode of the forty-ninth transistor M49 is less than zero, ensuring that the forty-ninth transistor M49 is completely or relatively completely turned off. In this way, the electric leakage of the first pull-up node Q1 through the first transmission circuit 503 may be avoided, so that the first pull-up node Q1 is able to be maintained at a high and stable voltage.

In some examples, as shown in FIGS. 15 and 17, the second transmission circuit 504 includes a fiftieth transistor M50 and a fifty-first transistor M51.

For example, as shown in FIGS. 15 and 17, a control electrode of the fiftieth transistor M50 is electrically connected to the fourth clock signal terminal CLKA, a first electrode of the fiftieth transistor M50 is electrically connected to the second blanking node N, and a second electrode of the fiftieth transistor M50 is electrically connected to a first electrode of the fifty-first transistor M51 and the second leakage prevention node OFF2. A control electrode of the fifty-first transistor M51 is electrically connected to the fourth clock signal terminal CLKA, and a second electrode of the fifty-first transistor M51 is electrically connected to the second pull-up node Q2.

For example, in the case where the level of the fourth clock signal transmitted by the fourth clock signal terminal CLKA is a high level, the fiftieth transistor M50 and the fifty-first transistor M51 may be turned on synchronously due to the action of the fourth clock signal. The fiftieth transistor M50 may transmit the fourth clock signal from the second blanking node N to the second leakage prevention node OFF2, and the fifty-first transistor M51 may receive and transmit the fourth clock signal to the second pull-up node Q2, so as to charge the second pull-up node Q2.

Here, in the case where the voltage of the second pull-up node Q2 is at a high level, the second leakage prevention circuit 302 may transmit the first voltage signal or the second voltage signal from the leakage prevention input node M to the second leakage prevention node OFF2, so that the voltage of the second leakage prevention node OFF2 is increased, so as to reduce the voltage difference between the second leakage prevention node OFF2 and the second pull-up node Q2. Moreover, a voltage difference between the control electrode and the first electrode of the fifty-first transistor M51 is less than zero, ensuring that the fifty-first transistor M51 is completely or relatively completely turned off. In this way, the electric leakage of the second pull-up node Q2 through the second transmission circuit 504 may be avoided, so that the second pull-up node Q2 is able to be maintained at a high and stable voltage.

Some embodiments of the present disclosure further provide the gate driving circuit 1000. As shown in FIGS. 18 and 20, the gate driving circuit 1000 includes the plurality of shift registers 100 that are cascaded.

A structure of the gate driving circuit 1000 will be schematically described in an example where each shift register 100 includes the first scan unit 1 and the second scan unit 2, and the shift register 100 has the structure as shown in FIG. 15.

A1, A2, A3 . . . A6 shown in FIG. 18 or FIG. 20 respectively represent scan units in the shift register 100. For example, A1, A3 and A5 respectively represent the first scan units 1 in three shift registers 100, and A2, A4 and A6 respectively represent the second scan units 2 in the three shift registers 100.

In this case, the scan units in the gate driving circuit 1000 may be correspondingly electrically connected to the gate lines GL in the above display panel PNL. For example, A1, A2, A3, A4, A5, and A6 may be electrically connected to a first gate line GL, a second gate line GL, a third gate line GL, a fourth gate line GL, a fifth gate line GL, and a sixth gate line GL, respectively, so as to respectively drive sub-pixels in a first row, sub-pixels in a second row, sub-pixels in a third row, sub-pixels in a fourth row, sub-pixels in a fifth row, and sub-pixels in a sixth row in the display panel PNL for display.

Considering the structural diagram of the gate driving circuit 1000 as shown in FIG. 18 as an example, signal lines in the gate driving circuit 1000 will be schematically described below.

As shown in FIG. 18, the gate driving circuit 1000 includes a first dock signal line CLK_1, a second dock signal line CLK_2 and a third clock signal line CLK_3.

The first clock signal terminal CLKD_1 in the first scan unit 1 in a (3N−2)-th stage shift register is electrically connected to the first clock signal line CLK_1 to receive the first clock signal. The first clock signal terminal CLKD_1 in the first scan unit 1 in a (3N−1)-th stage shift register is electrically connected to the second dock signal line CLK_2 to receive the first dock signal. The first dock signal terminal CLKD_1 in the first scan unit 1 in a 3N-th stage shift register is electrically connected to the third dock signal line CLK_3 to receive the first dock signal.

As shown in FIG. 18, the gate driving circuit 1000 further includes a fourth dock signal line CLK_4, a fifth dock signal line CLK_5, a sixth dock signal line CLK_6, a seventh clock signal line CLK_7, an eighth dock signal line CLK_8, and a ninth clock signal line CLK_9.

In the (3N−2)-th stage shift register, the second dock signal terminal CLKE_1 in the first scan unit 1 is electrically connected to the fourth dock signal line CLK_4 to receive the second dock signal, and the third dock signal terminal CLKE_2 in the second scan unit 2 is electrically connected to the fifth dock signal line CLK_5 to receive the third dock signal.

In the (3N−1)-th stage shift register, the second clock signal terminal CLKE_1 in the first scan unit 1 is electrically connected to the sixth dock signal line CLK_6 to receive the second dock signal, and the third dock signal terminal CLKE_2 in the second scan unit 2 is electrically connected to the seventh clock signal line CLK_7 to receive the third dock signal.

In the 3N-th stage shift register, the second clock signal terminal CLKE_1 in the first scan unit 1 is electrically connected to the eighth clock signal line CLK_8 to receive the second clock signal, and the third clock signal terminal CLKE_2 in the second scan unit 2 is electrically connected to the ninth clock signal line CLK_9 to receive the third clock signal.

As shown in FIG. 18, the gate driving circuit 1000 further includes a tenth signal line CLK_10.

In each stage of shift register 100, both the global reset signal terminal TRST in the first scan unit 1 and the global reset signal terminal TRST in the second scan unit 2 are electrically connected to the tenth clock signal line CLK_10 to receive the global reset signal.

As shown in FIG. 18, the gate driving circuit 1000 further includes an eleventh clock signal line CLK_11 and a twelfth clock signal line CLK_12.

The selection control signal terminal OE in the blanking input circuit 5 in each stage of shift register 100 is electrically connected to the eleventh clock signal line CLK_11 to receive the selection control signal.

The fourth clock signal terminal CLKA in the blanking input circuit 5 in each stage of shift register 100 is electrically connected to the twelfth clock signal line CLK_12 to receive the fourth clock signal.

As shown in FIG. 18, the gate driving circuit 1000 further includes a thirteenth clock signal line CLK_13 and a fourteenth clock signal line CLK_14.

The first voltage signal terminal VDD_A in each stage of shift register 100 is electrically connected to the thirteenth clock signal line CLK_13 to receive the first voltage signal. The second voltage signal terminal VDD_B in each stage of shift register 100 is electrically connected to the fourteenth clock signal line CLK_14 to receive the second voltage signal.

As shown in FIG. 18, the gate driving circuit 1000 further includes a fifteenth clock signal line CLK_15.

In the first stage shift register 100, both the input signal terminal Iput in the first scan unit 1 and the input signal terminal Iput in the second scan unit 2 are electrically connected to the fifteenth clock signal line CLK_15 to receive the start signal as the input signal.

As shown in FIG. 18, except for the first stage shift register 100, the input signal terminals Iput in the first scan unit 1 and the second scan unit 2 in other stage shift register 100 are electrically connected to the shift signal terminal CR<N> in the first scan unit 1 in a previous stage shift register 100. Except for last two stages of shift registers 100, the display reset signal terminals STD in the first scan unit 1 and the second scan unit 2 in other stage shift register 100 are electrically connected to the shift signal terminal CR<N> in the first scan unit 1 in a stage of shift register 100 after a next stage of shift register 100.

It will be noted that the cascade relationship shown in FIG. 18 is only an example, and other cascade methods may also be used according to actual situations.

For example, the cascade relationship may also be as shown in FIG. 20. Neither the first stage shift register 100 nor the second stage shift register 100 is electrically connected to a gate line GL. In a third stage shift register 100, the first scan unit 1 (i.e., A5) is electrically connected to the first gate line GL, and the second scan unit 2 (i.e., A6) is electrically connected to the second gate line GL.

Figure 19:
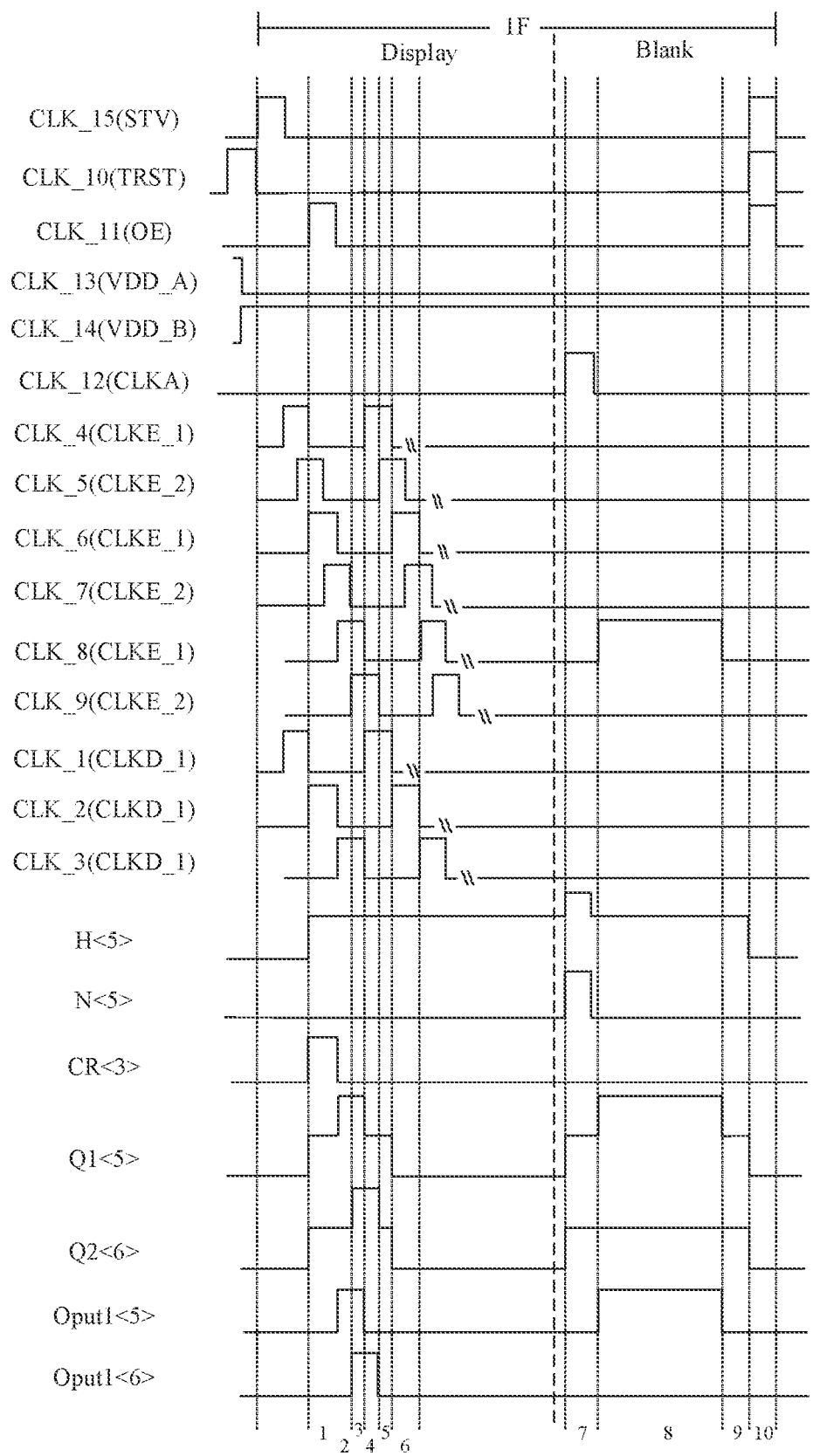
FIG. 19 is a timing control diagram corresponding to the shift register shown in FIG. 15, in accordance with some embodiments of the present disclosure.

FIG. 19 is a timing diagram showing the operation of the shift register 100 shown in FIG. 15. In FIG. 19, Q1<5> and Q2<6> respectively represent the first pull-up node Q1 and the second pull-up node Q2 in the third stage shift register 100, and a number in parenthesis represents a row number of corresponding sub-pixels in the display panel PNL (the same below). Oput1<5> and Oput1<6> respectively represent the first scan signal output from the first scan signal terminal Oput1<N> and the second scan signal output from the second scan signal terminal Oput1<N+1> in the third stage shift register 100. CR<3> represents the shift signal output from the shift signal terminal CR<N> in the second stage shift register 100, and the shift signal may serve as the input signal of the third stage shift register 100. H<5> represents the first blanking node H in the third stage shift register 100. N<5> represents the second blanking node N in the third stage shift register 100. 1F represents a frame, Display represents the display period in the display phase of the frame, and Blank represents the blanking period in the display phase of the frame.

The method for driving the shift register 100 shown in FIG. 15 in the display phase of the frame will be schematically described below with reference to FIGS. 18 and 19.

Before the display phase of the frame, the level of the global reset signal supplied from the tenth clock signal line CLK_10 may be a high level, so that the fifth reset circuit 106 (i.e., the thirty-second transistor M32 and the thirty-third transistor M33) and the sixth reset circuit 206 (i.e., the thirty-fourth transistor M34 and the thirty-fifth transistor M35) in each stage of shift register 100 may be turned on, so as to reset the first pull-up node Q1 and the second pull-up node Q2 in each stage of shift register 100 to realize a global reset before the display phase of the frame.

In the display period in the display phase of the frame, an operating process of the third stage shift register 100 (i.e., corresponding to the sub-pixels in the fifth row and the sub-pixels in the sixth row in the display panel PNL) will be described as follows.

In a first phase 1 (including an input phase), a level of the shift signal CR<3> output from the first scan unit 1 in the second stage shift register 100 is a high level. That is, levels of a signal transmitted to the input signal terminal Iput in the third stage shift register 100 and the input signal transmitted by the input signal terminal Iput are high levels. The fifth transistor M5 and the sixth transistor M6 in the first input circuit 101 and the ninth transistor M9 and the tenth transistor M10 in the second input circuit 201 are turned on due to the action of the input signal, and thus the input signal at the high level is used for charging the first pull-up node Q1<5> to pull the first pull-up node Q1<5> up to be at a high level, and for charging the second pull-up node Q2<6> to pull the second pull-up node Q2<6> up to be at a high level.

The seventh transistor M7 in the first output circuit 102 is turned on under the control of the voltage of the first pull-up node Q1<5>. However, since a level of the first clock signal supplied from the third clock signal line CLK_3 is a low level, in the first scan unit 1 in the third stage shift register 100, a level of the shift signal output from the shift signal terminal CR<N> is a low level. The eighth transistor M8 in the first output circuit 102 is turned on under the control of the voltage of the first pull-up node Q1<5>. However, since a level of the second clock signal supplied from the eighth clock signal line CLK_8 is a low level, in the first scan unit 1 in the third stage shift register 100, a level of the first scan signal Oput1<5> output from the first scan signal terminal Oput1<N> is a low level. The eleventh transistor M11 in the second output circuit 202 is turned on under the control of the voltage of the second pull-up node Q2<6>. However, since a level of the third clock signal supplied from the ninth clock signal line CLK_9 is a low level, in the second scan unit 2 in the third stage shift register 100, the second scan signal Oput1<6> output from the second scan signal terminal Oput1<N+1> is at a low level.

The selection control signal supplied from the eleventh clock signal line CLK_11 is the same as the input signal transmitted by the input signal terminal Iput. That is, the level of the selection control signal is a high level, and the forty-fourth transistor M44 and the forty-fifth transistor M45 in the selection control circuit 501 are turned on under the control of the selection control signal, and thus, the selection control signal at the high level is used for charging the first blanking node H<5>.

In this phase, the first pull-up node Q1<5>, the second pull-up node Q2<6>, and the first blanking node H<5> in the third stage shift register 100 are precharged synchronously.

Here, a level of the first voltage signal supplied from the thirteenth clock signal line CLK_13 is a low level, and a level of the second voltage signal supplied from the fourteenth clock signal line CLK_14 is a high level. In the leakage prevention input unit 4, the first transistor M1 in the first leakage prevention input circuit 401 is turned off, and the second transistor M2 in the second leakage prevention input circuit 402 is turned on under the control of the second voltage signal. The second leakage prevention input circuit 402 may transmit the second voltage signal to the leakage prevention input node M.

In the leakage prevention unit 3, the third transistor M3 in the first leakage prevention circuit 301 may be turned on under the control of the voltage of the first pull-up node Q1<5>, and transmit the second voltage signal from the leakage prevention input node M to the first leakage prevention node OFF1, so as to increase the voltage of the first leakage prevention node OFF1. The fourth transistor M4 in the second leakage prevention unit 302 may be turned on under the control of the voltage of the second pull-up node Q2<6>, and transmit the second voltage signal from the leakage prevention input node M to the second leakage prevention node OFF2, so as to increase the voltage of the second leakage prevention node OFF2.

In a second phase 2, the first clock signal supplied from the third clock signal line CLK_3 becomes at a high level, and the second clock signal supplied from the eighth clock signal line CLK_8 becomes at a high level. The voltage of the first pull-up node Q1<5> is further increased due to bootstrap actions of the seventh transistor M7 and the eighth transistor M8, so that the seventh transistor M7 and the eighth transistor M8 are maintained in the on state, and thus the shift signal output from the shift signal terminal CR<N> in the third stage shift register 100 becomes at a high level, and the level of the first scan signal Oput1<5> output from the first scan signal terminal Oput1<N> becomes a high level. However, since the third clock signal supplied from the ninth clock signal line CLK_9 is still at a low level, the level of the second scan signal Oput1<6> output from the second scan signal terminal Oput1<N+1> in the third stage shift register 100 continues to be maintained at a low level.

In a third phase 3, the third clock signal supplied from the ninth clock signal line CLK_9 becomes at a high level, and the voltage of the second pull-up node Q2<6> is further increased due to a bootstrap action of the eleventh transistor M11, so that the eleventh transistor M11 is maintained in the on state, and thus the level of the second scan signal Oput1<6> output from the second scan signal terminal Oput1<N+1> in the third stage shift register 100 becomes a high level.

In a fourth phase 4, due to a holding effect of the first capacitor C1, the voltage of the first pull-up node Q1<5> is still maintained at a high level, so that the eighth transistor M8 is maintained in the on state. However, since the second clock signal supplied from the eighth clock signal line CLK_8 becomes at a low level, the level of the first scan signal Oput1<5> output from the first scan signal terminal Oput1<N> in the third stage shift register 100 becomes a low level. Moreover, due to a bootstrap action of the first capacitor C1, the voltage of the first pull-up node Q1<5> is also decreased.

In a fifth phase 5, due to a holding effect of the second capacitor C2, the voltage of the second pull-up node Q2<6> is still maintained at a high level, so that the eleventh transistor M11 is maintained in the on state. However, since the third clock signal supplied from the ninth clock signal line CLK_9 becomes at a low level, the level of the second scan signal Oput1<6> output from the second scan signal terminal Oput1<N+1> in the third stage shift register 100 becomes a low level. Moreover, due to a bootstrap action of the second capacitor C2, the voltage of the second pull-up node Q2<6> is also decreased.

In the first phase 1 to the fifth phase 5, since the voltage of the first pull-up node Q1<5> is always maintained at a high level, the third transistor M3 continuously transmits the second voltage signal to the first leakage prevention node OFF1. Since the voltage of the second pull-up node Q2<6> is always maintained at a high level, the fourth transistor M4 continuously transmits the second voltage signal to the second leakage prevention node OFF2.

In a sixth phase 6, the clock signals of 6 clock signal lines are used in the embodiments of the present disclosure. Signals output from every three stages of shift registers 100 (each stage of shift register outputs the first scan signal and the second scan signal in sequence) are a cycle. Moreover, the third stage shift register 100 receives a shift signal CR<9> output from a fifth stage shift register 100 as the display reset signal. Therefore, in this phase, when the first clock signal supplied from the second clock signal line CLK_2 becomes at a high level, the shift signal CR<9> output from the fifth stage shift register 100 is at a high level, and the display reset signal received by the third stage shift register 100 is also at a high level. Thus, the twenty-eighth transistor M28 and the twenty-ninth transistor M29 in the third reset circuit 105, and the thirtieth transistor M30 and the thirty-first transistor M31 in the fourth reset circuit 205 are turned on to transmit the third voltage signal transmitted by the third voltage signal terminal VGL1 to the first pull-up node Q1<5> and the second pull-up node Q2<6>, so as to pull down the voltages of the first pull-up node Q1<5> and the second pull-up node Q2<6> to reset the first pull-up node Q1<5> and the second pull-up node Q2<6>.

After the third stage shift register 100 drives the sub-pixels in the fifth row and the sub-pixels in the sixth row in the display panel PNL for display, by analogy, the shift registers 100 such as a fourth stage shift register 100 and the fifth stage shift register 100 drive sub-pixels in the display panel PNL row by row to complete the display drive of the frame. At this point, the display period in the display phase of the frame ends.

In the blanking period in the display phase of the frame, an operating process of the third stage shift register 100 (i.e., corresponding to the sub-pixels in the fifth row and the sub-pixels in the sixth row in the display panel PNL) will be described as follows.

Here, in the first phase 1, after the first blanking node H<5> is charged such that the voltage of the first blanking node H<5> is increased, the third capacitor C3 may be discharged, so that the first blanking node H<5> is always maintained at a high voltage in the display period in the display phase of the frame.

In a seventh phase 7, a level of the fourth clock signal supplied from the twelfth clock signal line CLK_12 is a high level. Since the voltage of the first blanking node H<5> is maintained at a high level in this phase, the forty-seventh transistor M47 in the third input circuit 502 may be turned on under the control of the voltage of the first blanking node H<5>, and transmit the fourth clock signal at the high level to the second blanking node N<5>, so that the voltage of the second blanking node N<5> becomes at a high level.

The forty-eighth transistor M48 and the forty-ninth transistor M49 in the first transmission circuit 503, and the fiftieth transistor M50 and the fifty-first transistor M51 in the second transmission circuit 504 are turned on under the control of the fourth clock signal at the high level. The fourth clock signal at the high level may charge the first pull-up node Q1<5> and the second pull-up node Q2<6>, so that the voltages of the first pull-up node Q1<5> and the second pull-up node Q2<6> are pulled high.

Moreover, in the seventh phase 7, due to a bootstrap action of the forty-seventh transistor M47, the voltage of the second blanking node N<5> changes from being at a low level to being at a high level, which pulls the voltage of the first blanking node H<5> up due to coupling, so that the first blanking node H<5> may be maintained at a high voltage, ensuring that the forty-seventh transistor M47 is completely turned on.

Then, the level of the fourth clock signal supplied from the twelfth clock signal line CLK_12 changes from the high level to a low level, so that the voltage of the second blanking node N<5> becomes at a low level. Due to the bootstrap action of the forty-seventh transistor M47, the voltage of the first blanking node H<5> is also decreased.

In this phase, the third transistor M3 may be turned on under the control of the voltage of the first pull-up node Q1<5>, and transmit the second voltage signal from the leakage prevention input node M to the first leakage prevention node OFF1 to increase the voltage of the first leakage prevention node OFF1, thereby avoiding the electric leakage of the first pull-up node Q1<5> through the forty-ninth transistor M49. The fourth transistor M4 may be turned on under the control of the voltage of the second pull-up node Q2<6>, and transmit the second voltage signal from the leakage prevention input node M to the second leakage prevention node OFF2 to increase the voltage of the second leakage prevention node OFF2, thereby avoiding the electric leakage of the second pull-up node Q2<6> through the fifty-first transistor M51.

In an eighth phase 8, the level of the second clock signal supplied from the eighth clock signal line CLK_8 becomes a high level, and the voltage of the first pull-up node Q1<5> is further increased due to the bootstrap actions of the seventh transistor M7 and the eighth transistor M8, so that the eighth transistor M8 is maintained in the on state, and the level of the first scan signal Oput1<5> (i.e., the first sensing signal) output from the first scan signal terminal Oput1<N> in the third stage shift register 100 becomes a high level.

Since the level of the third clock signal supplied from the ninth clock signal line CLK_9 is still the low level, the level of the second scan signal Oput1<6> (i.e., the second sensing signal) output from the second scan signal terminal Oput1<N+1> in the third stage shift register 100 is a low level.

Here, the first scan signal output in the eighth phase 8 may be used for driving the sensing transistors T3 in sub-pixels in a corresponding row in the display panel PNL, so as to realize the external compensation.

In a ninth phase 9, due to the holding effect of the first capacitor C1, the voltage of the first pull-up node Q1<5> is still maintained at a high level, so that the eighth transistor M8 is maintained in the on state. Since the level of the second clock signal supplied from the eighth clock signal line CLK_8 becomes a low level, the level of the first scan signal Oput1<5> (i.e., the first sensing signal) output from the first scan signal terminal Oput1<N> in the third stage shift register 100 becomes a low level.

Moreover, due to a bootstrap action of the eighth transistor M8, the voltage of the first pull-up node Q1<5> is also decreased.

In a tenth phase 10, the level of the global reset signal supplied from the tenth clock signal line CLK_10 is a high level. In each stage of shift register 100, the thirty-second transistor M32 and the thirty-third transistor M33 in the fifth reset circuit 106, and the thirty-fourth transistor M34 and the thirty-fifth transistor M35 in the sixth reset circuit 206 are turned on to transmit the third voltage signal transmitted by the third voltage signal terminal VGL1 to the first pull-up node Q1 and the second pull-up node Q2, so as to reset the first pull-up node Q1 and the second pull-up node Q2 in each stage of shift register 100.

The level of the selection control signal supplied from the eleventh clock signal line CLK_11 is a high level, and the forty-fourth transistor M44 and the forty-fifth transistor M45 in the selection control circuit 501 in each stage of shift register 100 are turned on. Since the level of the shift signal output from each stage of shift register 100 is a low level, the shift signal at the low level may be transmitted to the first blanking node H to reset the first blanking node H in each stage of shift register 100, thereby completing the global reset.

At this point, the blanking period in the display phase of the frame ends.

In a subsequent display phase of other frame, a process for driving the gate driving circuit 1000 may refer to the above description, and will not be repeated here.

In some embodiments, in a case where the shift registers 100 as shown in FIG. 17 are cascaded to form the gate driving circuit 1000, the cascade relationship of the shift registers 100 in the gate driving circuit 1000 may be the cascade relationship as shown in FIG. 18.

Based on this, a structure of the gate driving circuit 1000 formed by cascading the shift registers 100 as shown in FIG. 17 may be a structure formed by replacing the shift register 100 in the gate driving circuit 1000 as shown in FIG. 18 with the shift register 100 as shown in FIG. 17. On this basis, a plurality of clock signal lines for transmitting the fifth clock signal are added, so that the fifth clock signal terminal CLKF_1 in each stage of shift register 100 (the structure as shown in FIG. 17) is able to receive the fifth clock signal. Moreover, a plurality of clock signal lines for transmitting the sixth clock signal are added, so that the sixth clock signal terminal CLKF_2 in each stage of shift register 100 (the structure as shown in FIG. 17) is able to receive the sixth clock signal.

Of course, in the gate driving circuit 1000 formed by cascading the shift registers 100 as shown in FIG. 17, the cascade relationship of the shift registers 100 may also be in other manners, but is not limited to the example shown in the embodiments of the present disclosure.

For example, in the gate driving circuit 1000 formed by cascading the shift registers 100 as shown in FIG. 17, the cascade relationship of the shift registers 100 may also be as follows. The input signal terminals Iput in the first stage shift register 100 and the second stage shift register 100 are electrically connected to a corresponding clock signal line, and the start signal serves as the input signal. The display reset signal terminals STD in last three stages of shift registers 100 are electrically connected to a corresponding clock signal line, so as to receive the display reset signal from the clock signal line. In the shift registers 100 except for the first stage shift register 100 and the second stage shift register 100, the shift signal terminal CR<N> in the N-th stage shift register 100 is electrically connected to the input signal terminal Iput in a stage of shift register 100 after a next stage of shift register 100. In the shift registers 100 except for previous three stages of shift registers 100, the display reset signal terminal STD in the N-th stage shift register 100 is electrically connected to the shift signal terminal CR<N> in a stage of shift register 100 before previous two stages of shift registers 100.

The foregoing descriptions are only specific implementations of the present disclosure, but the protection scope of the present disclosure is not limited thereto. Changes or replacements that any person skilled in the art could conceive of within the technical scope of the present disclosure shall be included in the protection scope of the present disclosure. Therefore, the protection scope of the present disclosure shall be subject to the protection scope of the claims.

What is claimed is:

1. A shift register comprising a first scan unit, a leakage prevention unit, and a leakage prevention input unit, wherein the first scan unit includes:
    a first input circuit electrically connected to an input signal terminal, a first pull-up node, and a first leakage prevention node; the first input circuit is configured to, in response to an input signal received at the input signal terminal, transmit the input signal to the first pull-up node;

the leakage prevention input unit is electrically connected to a first voltage signal terminal, a second voltage signal terminal, and an leakage prevention input node; the leakage prevention input unit is configured to, in response to a first voltage signal received at the first voltage signal terminal, transmit the first voltage signal to the leakage prevention input node, and in response to a second voltage signal received at the second voltage signal terminal, transmit the second voltage signal to the leakage prevention input node, wherein the first voltage signal and the second voltage signal are mutually inverted signals; and the leakage prevention unit is electrically connected to the first pull-up node, the first leakage prevention node, and the leakage prevention input node; the leakage prevention unit is configured to transmit one of the first voltage signal and the second voltage signal from the leakage prevention input node to the first leakage prevention node under a control of a voltage of the first pull-up node.

2. The shift register according to claim 1, wherein the leakage prevention input unit includes a first leakage prevention input circuit and a second leakage prevention input circuit, wherein
    the first leakage prevention input circuit is electrically connected to the first voltage signal terminal and the leakage prevention input node; the first leakage prevention input circuit is configured to, in response to the first voltage signal received at the first voltage signal terminal, transmit the first voltage signal to the leakage prevention input node; and
    the second leakage prevention input circuit is electrically connected to the second voltage signal terminal and the leakage prevention input node; the second leakage prevention input circuit is configured to, in response to the second voltage signal received at the second voltage signal terminal, transmit the second voltage signal to the leakage prevention input node; or
    the first leakage prevention input circuit is electrically connected to the first voltage signal terminal and the leakage prevention input node: the first leakage prevention input circuit is configured to, in response to the first voltage signal received at the first voltage signal terminal, transmit the first voltage signal to the leakage prevention input node; the first leakage prevention input circuit includes a first transistor; a control electrode of the first transistor is electrically connected to the first voltage signal terminal, a first electrode of the first transistor is electrically connected to the first voltage signal terminal, and a second electrode of the first transistor is electrically connected to the leakage prevention input node; and
    the second leakage prevention input circuit is electrically connected to the second voltage signal terminal and the leakage prevention input node; the second leakage prevention input circuit is configured to, in response to the second voltage signal received at the second voltage signal terminal, transmit the second voltage signal to the leakage prevention input node; the second leakage prevention input circuit includes a second transistor; a control electrode of the second transistor is electrically connected to the second voltage signal terminal, a first electrode of the second transistor is electrically connected to the second voltage signal terminal, and a second electrode of the second transistor is electrically connected to the leakage prevention input node.

3. The shift register according to claim 1, wherein the leakage prevention unit includes a first leakage prevention circuit;

the first leakage prevention circuit is electrically connected to the first pull-up node, the leakage prevention input node, and the first leakage prevention node; the first leakage prevention circuit is configured to transmit one of the first voltage signal and the second voltage signal from the leakage prevention input node to the first leakage prevention node under the control of the voltage of the first pull-up node; or the leakage prevention unit includes a first leakage prevention circuit; the first leakage prevention circuit is electrically connected to the first pull-up node, the leakage prevention input node, and the first leakage prevention node; the first leakage prevention circuit is configured to transmit one of the first voltage signal and the second voltage signal from the leakage prevention input node to the first leakage prevention node under the control of the voltage of the first pull-up node; the first leakage prevention circuit includes a third transistor; a control electrode of the third transistor is electrically connected to the first pull-up node, a first electrode of the third transistor is electrically connected to the leakage prevention input node, and a second electrode of the third transistor is electrically connected to the first leakage prevention node.

4. The shift register according to claim 1, further comprising a second scan unit, wherein the second scan unit includes:
a second input circuit electrically connected to the input signal terminal, a second pull-up node, and a second leakage prevention node; the second input circuit is configured to, in response to the input signal received at the input signal terminal, transmit the input signal to the second pull-up node; and the leakage prevention unit is further electrically connected to the second pull-up node and the second leakage prevention node; the leakage prevention unit is further configured to transmit one of the first voltage signal and the second voltage signal from the leakage prevention input node to the second leakage prevention node under a control of a voltage of the second pull-up node.

5. The shift register according to claim 4, wherein the leakage prevention unit includes a first leakage prevention circuit and a second leakage prevention circuit;

the first leakage prevention circuit is electrically connected to the first pull-up node, the leakage prevention input node, and the first leakage prevention node; the first leakage prevention circuit is configured to transmit one of the first voltage signal and the second voltage signal from the leakage prevention input node to the first leakage prevention node under the control of the voltage of the first pull-up node; and the second leakage prevention circuit is electrically connected to the second pull-up node, the leakage prevention input node, and the second leakage prevention node; the second leakage prevention circuit is configured to transmit one of the first voltage signal and the second voltage signal from the leakage prevention input node to the second leakage prevention node under the control of the voltage of the second pull-up node; or the leakage prevention unit includes a first leakage prevention circuit and a second leakage prevention circuit; the first leakage prevention circuit is electrically connected to the first pull-up node, the leakage prevention input node, and the first leakage prevention node; the first leakage prevention circuit is configured to transmit one of the first voltage signal and the second voltage signal from the leakage prevention input node to the first leakage prevention node under the control of the voltage of the first pull-up node; the first leakage prevention circuit includes a third transistor; a control electrode of the third transistor is electrically connected to the first pull-up node, a first electrode of the third transistor is electrically connected to the leakage prevention input node, and a second electrode of the third transistor is electrically connected to the first leakage prevention node; and the second leakage prevention circuit is electrically connected to the pull-up node, the leakage prevention input node, and the second leakage prevention node, the second leakage prevention circuit is configured to transmit one of the first voltage signal and the second voltage signal from the leakage prevention input node to the second leakage prevention node under the control of the voltage of the second pull-up node; the second leakage prevention circuit includes a fourth transistor a control electrode of the fourth transistor is electrically connected to the second pull-up node, a first electrode of the fourth transistor is electrically connected to the leakage prevention input node, and a second electrode of the fourth transistor is electrically connected to the second leakage prevention node.

6. The shift register according to claim 4, wherein the first scan unit further includes:

a first output circuit electrically connected to the first pull-up node, a first clock signal terminal, a second clock signal terminal, a shift signal terminal, and a first scan signal terminal; the first output circuit is configured to transmit a first clock signal received at the first clock signal terminal to the shift signal terminal under the control of the voltage of the first pull-up node, and to transmit a second clock signal received at the second clock signal terminal to the first scan signal terminal under the control of the voltage of the first pull-up node; and the second scan unit further includes:
a second output circuit electrically connected to the second pull-up node, a third clock signal terminal, and a second scan signal terminal; the second output circuit is configured to transmit a third clock signal received at the third clock signal terminal to the second scan signal terminal under the control of the voltage of the second pull-up node.

7. The shift register according to claim 6, wherein the first input circuit includes a fifth transistor and a sixth transistor;

a control electrode of the fifth transistor is electrically connected to the input signal terminal, a first electrode of the fifth transistor is electrically connected to the input signal terminal, and a second electrode of the fifth transistor is electrically connected to a first electrode of the sixth transistor and the first leakage prevention node; and a control electrode of the sixth transistor is electrically connected to the input signal terminal, and a second electrode of the sixth transistor is electrically connected to the first pull-up node;

the first output circuit includes a seventh transistor, an eighth transistor, and a first capacitor;

a control electrode of the seventh transistor is electrically connected to the first pull-up node, a first electrode of the seventh transistor is electrically connected to the first clock signal terminal, and a second electrode of the seventh transistor is electrically connected to the shift signal terminal;

a control electrode of the eighth transistor is electrically connected to the first pull-up node, a first electrode of the eighth transistor is electrically connected to the second clock signal terminal, and a second electrode of the eighth transistor is electrically connected to the first scan signal terminal; and a first terminal of the first capacitor is electrically connected to the first pull-up node, and a second terminal of the first capacitor is electrically connected to the first scan signal terminal;

the second input circuit includes a ninth transistor and a tenth transistor;

a control electrode of the ninth transistor is electrically connected to the input signal terminal, a first electrode of the ninth transistor is electrically connected to the input signal terminal, and a second electrode of the ninth transistor is electrically connected to a first electrode of the tenth transistor and the second leakage prevention node; and a control electrode of the tenth transistor is electrically connected to the input signal terminal, and a second electrode of the tenth transistor is electrically connected to the second pull-up node; and the second output circuit includes an eleventh transistor and a second capacitor;

a control electrode of the eleventh transistor is electrically connected to the second pull-up node, a first electrode of the eleventh transistor is electrically connected to the third clock signal terminal, and a second electrode of the eleventh transistor is electrically connected to the second scan signal terminal; and a first terminal of the second capacitor is electrically connected to the second pull-up node, and a second terminal of the second capacitor is electrically connected to the second scan signal terminal.

8. The shift register according to claim 6, wherein the first output circuit is further electrically connected to a fifth clock signal terminal and a first sensing signal terminal; the first output circuit is further configured to transmit a fifth clock signal received at the fifth clock signal terminal to the first sensing signal terminal under the control of the voltage of the first pull-up node; and the second output circuit is further electrically connected to a sixth clock signal terminal and a second sensing signal terminal; the second output circuit is further configured to transmit a sixth clock signal received at the sixth clock signal terminal to the second sensing signal terminal under the control of the voltage of the second pull-up node; or the first output circuit is further electrically connected to a fifth clock signal terminal and a first sensing signal terminal; the first output circuit is further configured to transmit a fifth clock signal received at the fifth clock signal terminal to the first sensing signal terminal under the control of the voltage of the first pull-up node; the first output circuit includes a fifty-second transistor and a fourth capacitor a control electrode of the fifty-second transistor is electrically connected to the first pull-up node, a first electrode of the fifty-second transistor is electrically connected to the fifth clock signal terminal, and a second electrode of the fifty-second transistor is electrically connected to the first sensing signal terminal; a first terminal of the fourth capacitor is electrically connected to the first pull-up node, and a second terminal of the fourth capacitor is electrically connected to the first sensing signal terminal; and the second output circuit is further electrically connected to a sixth clock signal terminal and a second sensing signal terminal; the second output circuit is further configured to transmit a sixth clock signal received at the sixth clock signal terminal to the second sensing signal terminal under the control of the voltage of the second pull-up node; the second output circuit includes a fifty-third transistor and a fifth capacitor; a control electrode of the fifty-third transistor is electrically connected to the second pull-up node, a first electrode of the fifty-third transistor is electrically connected to the sixth clock signal terminal, and a second electrode of the fifty-third transistor is electrically connected to the second sensing signal terminal; a first terminal of the fifth capacitor is electrically connected to the second pull-up node, and a second terminal of the fifth capacitor is electrically connected to the second sensing signal terminal.

9. The shift register according to claim 6, wherein the first scan unit further includes:
a first control circuit electrically connected to the first pull-up node, the first voltage signal terminal, a first pull-down node, and a third voltage signal terminal; the first control circuit is configured to control a voltage of the first pull-down node under one of a control of the voltage of the first pull-up node and the first voltage signal transmitted by the first voltage signal terminal and a control of the voltage of the first pull-up node and a third voltage signal transmitted by the third voltage signal terminal;

the second scan unit further includes:
a second control circuit electrically connected to the second pill-up node, the second voltage signal terminal, a second pull-down node, and the third voltage signal terminal; the second control circuit is configured to control a voltage of the second pull-down node under one of the control of the voltage of the second pull-up node and the second voltage signal transmitted by the second voltage signal terminal and a control of the voltage of the second pull-up node and the third voltage signal transmitted by the third voltage signal terminal.

10. The shift register according to claim 9, wherein the first control circuit includes a twelfth transistor, a thirteenth transistor, a fourteenth transistor, and a fifteenth transistor;

a control electrode of the twelfth transistor is electrically connected to the first voltage signal terminal, a first electrode of the twelfth transistor is electrically connected to the first voltage signal terminal, and a second electrode of the twelfth transistor is electrically connected to a control electrode of the thirteenth transistor and a first electrode of the fourteenth transistor;

a first electrode of the thirteenth transistor is electrically connected to the first voltage signal terminal, and a second electrode of the thirteenth transistor is electrically connected to the first pull-down node and a first electrode of the fifteenth transistor;

a control electrode of the fourteenth transistor is electrically connected to the first pull-up node, and a second electrode of the fourteenth transistor is electrically connected to the third voltage signal terminal; and a control electrode of the fifteenth transistor is electrically connected to the first pull-up node, and a second electrode of the fifteenth transistor is electrically connected to the third voltage signal terminal; and the second control circuit includes a sixteenth transistor, a seventeenth transistor, an eighteenth transistor, and a nineteenth transistor;

a control electrode of the sixteenth transistor is electrically connected to the second voltage signal terminal, a first electrode of the sixteenth transistor is electrically connected to the second voltage signal terminal, and a second electrode of the sixteenth transistor is electrically connected to a control electrode of the seventeenth transistor and a first electrode of the eighteenth transistor;

a first electrode of the seventeenth transistor is electrically connected to the second voltage signal terminal, and a second electrode of the seventeenth transistor is electrically connected to the second pull-down node and a first electrode of the nineteenth transistor;

a control electrode of the eighteenth transistor is electrically connected to the second pull-up node, and a second electrode of the eighteenth transistor is electrically connected to the third voltage signal terminal; and a control electrode of the nineteenth transistor is electrically connected to the second pull-up node, and a second electrode of the nineteenth transistor is electrically connected to the third voltage signal terminal.

11. The shift register according to claim 9, wherein the first scan unit further includes a first reset circuit electrically connected to the first pull-down node, the second pull-down node, the first pull-up node, the third voltage signal terminal, and the first leakage prevention node; the first reset circuit is configured to, under a control of one of voltage of the first pull-down node and the voltage of the second pull-down node, transmit the third voltage signal transmitted by the third voltage signal terminal to the first pull-up node to reset the first pull-up node; and the second scan unit further includes:

a second reset circuit electrically connected to the first pull-down node, the second pull-down node, the second pull-up node, the third voltage signal terminal, and the second leakage prevention node; the second reset circuit is configured to, under the control of the voltage of the first pull-down node or the voltage of the second pull-down node, transmit the third voltage signal transmitted by the third voltage signal terminal to the second pull-up node to reset the second pull-up node; or the first scan unit further includes a first reset circuit electrically connected to the first pull-down node, the second pull-down node; the first pull-up node, the third voltage signal terminal, and the first leakage prevention node; the first reset circuit is configured to under a control of the voltage of the first pull-down node or the voltage of the second pull-down node, transmit the third voltage signal transmitted by the third voltage signal terminal to the first pull-up node to reset the first pull-up node; the first reset circuit includes a twentieth transistor, a twenty-first transistor, a twenty-second transistor, and a twenty-third transistor; wherein a control electrode of the twentieth transistor is electrically connected to the first pull-down node, a first electrode of the twentieth transistor is electrically connected to the first pull-up node, and a second electrode of the twentieth transistor is electrically connected to a first electrode of the twenty-first transistor and the first leakage prevention node;

a control electrode of the twenty-first transistor is electrically connected to the first pull-down node, and a second electrode of the twenty-first transistor is electrically connected to the third voltage signal terminal;

a control electrode of the twenty-second transistor is electrically connected to the second pull-down node, a first electrode of the twenty-second transistor is electrically connected to the first pull-up node, and a second electrode of the twenty-second transistor is electrically connected to a first electrode of the twenty-third transistor and the first leakage prevention node; and a control electrode of the twenty-third transistor is electrically connected to the second pull-down node, and a second electrode of the twenty-third transistor is electrically connected to the third voltage signal terminal; and the second scan unit further includes a second reset circuit electrically connected to the first pull-down node, the second pull-down node, the second pull-up node, the third voltage signal terminal, and the second leakage prevention node; the second reset circuit is configured to, under the control of the voltage of the first pull-down node or the voltage of the second pull-down node, transmit the third voltage signal transmitted by the third voltage signal terminal to the second pull-up node to reset the second pull-up node; the second reset circuit includes a twenty-fourth transistor a twenty-fifth transistor, a twenty-sixth transistor, and a twenty-seventh transistor, wherein a control electrode of the twenty-fourth transistor is electrically connected to the first cull-down node, a first electrode of the twenty-fourth transistor is electrically connected to the second pull-up node, and a second electrode of the twenty-fourth transistor is electrically connected to a first electrode of the twenty-sixth transistor and the second leakage prevention node;

a control electrode of the twenty-fifth transistor is electrically connected to the second pull-down node, a first electrode of the twenty-fifth transistor is electrically connected to the second pull-up node, and a second electrode of the twenty-fifth transistor is electrically connected to a first electrode of the twenty-seventh transistor and the second leakage prevention node;

a control electrode of the twenty-sixth transistor is electrically connected to the first pull-down node, and a second electrode of the twenty-sixth transistor is electrically connected to the third voltage signal terminal; and a control electrode of the twenty-seventh transistor is electrically connected to the second pull-down node, and a second electrode of the twenty-seventh transistor is electrically connected to the third voltage signal terminal.

12. The shift register according to claim 9, wherein
the first scan unit further includes
a third reset circuit electrically connected to a display reset signal terminal, the first pull-up node, the third voltage signal terminal, and the first leakage prevention node; the third reset circuit is configured to, under a control of a display reset signal transmitted by the display reset signal terminal, transmit the third voltage signal transmitted by the third voltage signal terminal to the first pull-up node to reset the first pull-up node; and
the second scan unit further includes
a fourth reset circuit electrically connected to the display reset signal terminal, the second pull-up node, the third voltage signal terminal, and the second leakage prevention node; the fourth reset circuit is configured to, under the control of the display reset signal transmitted by the display reset signal terminal, transmit the third voltage signal transmitted by the third voltage signal terminal to the second pull-up node to reset the second pull-up node; or
the first scan unit further includes a third reset circuit electrically connected to a display reset signal terminal, the first pull-up node, the third voltage signal terminal, and the first leakage prevention node; the third reset circuit is configured to, under a control of a display reset signal transmitted by the display reset signal terminal, transmit the third voltage signal transmitted by the third voltage signal terminal to the first pull-up node to reset the first pull-up node; the third reset circuit includes a twenty-eighth transistor and a twenty-ninth transistor, wherein
  a control electrode of the twenty-eighth transistor is electrically connected to the display reset signal terminal, a first electrode of the twenty-eighth transistor is electrically connected to the first pull-up node, and a second electrode of the twenty-eighth transistor is electrically connected to a first electrode of the twenty-ninth transistor and the first leakage prevention node;
  a control electrode of the twenty-ninth transistor is electrically connected to the display reset signal terminal, and a second electrode of the twenty-ninth transistor is electrically connected to the third voltage signal terminal; and
the second scan unit further includes a fourth reset circuit electrically connected to the display reset signal terminal, the second pull-up node, the third voltage signal terminal, and the second leakage prevention node; the fourth reset circuit is configured to, under the control of the display reset signal transmitted by the display reset signal terminal, transmit the third voltage signal transmitted by the third voltage signal terminal to the second pull-up node to reset the second pull-up node; the fourth reset circuit includes a thirtieth transistor and a thirty-first transistor, wherein
  a control electrode of the thirtieth transistor is electrically connected to the display reset signal terminal, a first electrode of the thirtieth transistor is electrically connected to the second pull-up node, and a second electrode of the thirtieth transistor is electrically connected to a first electrode of the thirty-first transistor and the second leakage prevention node;
  a control electrode of the thirty-first transistor is electrically connected to the display reset signal terminal, and a second electrode of the thirty-first transistor is electrically connected to the third voltage signal terminal.

13. The shift register according to claim 9, wherein
the first scan unit further includes
a fifth reset circuit electrically connected to a global reset signal terminal, the first pull-up node, the third voltage signal terminal, and the first leakage prevention node; the fifth reset circuit is configured to, under a control of a global reset signal transmitted by the global reset signal terminal, transmit the third voltage signal transmitted by the third voltage signal terminal to the first pull-up node to reset the first pull-up node; and
the second scan unit further includes
a sixth reset circuit electrically connected to the global reset signal terminal, the second pull-up node, the third voltage signal terminal, and the second leakage prevention node; the sixth reset circuit is configured to, under the control of the global reset signal transmitted by the global reset signal terminal, transmit the third voltage signal transmitted by the third voltage signal terminal to the second pull-up node to reset the second pull-up node; or
the first scan unit further includes a fifth reset circuit electrically connected to a global reset signal terminal, the first pull-up node, the third voltage signal terminal and the first leakage prevention node; the fifth reset circuit is configured to, under a control of a global reset signal transmitted by the global reset signal terminal, transmit the third voltage signal transmitted by the third voltage signal terminal to the first pull-up node to reset the first pull-up node; the fifth reset circuit includes a thirty-second transistor and a thirty-third transistor, wherein
  a control electrode of the thirty-second transistor is electrically connected to the global reset signal terminal, a first electrode of the thirty-second transistor is electrically connected to the first pull-up node, and a second electrode of the thirty-second transistor is electrically connected to a first electrode of the thirty-third transistor and the first leakage prevention node;
  a control electrode of the thirty-third transistor is electrically connected to the global reset signal terminal, and a second electrode of the thirty-third transistor is electrically connected to the third voltage signal terminal; and
the second scan unit further includes a sixth reset circuit electrically connected to the global reset signal terminal, the second pull-up node, the third voltage signal terminal and the second leakage prevention node; the sixth reset circuit is configured to, under the control of the global reset signal transmitted by the global reset signal terminal, transmit the third voltage signal transmitted by the third voltage signal terminal to the second pull-up node to reset the second pull-up node; the sixth reset circuit includes a thirty-fourth transistor and a thirty-fifth transistor, wherein
  a control electrode of the thirty-fourth transistor is electrically connected to the global reset signal terminal, a first electrode of the thirty-fourth transistor is electrically connected to the second pull-up node, and a second electrode of the thirty-fourth transistor is electrically connected to a first electrode of the thirty-fifth transistor and the second leakage prevention node;

a control electrode of the thirty-fifth transistor is electrically connected to the global reset signal terminal, and a second electrode of the thirty-fifth transistor is electrically connected to the third voltage signal terminal.

14. The shift register according to claim 9, wherein the first scan unit further includes a seventh reset circuit and an eighth reset circuit;
the seventh reset circuit is electrically connected to the first pull-down node, the second pull-down node, the shift signal terminal, the first scan signal terminal, the third voltage signal terminal, and a fourth voltage signal terminal; the seventh reset circuit is configured to, under a control of one of the voltage of the first pull-down node and the voltage of the second pull-down node, transmit the third voltage signal transmitted by the third voltage signal terminal to the shift signal terminal to reset the shift signal terminal, and transmit a fourth voltage signal transmitted by the fourth voltage signal terminal to the first scan signal terminal to reset the first scan signal terminal; and
the eighth reset circuit is electrically connected to the input signal terminal, the first pull-down node, and the third voltage signal terminal; the eighth reset circuit is configured to, under a control of the input signal transmitted by the input signal terminal, transmit the third voltage signal transmitted by the third voltage signal terminal to the first pull-down node to reset the first pull-down node; and
the second scan unit further includes a ninth reset circuit and a tenth reset circuit;
the ninth reset circuit is electrically connected to the first pull-down node, the second pull-down node, the second scan signal terminal, and the fourth voltage signal terminal; the ninth reset circuit is configured to, under the control of one of the voltage of the first pull-down node and the voltage of the second pull-down node, transmit the fourth voltage signal transmitted by the fourth voltage signal terminal to the second scan signal terminal to reset the second scan signal terminal; and
the tenth reset circuit is electrically connected to the input signal terminal, the second pull-down node, and the third voltage signal terminal; the tenth reset circuit is configured to, under the control of the input signal transmitted by the input signal terminal, transmit the third voltage signal transmitted by the third voltage signal terminal to the second pull-down node to reset the second pull-down node.

15. The shift register according to claim 14, wherein the seventh reset circuit includes a thirty-sixth transistor, a thirty-ninth transistor, a thirty-eighth transistor, and a thirty-seventh transistor;
a control electrode of the thirty-sixth transistor is electrically connected to the first pull-down node, a first electrode of the thirty-sixth transistor is electrically connected to the shift signal terminal, and a second electrode of the thirty-sixth transistor is electrically connected to the third voltage signal terminal;
a control electrode of the thirty-ninth transistor is electrically connected to the first pull-down node, a first electrode of the thirty-ninth transistor is electrically connected to the first scan signal terminal, and a second electrode of the thirty-ninth transistor is electrically connected to the fourth voltage signal terminal;

a control electrode of the thirty-eighth transistor is electrically connected to the second pull-down node, a first electrode of the thirty-eighth transistor is electrically connected to the shift signal terminal, and a second electrode of the thirty-eighth transistor is electrically connected to the third voltage signal terminal; and
a control electrode of the thirty-seventh transistor is electrically connected to the second pull-down node, a first electrode of the thirty-seventh transistor is electrically connected to the first scan signal terminal, and a second electrode of the thirty-seventh transistor is electrically connected to the fourth voltage signal terminal; and
the eighth reset circuit includes a fortieth transistor;
a control electrode of the fortieth transistor is electrically connected to the input signal terminal, a first electrode of the fortieth transistor is electrically connected to the first pull-down node, and a second electrode of the fortieth transistor is electrically connected to the third voltage signal terminal;
the ninth reset circuit includes a forty-first transistor and a forty-second transistor;
a control electrode of the forty-first transistor is electrically connected to the second pull-down node, a first electrode of the forty-first transistor is electrically connected to the second scan signal terminal, and a second electrode of the forty-first transistor is electrically connected to the fourth voltage signal terminal; and
a control electrode of the forty-second transistor is electrically connected to the first pull-down node, a first electrode of the forty-second transistor is electrically connected to the second scan signal terminal, and a second electrode of the forty-second transistor is electrically connected to the fourth voltage signal terminal; and
the tenth reset circuit includes a forty-third transistor;
a control electrode of the forty-third transistor is electrically connected to the input signal terminal, a first electrode of the forty-third transistor is electrically connected to the second pull-down node, and a second electrode of the forty-third transistor is electrically connected to the third voltage signal terminal.

16. The shift register according to claim 15, wherein the first output circuit is further electrically connected to a fifth clock signal terminal and a first sensing signal terminal, and is further configured to transmit a fifth clock signal received at the fifth clock signal terminal to the first sensing signal terminal under the control of the voltage of the first pull-up node; and the second output circuit is further electrically connected to a sixth clock signal terminal and a second sensing signal terminal, and is further configured to transmit a sixth clock signal received at the sixth clock signal terminal to the second sensing signal terminal under the control of the voltage of the second pull-up node;
the seventh reset circuit is further electrically connected to the first sensing signal terminal; the seventh reset circuit is further configured to, under the control of one of the voltage of the first pull-down node and the voltage of the second pull-down node, transmit the third voltage signal transmitted by the third voltage signal terminal to the first sensing signal terminal to reset the first sensing signal terminal; and
the ninth reset circuit is further electrically connected to the second sensing signal terminal; the ninth reset circuit is further configured to, under the control of one of the voltage of the first pull-down node and the voltage of the second pull-down node, transmit the fourth voltage signal transmitted by the fourth voltage signal terminal to the second sensing signal terminal to reset the second sensing signal terminal; or the first output circuit is further electrically connected to a fifth clock signal terminal and a first sensing signal terminal, and is further configured to transmit a fifth clock signal received at the fifth clock signal terminal to the first sensing signal terminal under the control of the voltage of the first pull-up node; and the second output circuit is further electrically connected to a sixth clock signal terminal and a second sensing signal terminal, and is further configured to transmit a sixth clock signal received at the sixth clock signal terminal to the second sensing signal terminal under the control of the voltage of the second pull-up node; the seventh reset circuit is further electrically connected to the first sensing signal terminal; the seventh reset circuit is further configured to, under the control of one of the voltage of the first pull-down node and the voltage of the second pull-down node, transmit the third voltage signal transmitted by the third voltage signal terminal to the first sensing signal terminal to reset the first sensing signal terminal; the seventh reset circuit further includes a fifty-fourth transistor and a fifty-fifth transistor, wherein a control electrode of the fifty-fourth transistor is electrically connected to the first pull-down node, a first electrode of the fifty-fourth transistor is electrically connected to the first sensing signal terminal, and a second electrode of the fifty-fourth transistor is electrically connected to the fourth voltage signal terminal, and a control electrode of the fifty-fifth transistor is electrically connected to the second pull-down node, a first electrode of the fifty-fifth transistor is electrically connected to the first sensing signal terminal, and a second electrode of the fifty-fifth transistor is electrically connected to the fourth voltage signal terminal; and the ninth reset circuit is further electrically connected to the second sensing signal terminal; the ninth reset circuit is further configured to, under the control of one of the voltage of the first pull-down node and the voltage of the second pull-down node, transmit the fourth voltage signal transmitted by the fourth voltage signal terminal to the second sensing signal terminal to reset the second sensing signal terminal; the ninth reset circuit further includes a fifty-sixth transistor and a fifty-seventh transistor, wherein a control electrode of the fifty-sixth transistor is electrically connected to the second pull-down node, a first electrode of the fifty-sixth transistor is electrically connected to the second sensing signal terminal, and a second electrode of the fifty-sixth transistor is electrically connected to the fourth voltage signal terminal; and a control electrode of the fifty-seventh transistor is electrically connected to the first pull-down node, a first electrode of the fifty-seventh transistor is electrically connected to the second sensing signal terminal, and a second electrode of the fifty-seventh transistor is electrically connected to the fourth voltage signal terminal.

17. The shift register according to claim 4, further comprising a blanking input unit, wherein the blanking input unit is electrically connected to a selection control signal terminal, the input signal terminal, a third voltage signal terminal, a fourth clock signal terminal, the first pull-up node, the second pull-up node, the first leakage prevention node, the second leakage prevention node, and the leakage prevention input node; and the blanking input unit is configured to, under a control of a selection control signal transmitted by the selection control signal terminal and the input signal transmitted by the input signal terminal, transmit a fourth clock signal transmitted by the fourth clock signal terminal to the first pull-up node and the second pull-up node; or the blanking input unit is electrically connected to a selection control signal terminal, the input signal terminal, a third voltage signal terminal a fourth clock signal terminal the first pull-up node, the second pull-up node, the first leakage prevention node, the second leakage prevention node, and the leakage prevention input node; and the blanking input unit includes a selection control circuit, a third input circuit a first transmission circuit, a second transmission circuit, and a third leakage prevention circuit, wherein the selection control circuit is electrically connected to the selection control signal terminal, the input signal terminal, the third voltage signal terminal, a first blanking node, and a third leakage prevention node; the selection control circuit is configured to transmit the input signal received at the input signal terminal to the first blanking node under the control of the selection control signal and to maintain a voltage of the first blanking node under a control of the input signal received at the input signal terminal and a third voltage signal received at the third voltage signal terminal;

the third leakage prevention circuit is electrically connected to the third leakage prevention node, the first blanking node, and the leakage prevention input node; the third leakage prevention circuit is configured to transmit one of the first voltage signal and the second voltage signal from the leakage prevention input node to the third leakage prevention node under a control of a voltage of the first blanking node;

the third input circuit is electrically connected to the first blanking node; the fourth clock signal terminal, and a second blanking node; the third input circuit is configured to transmit the fourth clock signal received at the fourth clock signal terminal to the second blanking node under the control of the voltage of the first blanking node;

the first transmission circuit is electrically connected to the fourth clock signal terminal, the second blanking node, the first pull-up node, and the first leakage prevention node; the first transmission circuit is configured to transmit the fourth clock signal received at the second blanking node to the first pull-up node under a control of the fourth clock signal transmitted by the fourth clock signal terminal;

the second transmission circuit is electrically connected to the fourth clock signal terminal, the second blanking node, the second pull-up node, and the second leakage prevention node; the second transmission circuit is configured to transmit the fourth dock signal received at the second blanking node to the second pull-up node under the control of the fourth clock signal transmitted by the fourth clock signal terminal; or the blanking input unit is electrically connected to a selection control signal terminal, the input signal terminal, a third voltage signal terminal, a fourth clock signal terminal, the first pull-up node, the second pull-up node, the first leakage prevention node, the second leakage prevention node, and the leakage prevention input node; and the blanking input unit includes a selection control circuit, a third input circuit, a first transmission circuit, a second transmission circuit, and a third leakage prevention circuit, wherein the selection control circuit is electrically connected to the selection control signal terminal, the input signal terminal the third voltage signal terminal, a first blanking node, and a third leakage prevention node; the selection control circuit is configured to transmit the input signal received at the input signal terminal to the first blanking node under the control of the selection control signal, and to maintain a voltage of the first blanking node under a control of the input signal received at the input signal terminal and a third voltage signal received at the third voltage signal terminal; the selection control circuit includes a forty-fourth transistor, a forty-fifth transistor, and a third capacitor, a control electrode of the forty-fourth transistor is electrically connected to the selection control signal terminal, a first electrode of the forty-fourth transistor is electrically connected to the input signal terminal, and a second electrode of the forty-fourth transistor is electrically connected to a first electrode of the forty-fifth transistor and the third leakage prevention node; a control electrode of the forty-fifth transistor is electrically connected to the selection control signal terminal, and a second electrode of the forty-fifth transistor is electrically connected to the first blanking node; a first terminal of the third capacitor is electrically connected to the first blanking node, and a second terminal of the third capacitor is electrically connected to the third voltage signal terminal;

the third leakage prevention circuit is electrically connected to the third leakage prevention node, the first blanking node, and the leakage prevention input node; the third leakage prevention circuit is configured to transmit one of the first voltage signal and the second voltage signal from the leakage prevention input node to the third leakage prevention node under a control of a voltage of the first blanking node; the third leakage prevention circuit includes a forty-sixth transistor; a control electrode of the forty-sixth transistor is electrically connected to the first blanking node, a first electrode of the forty-sixth transistor is electrically connected to the leakage prevention input node, and a second electrode of the forty-sixth transistor is electrically connected to the third leakage prevention node;

the third input circuit is electrically connected to the first blanking node; the fourth clock signal terminal, and a second blanking node; the third input circuit is configured to transmit the fourth clock signal received at the fourth clock signal terminal to the second blanking node under the control of the voltage of the first blanking node; the third input circuit includes a forty-seventh transistor, a control electrode of the forty-seventh transistor is electrically connected to the first blanking node, a first electrode of the forty-seventh transistor is electrically connected to the fourth clock signal terminal, and a second electrode of the forty-seventh transistor is electrically connected to the second blanking node;

the first transmission circuit is electrically connected to the fourth clock signal terminal, the second blanking node; the first pull-up node, and the first leakage prevention node; the first transmission circuit is configured to transmit the fourth clock signal received at the second blanking node to the first pull-up node under a control of the fourth clock signal transmitted by the fourth clock signal terminal; the first transmission circuit includes a forty-eighth transistor and a forty-ninth transistor; a control electrode of the forty-eighth transistor is electrically connected to the fourth clock signal terminal, a first electrode of the forty-eighth transistor is electrically connected to the second blanking node, and a second electrode of the forty-eighth transistor is electrically connected to a first electrode of the forty-ninth transistor and the first leakage prevention node; a control electrode of the forty-ninth transistor is electrically connected to the fourth clock signal terminal, and a second electrode of the forty-ninth transistor is electrically connected to the first pull-up node; and the second transmission circuit is electrically connected to the fourth clock signal terminal, the second blanking node, the second pull-up node, and the second leakage prevention node; the second transmission circuit is configured to transmit the fourth clock signal received at the second blanking node to the second pull-up node under the control of the fourth clock signal transmitted by the fourth clock signal terminal; the second transmission circuit includes a fiftieth transistor and a fifty-first transistor, a control electrode of the fiftieth transistor is electrically connected to the fourth clock signal terminal, a first electrode of the fiftieth transistor is electrically connected to the second blanking node, and a second electrode of the fiftieth transistor is electrically connected to a first electrode of the fifty-first transistor and the second leakage prevention node, a control electrode of the fifty-first transistor is electrically connected to the fourth clock signal terminal, and a second electrode of the fifty-first transistor is electrically connected to the second pull-up node.

18. A method for driving the shift register according to claim 1, the method comprising:
  in an input phase, in response to the input signal received at the input signal terminal, the first input circuit being turned on, and transmitting the input signal to the first pull-up node;
  in response to the first voltage signal received at the first voltage signal terminal, the leakage prevention input unit being turned on, and transmitting the first voltage signal to the leakage prevention input node; or, in response to the second voltage signal received at the second voltage signal terminal, the leakage prevention input unit being turned on, and transmitting the second voltage signal to the leakage prevention input node; and
  the leakage prevention unit being turned on under the control of the voltage of the first pull-up node, and transmitting one of the first voltage signal and the second voltage signal from the leakage prevention input node to the first leakage prevention node.

19. A gate driving circuit comprising a plurality of stages of shift registers that cascaded according to claim 1.

20. A display device comprising the gate driving circuit according to claim 19.

* * * * *

UNITED STATES PATENT AND TRADEMARK OFFICE
CERTIFICATE OF CORRECTION

Page 1 of 1

PATENT NO. : 11,848,064 B2
APPLICATION NO. : 17/791748
DATED : December 19, 2023
INVENTOR(S) : Xuehuan Feng and Yongqian Li It is certified that error appears in the above-identified patent and that said Letters Patent is hereby corrected as shown below:

In the Claims (1) In Column 68 (Claim 5), Line 15, "the pull-up node" should be "the second pull-up node";
(2) In Column 70 (Claim 9), Line 37, "the second pill-up node" should be "the second pull-up node";
(3) In Column 71 (Claim 11), Line 42, "one of voltage of the first pull-down node" should be "one of the voltage of the first pull-down node";
(4) In Column 72 (Claim 11), Line 42, "the first cull-down node" should be "the first pull-down node"; and
(5) In Column 81 (Claim 19), Line 4, "that cascaded" should be "that are cascaded".

Signed and Sealed this
Nineteenth Day of March, 2024

Katherine Kelly Vidal
*Director of the United States Patent and Trademark Office*